(12) United States Patent
Augusto

(10) Patent No.: US 11,424,382 B2
(45) Date of Patent: Aug. 23, 2022

(54) ELECTRICAL DEVICES MAKING USE OF COUNTERDOPED JUNCTIONS

(71) Applicant: Quantum Semiconductor LLC, San Jose, CA (US)

(72) Inventor: Carlos Jorge R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 19 days.

(21) Appl. No.: 16/926,734

(22) Filed: Jul. 12, 2020

(65) Prior Publication Data

US 2020/0343401 A1 Oct. 29, 2020

Related U.S. Application Data

(63) Continuation of application No. 15/936,157, filed on Mar. 26, 2018, now Pat. No. 10,756,227, which is a (Continued)

(51) Int. Cl.
*H01L 31/109* (2006.01)
*H01L 29/737* (2006.01)
(Continued)

(52) U.S. Cl.
CPC ........ *H01L 31/109* (2013.01); *H01L 27/1461* (2013.01); *H01L 27/14601* (2013.01);
(Continued)

(58) Field of Classification Search
CPC ... H01L 31/109; H01L 31/00; H01L 29/1004; H01L 27/14601; H01L 29/0653;
(Continued)

(56) References Cited

U.S. PATENT DOCUMENTS 5,923,987 A * 7/1999 Burr ............... H01L 29/7833
438/304
2002/0150035 A1 10/2002 Bemacki et al.
(Continued)

FOREIGN PATENT DOCUMENTS

WO 2008/157637 A1 12/2008

OTHER PUBLICATIONS

Yu-Hsin Liu et al., Cycling excitation process: An Ultra Efficient and Quiet Signal Amplification Mechanism in Semiconductor, Applied Physics Letters 107, 053505 (2015) (Year: 2015).*
(Continued)

*Primary Examiner* — Mohammed R Alam
(74) *Attorney, Agent, or Firm* — Gavrilovich, Dodd & Lindsey LLP

(57) ABSTRACT

An electrical device includes a counterdoped heterojunction selected from a group consisting of a pn junction or a p-i-n junction. The counterdoped junction includes a first semiconductor doped with one or more n-type primary dopant species and a second semiconductor doped with one or more p-type primary dopant species. The device also includes a first counterdoped component selected from a group consisting of the first semiconductor and the second semiconductor. The first counterdoped component is counterdoped with one or more counterdopant species that have a polarity opposite to the polarity of the primary dopant included in the first counterdoped component. Additionally, a level of the n-type primary dopant, p-type primary dopant, and the one or more counterdopant is selected to the counterdoped heterojunction provides amplification by a phonon assisted mechanism and the amplification has an onset voltage less than 1 V.

20 Claims, 28 Drawing Sheets

Related U.S. Application Data continuation of application No. PCT/US2016/054560, filed on Sep. 29, 2016.

(60) Provisional application No. 62/234,578, filed on Sep. 29, 2015.

(51) Int. Cl.

| | | |
|---|---|---|
| *H01L 27/146* | (2006.01) | |
| *H01L 29/08* | (2006.01) | |
| *H01L 29/15* | (2006.01) | |
| *H01L 29/10* | (2006.01) | |
| *H01L 29/06* | (2006.01) | |
| *H01L 31/00* | (2006.01) | |
| *H01L 29/165* | (2006.01) | |
| *H01L 29/66* | (2006.01) | |
| *H01L 31/0352* | (2006.01) | |
| *H01L 31/105* | (2006.01) | |
| *H01L 31/11* | (2006.01) | |
| *H01S 5/34* | (2006.01) | |

(52) U.S. Cl.
CPC .... *H01L 27/14612* (2013.01); *H01L 29/0603* (2013.01); *H01L 29/0653* (2013.01); *H01L 29/0821* (2013.01); *H01L 29/0847* (2013.01); *H01L 29/1004* (2013.01); *H01L 29/155* (2013.01); *H01L 29/165* (2013.01); *H01L 29/66977* (2013.01); *H01L 29/7371* (2013.01); *H01L 31/00* (2013.01); *H01L 31/035254* (2013.01); *H01L 31/105* (2013.01); *H01L 31/1105* (2013.01); *H01S 5/3427* (2013.01); *H01L 27/14681* (2013.01)

(58) Field of Classification Search
CPC ............. H01L 29/0603; H01L 29/0847; H01L 29/165; H01L 29/66977; H01L 31/035254; H01L 31/105; H01L 31/1105; H01L 29/7371; H01L 27/1461; H01L 27/14612; H01L 29/0821; H01L 29/155; H01L 27/14681; H01S 5/3427

See application file for complete search history.

(56) References Cited

U.S. PATENT DOCUMENTS

| | | | |
|---|---|---|---|
| 2005/0127476 A1 | 6/2005 | Kraft et al. | |
| 2010/0147368 A1* | 6/2010 | Rubin | H01L 31/022425 257/E31.119 |
| 2013/0298974 A1* | 11/2013 | Yang | H01L 31/1804 136/255 |
| 2016/0197146 A1* | 7/2016 | Augusto | H01L 27/1203 257/22 |

OTHER PUBLICATIONS

Augusto et al., "A New CMOS SiGeC Avalanche Photo-Diode Pixel for IR Sensing", May 6, 2009, Proc. of SPIE vol. 7298, 729839-1.
Copenheaver, Blaine R., International Search Report and Written Opinion, PCT/US2016/054560, dated Dec. 9, 2016.
Liu et al., "Cycling excitation process: An ultra efficient and quiet signal amplification mechanism in semiconductor", Applied Physics Letters, 107, 053505, 2015.
Mohri, Mineko, International Preliminary Report on Patentability and Written Opinion, PCT/US2016/054560, dated Apr. 12, 2018.

* cited by examiner

ELECTRICAL DEVICES MAKING USE OF COUNTERDOPED JUNCTIONS

RELATED APPLICATIONS

This application is a continuation of U.S. patent application Ser. No. 15/936,157, filed on Mar. 26, 2018; and U.S. patent application Ser. No. 15/936,157 is a continuation of International Application No. PCT/US2016/054560, filed Sep. 29, 2016; and International Application No. PCT/US2016/054560 claims the benefit of U.S. Provisional Patent application Ser. No. 62/234,578, filed on Sep. 29, 2015; each of which is incorporated herein in its entirety.

STATEMENT REGARDING FEDERALLY SPONSORED RESEARCH OR DEVELOPMENT

This invention was made with Government support under contract number N00014-15-C-5194 awarded by the Office of Naval Research. The Government has certain rights in the invention.

FIELD

The present invention relates to semiconductors, and more particularly, to devices the make use of the cycling excitation process.

BACKGROUND

A variety of semiconductor applications make use of signal amplification by mechanisms such as impact ionization. Examples of these devices include, but are not limited to, transistors and photodiodes. However, the impact ionization mechanism is associated with low power efficiencies, and noise levels that increase with amplification. Further, the noise levels of these devices can limit the scalability of the devices. As a result, there is a need for semiconductor applications that make use of signal amplification with one or more characteristics selected from the group consisting of: reduced noise levels, increased power efficiency, and scalability.

SUMMARY

An electrical device includes a counterdoped heterojunction selected from a group consisting of a pn junction or a p-i-n junction. The counterdoped junction includes a first semiconductor doped with one or more n-type primary dopant species and a second semiconductor doped with one or more p-type primary dopant species. The device also includes a first counterdoped component selected from a group consisting of the first semiconductor and the second semiconductor. The first counterdoped component is counterdoped with one or more counterdopant species that have a polarity opposite to the polarity of the primary dopant included in the first counterdoped component. Additionally, a level of the n-type primary dopant, p-type primary dopant, and the one or more counterdopant is selected to the counterdoped heterojunction provides amplification by a phonon assisted mechanism and the amplification has an onset voltage less than 1 V, 2V or 3V.

BRIEF DESCRIPTION OF THE FIGURES

FIG. 1A is a counterdoped PN junction with a counterdoped first semiconductor that forms a pn junction with a second semiconductor that is not counterdoped.

FIG. 1B illustrates a PN junction where a first semiconductor is not counterdoped but the second semiconductor is counterdoped.

FIG. 1C illustrates a PN junction where both the first semiconductor and the second semiconductor are counterdoped.

FIG. 1D illustrates a counterdoped p-i-n heterojunction having a third semiconductor between a first semiconductor and a second semiconductor. The first semiconductor is counterdoped but the second semiconductor is not counterdoped.

FIG. 1E illustrates a counterdoped p-i-n heterojunction having a third semiconductor between a first semiconductor and a second semiconductor. The first semiconductor is not counterdoped but the second semiconductor is counterdoped.

FIG. 1F illustrates a counterdoped p-i-n heterojunction having a third semiconductor between a first semiconductor and a second semiconductor. The first semiconductor and the second semiconductor are both counterdoped.

FIG. 5D shows the band alignments for the bias conditions at which VDS is >0 and VGS is >0 for a T-NMOS, or VDS<0 and VGS=0 for T-PMOS.

FIG. 5E shows the band alignments for the bias conditions at which VDS=0 and VGS>0 for T-NMOS or VDS=0 and VGS=0 for a T-PMOS.

FIG. 5F shows the band alignments for the bias conditions at which VDS>0 and VGS=0 for T-NMOS or VDS<0 and VGS<0 for a T-PMOS.

FIG. 5G shows the band alignments for the bias conditions at which VDS=0 and VGS=0 for T-NMOS or VDS=0 and VGS<0 for a T-PMOS.

FIG. 6C shows the band alignments for the bias conditions at which VDS is >0 and VGS is >0 for a T-NMOS, or VDS<0 and VGS=0 for T-PMOS.

FIG. 6D shows the band alignments for the bias conditions at which VDS=0 and VGS>0 for T-NMOS or VDS=0 and VGS=0 for a T-PMOS.

FIG. 6E shows the band alignments for the bias conditions at which VDS>0 and VGS>0 for T-NMOS or VDS<0 and VGS=0 for a T-PMOS.

FIG. 6F shows the band alignments for the bias conditions at which VDS=0 and VGS=0 for T-NMOS for VDS=0 and VGS<0 for a T-PMOS.

FIG. 7C shows the band alignments for the bias conditions at which VDS is >0 and VGS is >0 for a T-NMOS, or VDS<0 and VGS=0 for T-PMOS.

FIG. 7D shows the band alignments for the bias conditions at which VDS=0 and VGS>0 for T-NMOS or VDS=0 and VGS=0 for a T-PMOS.

FIG. 7E shows the band alignments for the bias conditions at which VDS>0 and VGS=0 for T-NMOS or VDS<0 and VGS<0 for a T-PMOS.

FIG. 7F shows the band alignments for the bias conditions at which VDS=0 and VGS=0 for T-NMOS or VDS=0 and VGS<0 for a T-PMOS.

FIG. 8C shows the band alignments for the bias conditions at which VDS is >0 and VGS is >0 for a T-NMOS, or VDS<0 and VGS=0 for T-PMOS.

FIG. 8D shows the band alignments for the bias conditions at which VDS=0 and VGS>0 for T-NMOS or VDS=0 and VGS=0 for a T-PMOS.

FIG. 8E shows the band alignments for the bias conditions at which VDS>0 and VGS=0 for T-NMOS or VDS<0 and VGS<0 for a T-PMOS.

FIG. 8F shows the band alignments for the bias conditions at which VDS=0 and VGS=0 for T-NMOS or VDS=0 and VGS<0 for a T-PMOS.

FIG. 9C shows the band alignments for the bias conditions at which VDS is >0 and VGS is >0 for a T-NMOS, or VDS<0 and VGS=0 for T-PMOS.

FIG. 9D shows the band alignments for the bias conditions at which VDS=0 and VGS>0 for T-NMOS or VDS=0 and VGS=0 for a T-PMOS.

FIG. 9E shows the band alignments for the bias conditions at which VDS>0 and VGS=0 for T-NMOS or VDS<0 and VGS<0 for a T-PMOS.

FIG. 9F shows the band alignments for the bias conditions at which VDS=0 and VGS=0 for T-NMOS or VDS=0 and VGS<0 for a T-PMOS.

FIG. 10C shows the band alignments for the bias conditions at which VDS is >0 and VGS is >0 for a T-NMOS, or VDS<0 and VGS=0 for T-PMOS.

FIG. 10D shows the band alignments for the bias conditions at which VDS=0 and VGS>0 for T-NMOS or VDS=0 and VGS=0 for a T-PMOS.

FIG. 10E shows the band alignments for the bias conditions at which VDS>0 and VGS=0 for T-NMOS or VDS<0 and VGS<0 for a T-PMOS.

FIG. 10F shows the band alignments for the bias conditions at which VDS=0 and VGS=0 for T-NMOS or VDS=0 and VGS<0 for a T-PMOS.

DESCRIPTION

A variety of devices include one or more counterdoped junctions. A counterdoped junction can be a p-n junction or a p-i-n junction that includes a p-type semiconductor that is counterdoped and/or an n-type semiconductor that is counter doped. A p-type semiconductor is counter doped when it is also doped with an n-type dopant and n-type semiconductor is counter doped when it is also doped with a p-type dopant. Counter doping allows amplification to occur through a phonon assisted mechanism rather than through impact ionization. The onset of the phonon assisted mechanism can be at unexpectedly lower voltage levels relative to the onset of amplification through impact ionization. As a result, devices that include these junctions can have improved power efficiencies. Further, these junctions can provide devices with reduced noise levels. The reduced noise levels can enhance the scalability of these devices.

Figure 1:
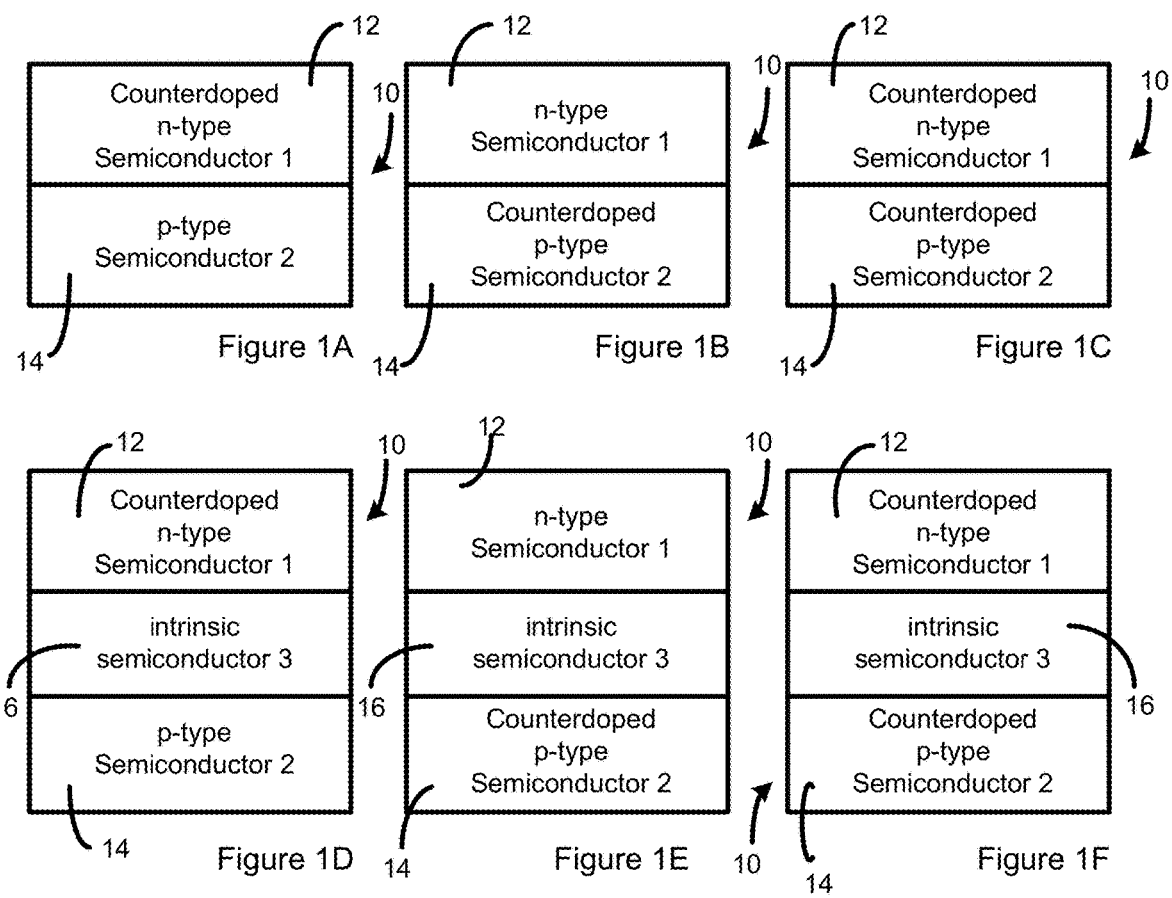
FIG. 1A through FIG. 1F illustrate a variety of counterdoped junctions.

The p-n junctions and p-i-n junction can also be heterojunctions. The combination of counterdoping (or doping compensation) and heterojunctions can provide these devices with an unexpectedly large reduction in the onset voltage for amplification to occur. For instance, heterojunctions can provide amplification onset at around half a volt and reach a gain of around 10,000 at only one volt. In contrast, homojunctions have produced a gain of 10,000 at three volts. These results show that about nine times the power is required to produce around the same level of gain when homojunctions are used. The combination of counterdoping (or doping compensation) and heterojunctions can also enable amplification in forward biased diodes, if the heterojunction offsets are sufficiently large such that when a charge carrier, traveling perpendicularly to said heterojunctions, acquires kinetic energy corresponding to difference in potential energy between the two semiconductors (i.e., the band offset), that is enough to trigger the cyclic excitation process. Heterojunctions can also spatially and/or energetically confine charge carriers to regions where counterdoping is optimized, and therefore spatially confine the region of optimized gain from the cyclic excitation process. In addition, heterojunctions can also modify the phonon spectra in spatially confined regions, especially when the heterojunctions layers are strained, thereby used to optimize the phonon-assisted gain mechanism. Furthermore, heterojunctions can also be used to modify the energy levels of the different types of doping species, and thus affect the phonon-assisted gain of the cyclic excitation process FIG. 1A through FIG. 1F illustrate a variety of counterdoped junctions 10. For instance, FIG. 1A through FIG. 1C illustrate a variety of counterdoped pn heterojunctions. Each heterojunction includes a junction between a first semiconductor 12 and a second semiconductor 14. The first semiconductor 12 is in direct physical contact with the second semiconductor 14. Since the junction is a heterojunction, the first semiconductor 12 is different from the second semiconductor 14. The first semiconductor 12 is doped so as to be an n-type semiconductor and the second semiconductor 14 is doped so as to be a p-type semiconductor.

In FIG. 1A, the first semiconductor 12 is counterdoped but the second semiconductor 14 is not counterdoped. For instance, the first semiconductor 12 includes one or more n-type dopants as primary dopants and one or more p-type dopants as counterdopants while the second semiconductor 14 includes one or more p-type dopants as primary dopants but excludes any counterdopant. In FIG. 1B, the first semiconductor 12 is not counterdoped but the second semiconductor 14 is counterdoped. For instance, the first semiconductor 12 includes one or more n-type dopants as primary dopants and excludes counterdopants while the second semiconductor 14 includes one or more p-type dopants as primary dopants and also includes one or more n-type dopants as counterdopants. In FIG. 1C, the first semiconductor 12 is counterdoped and the second semiconductor 14 is counterdoped. For instance, the first semiconductor 12 includes one or more n-type dopants as primary dopants and one or more p-type dopants as counterdopants while the second semiconductor 14 includes one or more p-type dopants as primary dopants and also includes one or more n-type dopants as counterdopants.

FIG. 1D through FIG. 1F illustrate a variety of counterdoped p-i-n heterojunctions. Each heterojunction includes a junction between a first semiconductor 12 and a third semiconductor 16 and also between the third semiconductor 16 and a second semiconductor 14. The first semiconductor 12 is in direct physical contact with the third semiconductor 16 and the third semiconductor 16 is in direct physical contact with the second semiconductor 14. Since the p-i-n junction is a heterojunction, the first semiconductor 12 is different from the third semiconductor 16 and/or the second semiconductor 14 is different from the third semiconductor 16. In some instances, the first semiconductor 12 is the same as the second semiconductor 14 but different from the third semiconductor 16. In some instances, the first semiconductor 12, the second semiconductor 14, and the third semiconductor 16 are different from one another. In some instances, the first semiconductor 12 is the same as the third semiconductor 16 or the second semiconductor 14 is the same as the third semiconductor 16. The first semiconductor 12 is doped so as to be an n-type semiconductor and the second semiconductor 14 is doped so as to be a p-type semiconductor. The third semiconductor 16 is an intrinsic semiconductor.

In FIG. 1D, the first semiconductor 12 is counterdoped but the second semiconductor 14 is not counterdoped. For instance, the first semiconductor 12 includes one or more n-type dopants as primary dopants and one or more p-type dopants as counterdopants while the second semiconductor 14 includes one or more p-type dopants as primary dopants but excludes any counterdopant. In FIG. 1E, the first semiconductor 12 is not counterdoped but the second semiconductor 14 is counterdoped. For instance, the first semiconductor 12 includes one or more n-type dopants as primary dopants and excludes counterdopants while the second semiconductor 14 includes one or more p-type dopants as primary dopants and also includes one or more n-type dopants as counterdopants. In FIG. 1F, the first semiconductor 12 is counterdoped and the second semiconductor 14 is counterdoped. For instance, the first semiconductor 12 includes one or more n-type dopants as primary dopants and one or more p-type dopants as counterdopants while the second semiconductor 14 includes one or more p-type dopants as primary dopants and also includes one or more n-type dopants as counterdopants.

Although FIG. 1A through FIG. 1F illustrates each of the junction semiconductors (first semiconductor 12, second semiconductor 14, or third semiconductor 16) as a single and continuous layer of material, a junction semiconductor can include or consist of multiple sub-layers. When a junction semiconductor includes multiple layers, each of the layers included in the junction semiconductor is doped with the same polarity of dopant. When a junction semiconductor that includes multiple sub-layers is counterdoped, one or more of the sub-layers included in the junction semiconductor is counterdoped. The polarity of the primary dopant in a counterdoped sub-layer is the same as the polarity of any other sub-layers that are included in the junction semiconductor without being counterdoped.

In FIG. 1A the first semiconductor 12, the second semiconductor 14 and the third semiconductor 16 are shown as distinct components; however, one or more components selected from the group consisting of the first semiconductor 12, the second semiconductor 14 and the third semiconductor 16 can be a doped region of a larger semiconductor. For instance, the first semiconductor 12 illustrated above may be a doped region of a larger semiconductor that includes or consists of the first semiconductor 12. Accordingly, one or more components selected from the group consisting of the first semiconductor 12, the second semiconductor 14 and the third semiconductor 16 can be a doped region of a larger semiconductor.

The total concentration for the one or more primary dopants in a semiconductor that is not counterdoped can be a function of the functionality of the semiconductor in the device and other parameters such as the dimensions of the semiconductor, the dimensions of the surrounding components and the electric field to be applied to the semiconductor. Examples of the total concentration for the one or more primary dopants in a semiconductor that is not counterdoped include concentrations greater than $1.0E16$ $cm^{-3}$, $5.0E18$ $cm^{-3}$, or $1.0E20$ $cm^{-3}$ and/or less than $1.0E21$ $cm^{-3}$, $5.0E20$ $cm^{-3}$, or $1.0E20$ $cm^{-3}$.

A suitable total concentration for the one or more primary n-type dopants in a semiconductor that is counterdoped include, but are not limited to, concentrations around or greater than the value for the density of states of the conduction band of the semiconductor. In silicon, this means the total concentration can be greater than $2.82E-19$ $cm^{-3}$. A suitable total concentration for the one or more primary p-type dopants in a semiconductor that is counterdoped include, but are not limited to, concentrations around or greater than the value for the density of states of the valence band of the semiconductor, which for silicon this means values greater than $1.82E-19$ $cm^{-3}$. Accordingly, the total concentration for the one or more primary dopants in a semiconductor that is counterdoped include, but are not limited to, concentrations greater than $1.0E20$ $cm^{-3}$, $1.0E-19$ $cm^{-3}$, $1.0E18$ $cm^{-3}$, and/or less than $5.0E20$ $cm^{-3}$. The total concentration for the one or more counterdopants in a semiconductor that is counterdoped can be a function of the material and/or the functionality of the semiconductor and/or other parameters such as the dimensions of the semiconductor, the dimensions of the surrounding components and the electric field to be applied to the semiconductor. Examples of the total concentration for the one or more counterdopants in a semiconductor that is counterdoped include, but are not limited to, concentrations greater than $2.0E17$ $cm^{-3}$, $2.0E18$ $cm^{-3}$, or $2.0E19$ $cm^{-3}$ and/or less than $5.0E20$ $cm^{-3}$, $1.0E20$ $cm^{-3}$, or $5.0E19$ $cm^{-3}$. The total concentration of the one or more counterdopants in a counterdoped semiconductor can be more than 0.1%, or 25% and/or less than 50% of the total percentage of dopants in the counterdoped semiconductor. The concentration of the counterdopants in a counterdoped semiconductor is less than the concentration of the primary dopant in the counterdoped semiconductor. The primary dopant in an n-type counterdoped semiconductor is an n-type dopant and the primary dopant in a p-type counterdoped semiconductor is a p-type dopant.

When a junction semiconductor includes multiple sub-layers, the concentration of dopant or primary dopant in each sub-layer can be greater than $2.0E17$ cm$^{-3}$, $2.0E18$ cm$^{-3}$, or $2.0E19$ cm$^{-3}$ and/or less than $5.0E20$ cm$^{-3}$, $1.0E20$ cm$^{-3}$, or $5.0E19$ cm$^{-3}$. In some instances, the concentration of one or more components selected from a group consisting of the dopants, primary dopant, and counterdopants varies across the semiconductor or sub-layer. For instance, one or more components selected from a group consisting of the first semiconductor 12, the second semiconductor 14, one or more sub-layers included in the first semiconductor 12, and one or more sub-layers included in the second semiconductor 14 can include a smooth gradient or a stepped gradient of one or more dopant components selected from the group consisting of dopant, primary dopant, and counterdopant.

The counterdoped junctions, especially heterojunctions, can have surprisingly low voltages for onset of amplification. The onset voltage for a counterdoped junction is the voltage at which current gain is larger than 1. Current gain, as a function of applied voltage, can be the increase in the difference between signal current and leakage current (noise current) of the junction, as a function of applied voltage. In some instances, onset voltage for a counterdoped junction is determined by measuring leakage current (noise current) for a voltage interval, followed by measuring the signal current for the same voltage interval, subtracting the leakage current (noise current) from the signal current, and determining at what voltage the subtracted value begins to increase.

Figure 2:
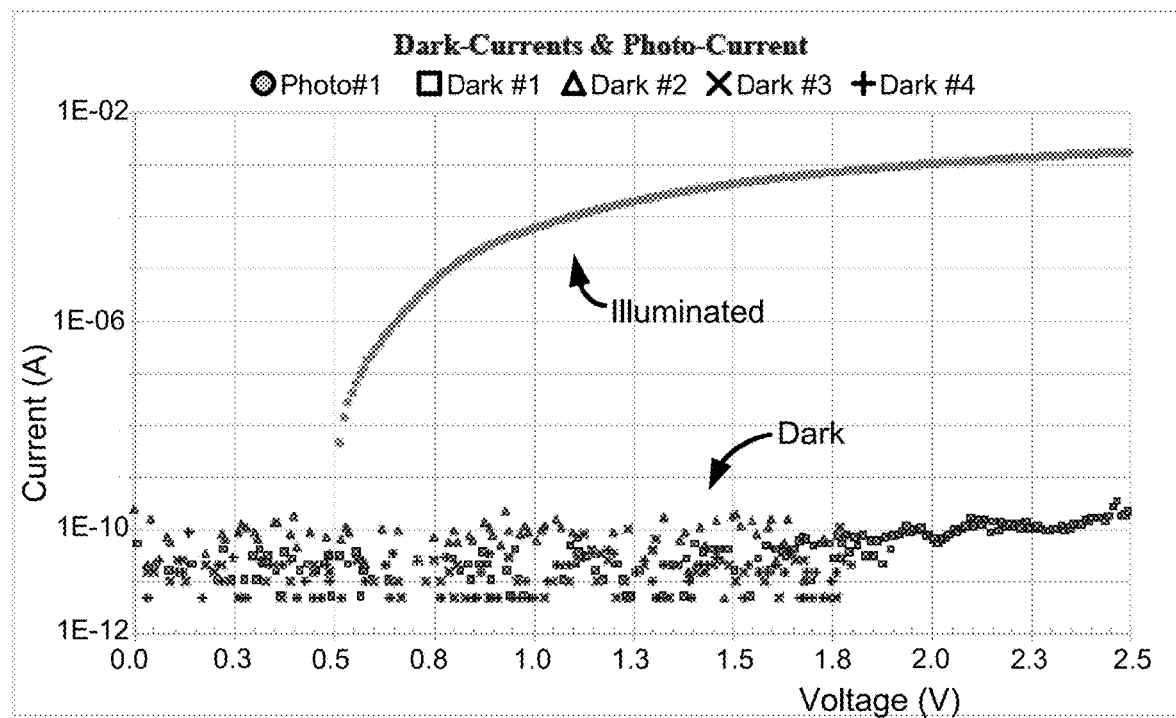
FIG. 2 illustrates the current versus bias results for a series of parallel-connected photodiodes that were fabricated as the light-sensing element of a CMOS pixel.

FIG. 2 illustrates the current versus bias results for a series of parallel-connected photodiodes that were fabricated as the light-sensing element of a CMOS pixel. The photodiodes each have a counterdoped p-i-n heterojunction. The measurements were taken by applying a reverse bias the photodiodes and measuring the resulting photocurrent. As shown in FIG. 2, the onset of amplification occurs at around 0.5 V. Amplification occurring at such a surprisingly low level voltage cannot be explained by impact ionization and is evidence of the phonon assisted amplification mechanism in heterojunction photodiodes, in which at least one semiconductor region is an alloy of the type $Si_{1-x}Ge_x$, $Si_{1-y}C_y$, $Si_{1-x-y}Ge_xC_y$ or other Group-IV alloy and/or superlattices including one or more components selected from the group consisting of Si, Ge, C, Sn, Pb.

The onset voltage can be tuned by changing the doping profile of the one or more counterdoped semiconductors in the counterdoped junction. Examples of changes to the doping profile include increasing or decreasing the concentration of counterdopant in a semiconductor and/or increasing or decreasing the concentration of primary dopant in a semiconductor. Accordingly, the onset voltage can be tuned by changing the percentage of dopant in a semiconductor that is counterdopant. These changes to dopant concentrations can be made in the first semiconductor 12 and/or in the second semiconductor 14. In some instances, the onset voltage is tuned so as to be greater than 0.3V, 0.5V, or 0.8V and/or less than 3V, 2V or 1V. The onset voltage can be tuned by changing the heterojunction profile of the one or more counterdoped semiconductors in the counterdoped junction. Examples of changes to the heterojunction profile include increasing or decreasing the conduction band offsets and/or the valence band offsets. Accordingly, the onset voltage can be tuned by changing the semiconductor composition. These changes to semiconductor composition can be made in the first semiconductor 12 and/or in the second semiconductor 14. In some instances, the onset voltage is tuned so as to be greater than 0.3V, 0.5V, or 0.8V and/or less than 3V, 2V or 1V.

Figure 3A:
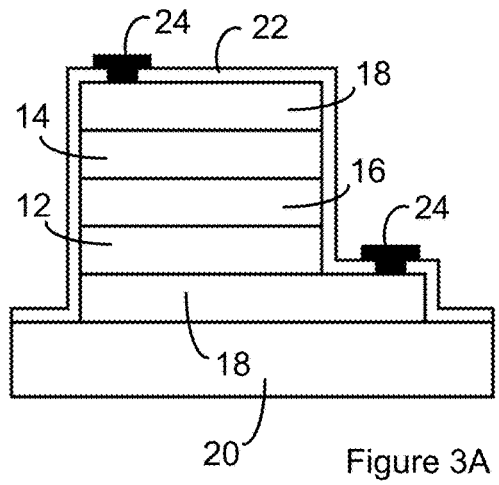
FIG. 3A is a cross section of a photodiode that includes a counterdoped p-i-n junction.

The reduced onset voltage associated with the phonon-assisted mechanism in heterojunction photodiodes can provide more efficient photodiodes. FIG. 3A illustrates an example of a photodiode that includes a counterdoped junction on a substrate 20. FIG. 3A is a cross section of a photodiode that includes a counterdoped p-i-n heterojunction according to any one of FIG. 1D through FIG. 1F. The counterdoped p-i-n heterojunction is positioned between electrical contacts 18 and can be in direct physical contact with the electrical contacts 18. The electrical contacts 18 can be electrical conductors such as metals and are preferably a semiconductor that is doped so as to be electrically conductive. For instance, the electrical contacts 18 can be a degeneratively doped semiconductor. When an electrical contact 18 is a degeneratively doped semiconductor, the semiconductor can be the same as the semiconductor that is included in the counterdoped p-i-n heterojunction and that contacts the electrical contact 18. For instance, the electrical contact 18 located between the substrate 20 and the first semiconductor 12 can be the same semiconductor. Suitable substrates 20 include, but are not limited to, Si, Ge, and SiGe relaxed buffer layers.

An electrical insulator 22 is positioned over the counterdoped junction and the electrical contacts 18. Suitable electrical insulators 22 include, but are not limited to, $SiO_2$, $Si_3N_4$, and $HfO_2$. Terminals 24 extend through the insulator 22 and into contact with the one of the electrical contacts 18. Suitable electrical contacts 18 include, but are not limited to, silicides such as NiSi or PtSi, and metals such as Al or Cu. The terminals 24 are in electrical communication with electronics that can apply an electrical potential to the counterdoped junction. For instance, the electronics can apply a reverse bias to the counterdoped junction when the device is operated as a photodiode.

The first semiconductor 12 and/or the second semiconductor 14 can be counterdoped. The concentration of the dopant, primary dopant, and/or counterdopant in the first semiconductor 12 and/or the second semiconductor 14 can be a function of the material. For instance, when the first semiconductor 12 is not counterdoped and is silicon, the concentration of dopant can be from $2.0E17$ cm$^{-3}$, $5.0E20$ cm$^{-3}$, and when the first semiconductor 12 is not counterdoped and is germanium the concentration of dopant can be from $1.0E17$ cm$^{-3}$, $1.0E20$ cm$^{-3}$. As a result, examples of suitable total concentrations for the dopant or primary dopant in the first semiconductor 12 can be greater than $1.0E17$ cm$^{-3}$, $1.0E18$ cm$^{-3}$, or $1.0E19$ cm$^{-3}$ and/or less than $2.0E19$ cm$^{-3}$, $5.0E19$ cm$^{-3}$, or $1.0E20$ cm$^{-3}$. The concentration of the dopant or primary dopant in the second semiconductor 14 can be greater than $1.0E17$ cm$^{-3}$, $1.0E18$ cm$^{-3}$, or $1.0E19$ cm$^{-3}$ and/or less than $2.0E19$ cm$^{-3}$, $5.0E19$ cm$^{-3}$, or $1.0E-20$ cm$^{-3}$. When the first semiconductor 12 is counterdoped, the concentration of counterdopant in the first semiconductor 12 can be greater than $1.0E17$ cm$^{-3}$, $1.0E18$ cm$^{-3}$, or $1.0E19$ cm$^{-3}$ and/or less than $2.0E19$ cm$^{-3}$, $5.0E19$ cm$^{-3}$ or $1.0E20$ cm$^{-3}$. When the second semiconductor 14 is counterdoped, the concentration of counterdopant in the first semiconductor 12 can be greater than $1.0E17$ cm$^{-3}$, $1.0E18$ cm$^{-3}$, or $1.0E19$ cm$^{-3}$ and/or less than $2.0E19$ cm$^{-3}$, $5.0E19$ cm$^{-3}$, or $1.0E20$ cm$^{-3}$. The third semiconductor 16 can be intrinsic or doped lightly enough to retain qualify as intrinsic.

In one example of a photodiode constructed according to FIG. 3A, the second semiconductor 14 is the same as the third semiconductor 16 but different from the first semiconductor 12. For instance, the first semiconductor 12 can be a SiGeC alloy (includes, consists of, or consists essentially of Si, Ge, and C), the third semiconductor 16 can be silicon and the second semiconductor 14 can be silicon. Additionally or alternately, the photodiode can include an n-type first semiconductor 12, a p-type second semiconductor 14, and an intrinsic third semiconductor 16.

Figure 3B:
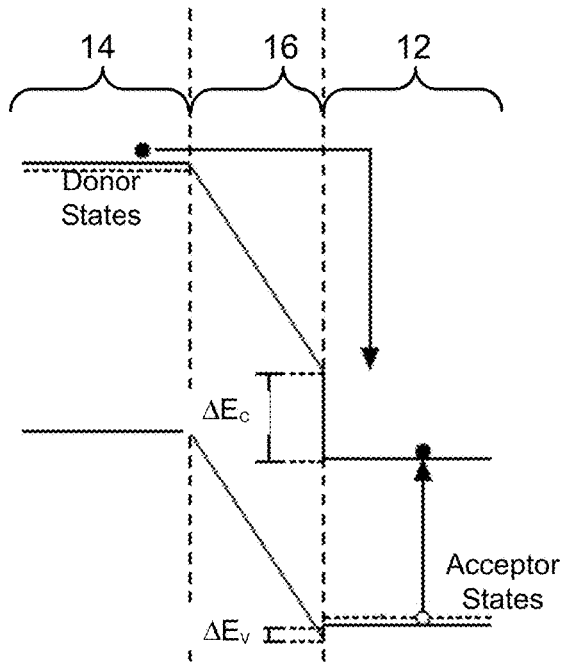
FIG. 3B is an example band energy diagram for a photodiode constructed according to FIG. 3A.
Figure 3C:
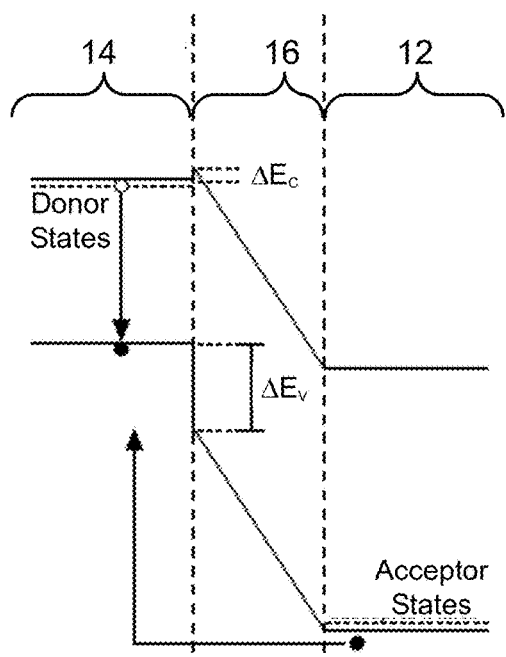
FIG. 3C is another example band energy diagram for a photodiode constructed according to FIG. 3A.

When the first semiconductor 12 is a counterdoped n-type semiconductor, the second semiconductor 14 is a counterdoped p-type semiconductor, and the third semiconductor 16 is an intrinsic semiconductor, and the second semiconductor 14 is the same as the third semiconductor 16 but different from the first semiconductor 12; the first semiconductor 12, second semiconductor 14, and third semiconductor 16 can be chosen to provide relative conduction and valence bands such as are shown in FIG. 3B. Band diagrams such as FIG. 3B often show donor states and acceptor states that are a product of counterdoping one or more of the semiconductors. The band diagram of FIG. 3B shows semiconductor 12 with a significantly lower (compared to thermal energy KT) conduction band edge with respect to semiconductor 16 (negative $\Delta E_c$), and negligibly higher (compared to thermal energy KT) valence band with respect to semiconductor 16 (positive $\Delta E_v$). As an example, a band diagram according to FIG. 3B can be generated using first semiconductor 12 that is a counterdoped n-type $Si_{1-y}C_y$ alloys strained to silicon where y is greater than 0 and less than or equal to 0.25, and $Si_{1-x-y}Ge_xC_y$ alloys strained to silicon where x is greater than 0 and less than or equal to 1 and y is greater than 0 and less than or equal to 0.25, the second semiconductor 14 is a counterdoped p-type Si, the third semiconductor 16 is intrinsic silicon, the upper electrical contact 18 is a degeneratively doped silicon, the lower electrical contact 18 is a degeneratively doped p-type $Si_{1-y}C_y$ alloys strained to silicon where y is greater than 0 and less than or equal to 0.25, and $Si_{1-x-y}Ge_xC_y$ alloys strained to silicon where x is greater than 0 and less than or equal to 1 and y is greater than 0 and less than or equal to 0.25, and the substrate 20 is p-type silicon.

In another example of a photodiode constructed according to FIG. 3A, the first semiconductor 12 is the same as the third semiconductor 16 but different from the second semiconductor 14. For instance, the first semiconductor 12 can be silicon, the third semiconductor 16 can be silicon and the second semiconductor 14 can be a SiGeC alloy. Additionally or alternately, the photodiode can include an n-type first semiconductor 12, a p-type second semiconductor 14, and an intrinsic third semiconductor 16.

When the first semiconductor 12 is a counterdoped n-type semiconductor, the second semiconductor 14 is a counterdoped p-type semiconductor, and the third semiconductor 16 is an intrinsic semiconductor, and the second semiconductor 14 is the same as the third semiconductor 16 but different from the first semiconductor 12; the first semiconductor 12, second semiconductor 14, and third semiconductor 16 can be chosen to provide relative conduction and valence bands such as are shown in FIG. 3B. Band diagrams such as FIG. 3B often show donor states and acceptor states that are a product of counterdoping one or more of the semiconductors. The band diagram of FIG. 3B shows semiconductor 12 with a significantly lower (compared to thermal energy KT) conduction band edge with respect to semiconductor 16 (negative $\Delta E_c$), and negligibly higher (compared to thermal energy KT) valence band with respect to semiconductor 16 (positive $\Delta E_v$). As an example, a band diagram according to FIG. 3B can be generated using first semiconductor 12 that is a counterdoped n-type $Si_{1-y}C_y$ alloys strained to silicon where y is greater than 0 and less than or equal to 0.25, and $Si_{1-x-y}Ge_xC_y$ alloys strained to silicon where x is greater than 0 and less than or equal to 1 and y is greater than 0 and less than or equal to 0.25, the second semiconductor 14 is a counterdoped p-type Si, the third semiconductor 16 is intrinsic silicon, the upper electrical contact 18 is a degeneratively doped silicon, the lower electrical contact 18 is a degeneratively doped p-type $Si_{1-y}C_y$ alloys strained to silicon where y is greater than 0 and less than or equal to 0.25, and $Si_{1-x-y}Ge_xC_y$ alloys strained to silicon where x is greater than 0 and less than or equal to 1 and y is greater than 0 and less than or equal to 0.25, and the substrate 20 is p-type silicon.

In another example of a photodiode constructed according to FIG. 3A, the first semiconductor 12 is the same as the third semiconductor 16 but different from the second semiconductor 14. For instance, the first semiconductor 12 can be silicon, the third semiconductor 16 can be silicon and the second semiconductor 14 can be a SiGeC alloy. Additionally or alternately, the photodiode can include an n-type first semiconductor 12, a p-type second semiconductor 14, and an intrinsic third semiconductor 16.

Figure 3D:
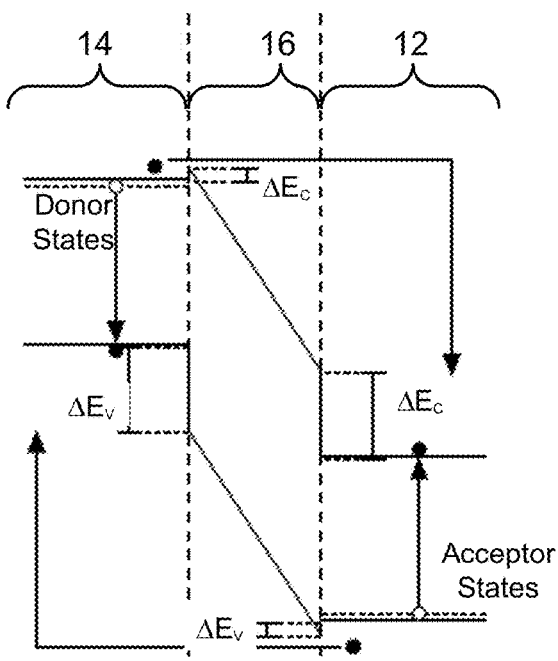
FIG. 3D is another example band energy diagram for a photodiode constructed according to FIG. 3A.

When the first semiconductor 12 is a counterdoped n-type semiconductor, the second semiconductor 14 is a counterdoped p-type semiconductor, and the third semiconductor 16 is an intrinsic semiconductor; the first semiconductor 12, second semiconductor 14, and third semiconductor 16 can be chosen to provide relative conduction and valence bands such as are shown in FIG. 3D. The band diagram of FIG. 3D shows semiconductor 12 with a significantly lower (compared to thermal energy KT) conduction band edge with respect to semiconductor 16 (negative $\Delta E_c$), and negligibly higher (compared to thermal energy KT) valence band with respect to semiconductor 16 (positive $\Delta E_v$), and semiconductor 14 with a significantly higher (compared to thermal energy KT) valence band edge with respect to semiconductor 16 (positive $\Delta E_v$), and negligibly lower (compared to thermal energy KT) conduction band with respect to semiconductor 16 (negative $\Delta E_c$). As an example, a band diagram according to FIG. 3D can be generated when the first semiconductor 12 is a counterdoped n-type $Si_{1-y}C_y$ alloys strained to silicon where y is greater than 0 and less than or equal to 0.25, and $Si_{1-x-y}Ge_xC_y$ alloy strained to silicon where x is greater than 0 and less than or equal to 1 and y is greater than 0 and less than or equal to 0.25, the second semiconductor 14 is a $Si_{1-x}Ge_x$ alloy strained to silicon where x is greater than or equal to 0 and/or less than or equal to 1, and a $Si_{1-x-y}Ge_xC_y$ alloy strained to silicon where x is greater than 0 and less than or equal to 1 and y is greater than 0 and less than or equal to 0.25, and a $Si_{1-x-y}Ge_xC_y$ alloy strained to silicon where x is greater than 0 and less than or equal to 1 and y is greater than 0 and less than or equal to 0.25, the third semiconductor 16 is intrinsic silicon, the upper electrical contact 18 is a degeneratively doped p-type $Si_{1-x-y}Ge_xC_y$ alloy strained to silicon where x is greater than 0 and less than or equal to 1 and y is greater than 0 and less than or equal to 0.25, the lower electrical contact 18 is a degeneratively doped n-type $Si_{1-y}C_y$ alloy strained to silicon where y is greater than 0 and less than or equal to 0.25, and $Si_{1-x-y}Ge_xC_y$ where x is greater than 0 and less than or equal to 1 and y is greater than 0 and less than or equal to 0.25, and the substrate 20 is p-type silicon.

Figure 3E:
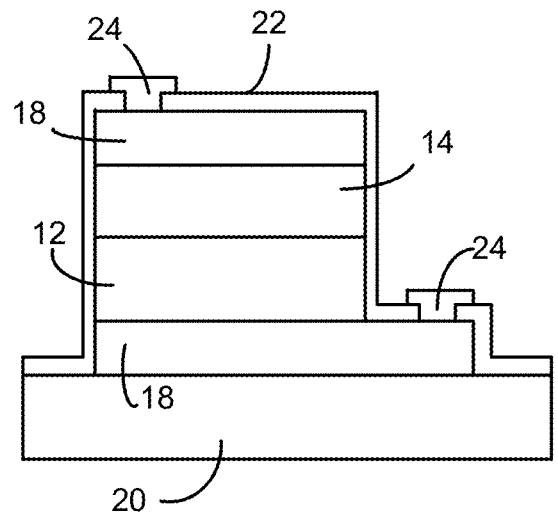
FIG. 3E is a cross section of a photodiode that includes a counterdoped pn junction.

A photodiode can include a counterdoped pn junction. For instance, FIG. 3E is a cross section of a photodiode that includes a counterdoped pn heterojunction according to any one of FIG. 1A through FIG. 1C. The counterdoped pn heterojunction is positioned between electrical contacts 18 and can be in direct physical contact with the electrical contacts 18. The electrical contacts 18 can be electrical conductors such as metals and are preferably a semiconductor that is doped so as to be electrically conductive. For instance, the electrical contacts 18 can be a degeneratively doped semiconductor. When an electrical contact 18 is a degeneratively doped semiconductor, the semiconductor can be the same as the semiconductor that is included in the counterdoped pn heterojunction and that contacts the electrical contact 18. For instance, the electrical contact 18 located between the substrate 20 and the first semiconductor 12 can be the same semiconductor. Suitable substrates 20 include, but are not limited to, Si, Ge, and SiGe relaxed buffer layers.

An electrical insulator 22 is positioned over the counterdoped junction and the electrical contacts 18. Suitable electrical insulators 22 include, but are not limited to, $SiO_2$, $Si_3N_4$, and $HfO_2$. Terminals 24 extend through the insulator 22 and into contact with the one of the electrical contacts 18. Suitable electrical contacts 18 include, but are not limited to, silicides such as NiSi, PtSi, and metals such as Al, and Cu. The terminals 24 are in electrical communication with electronics that can apply an electrical potential to the counterdoped junction. For instance, the electronics can apply a reverse bias to the counterdoped junction when the device is operated as a photodiode.

The first semiconductor 12 and/or the second semiconductor 14 can be counterdoped. The concentration of the dopant or primary dopant in the first semiconductor 12 can be greater than the density of states of the semiconductor. The density of states in the conduction band and in the valence band are in general different. Therefore, the concentration of the dopant or primary dopant, also depends on whether it is n-type or p-type. Since the density of states of a semiconductor is specific to a semiconductor material, the concentration of dopant or primary dopant in first semiconductor 12 and/or the second semiconductor 14 can be a function of material selection, and of dopant type (p or n). Examples of a suitable concentrations for the dopant or primary dopant in the second semiconductor 14 are greater than $1.0E18$ cm$^{-3}$, $1.0E19$ cm$^{-3}$, or $1.0E20$ cm$^{-3}$ and/or less than $2.0E20$ cm$^{-3}$, $5.0E20$ cm$^{-3}$, or $5.0E20$ cm$^{-3}$. When the first semiconductor 12 is counterdoped, examples of the concentration of counterdopant in the first semiconductor 12 include concentrations greater than 0.1% or 25% and/or less than 50% of the total dopant concentration in the first semiconductor 12. When the second semiconductor 14 is counterdoped, examples of the concentration of counterdopant in the first semiconductor 12 include concentrations greater than 0.1% or 25% and/or less than 50% of the total dopant concentration in the first semiconductor 12

The second semiconductor 14 is different from the first semiconductor 12. For instance, the first semiconductor 12 can be $Si_{1-y}C_y$ alloys strained to silicon where y is greater than 0 and less than or equal to 0.25, and $Si_{1-x-y}Ge_xC_y$ alloy strained to silicon where x is greater than 0 and less than or equal to 1 and y is greater than 0 and less than or equal to 0.25, and the second semiconductor 14 can be a $Si_{1-x-y}Ge_xC_y$ alloy strained to silicon where x is greater than 0 and less than or equal to 1 and y is greater than 0 and less than or equal to 0.25 and with a different composition than the $Si_{1-x-y}Ge_xC_y$ alloy included in the first semiconductor 12. Additionally or alternately, the photodiode can include an n-type first semiconductor 12 and a p-type second semiconductor 14.

Figure 3F:
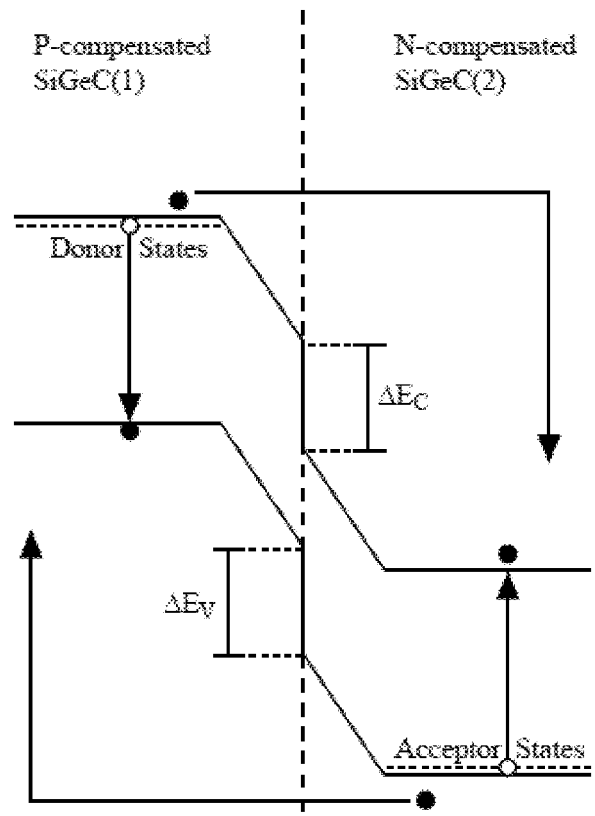
FIG. 3F is an example band energy diagram for a photodiode constructed according to FIG. 3E.

When the first semiconductor 12 is a counterdoped n-type semiconductor, the second semiconductor 14 is a counterdoped p-type semiconductor; the first semiconductor 12 and the second semiconductor 14 can be chosen to provide relative conduction and valence bands such as are shown in FIG. 3F. In particular, the first semiconductor 12 has a significantly lower (compared to thermal energy KT) conduction band edge with respect to the second semiconductor 14 (negative $\Delta Ec$), and the second semiconductor 14 has a significantly higher (compared to thermal energy KT) valence band edge with respect to semiconductor 12 (positive $\Delta Ev$). As an example, a band diagram according to FIG. 3F can be generated using first semiconductor 12 that is a counterdoped n-type $Si_{1-y}C_y$ alloys strained to silicon where y is greater than 0 and less than or equal to 0.25, and $Si_{1-x-y}Ge_xC_y$ alloy strained to silicon where x is greater than 0 and less than or equal to 1 and y is greater than 0 and less than or equal to 0.25, the second semiconductor 14 is a counterdoped p-type $Si_{1-x-y}Ge_xC_y$ alloy strained to silicon where x is greater than 0 and less than or equal to 1 and y is greater than 0 and less than or equal to 0.25 with a different composition from the first semiconductor 12, the third semiconductor 16 is intrinsic silicon, the upper electrical contact 18 is a degeneratively doped $Si_{1-y}C_y$ alloys strained to silicon where y is greater than 0 and less than or equal to 0.25, and $Si_{1-x-y}Ge_xC_y$ where x is greater than 0 and less than or equal to 1 and y is greater than 0 and less than or equal to 0.25, the lower electrical contact 18 is degeneratively doped $Si_{1-x}Ge_x$ alloy strained to silicon where x is greater than or equal to 0 and/or less than or equal to 1, and a $Si_{1-x-y}Ge_xC_y$ alloy strained to silicon where x is greater than 0 and less than or equal to 1 and y is greater than 0 and less than or equal to 0.25, and the substrate 20 is p-type silicon.

The photodiodes of FIG. 3A through FIG. 3F can have an improved performance if one or more of the materials included in the counterdoped junction is light-absorbing medium. For instance, the light-absorbing medium can be a direct bandgap material. In some instances, the light-absorbing medium is a direct bandgap material and is epitaxxially compatible with silicon. As an example, the third semiconductor 16 in FIG. 3A can be a direct bandgap material. Suitable direct band gap materials that are epitaxially compatible with silicon, include, but are not limited to, superlattices that includes one or more components selected from the group consisting of Si, Ge, C, Sn, Pb and that are strained to silicon surfaces, which may have crystallographic orientations other than the (100) planes, alloys and/or superlattices that include or consist of one or more components selected from the group consisting of Si, Ge, C, Sn, Pb and that are strained to silicon surfaces, which may have crystallographic orientations other than the (100) planes, alloys and/or superlattices that include one or more components selected from the group consisting of Si, Ge, C, Sn, Pb and that are strained to silicon surfaces, which may have crystallographic orientations other than the (100) planes. Preferred direct bandgap materials are superlattices such as the superlattices disclosed in U.S. Patent Application Ser. No. 61/895,971, filed on Oct. 25, 2013, entitled "Superlattice Materials and Applications" and incorporated herein in its entirety and also in PCT Patent Application PCT/US2014/057066, publication number WO 2105042610, filed on Sep. 23, 2014, entitled "Superlattice Materials and Applications," and incorporated herein in its entirety.

Figure 3G:
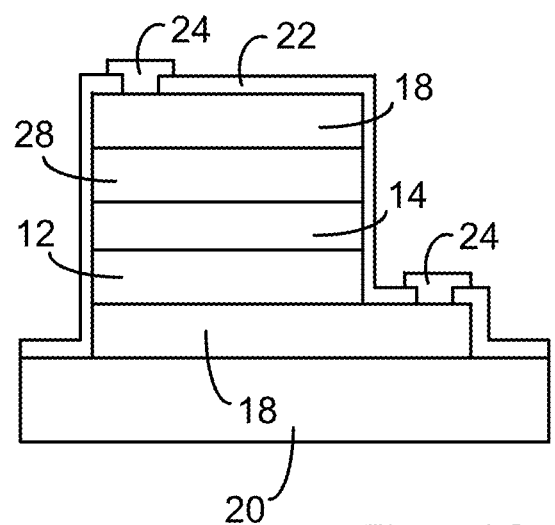
FIG. 3G is a cross section of a photodiode that includes a counterdoped pn junction in contact with a light-absorbing medium located outside of the junction.

The light-absorbing medium need not be included in the counterdoped junction in order to improve the efficiency of the photodiode. For instance, the light-absorbing medium can contact one or more materials included in the counterdoped junction. For example, the light-absorbing medium can be outside of the counterdoped junction but in physical contact with the first semiconductor 12 and/or the second semiconductor 14 in the above photodiodes. FIG. 3G provides an example of the photodiode where the light-absorbing medium 28 is located outside of the counterdoped junction but indirect contact with the counterdoped junction. The photodiode is constructed according to FIG. 3E but includes a light-absorbing medium 28 between the second semiconductor 14 and the electrical contact 18. The light-absorbing medium 28 is in direct physical contact with the second semiconductor 14.

Figure 3H:
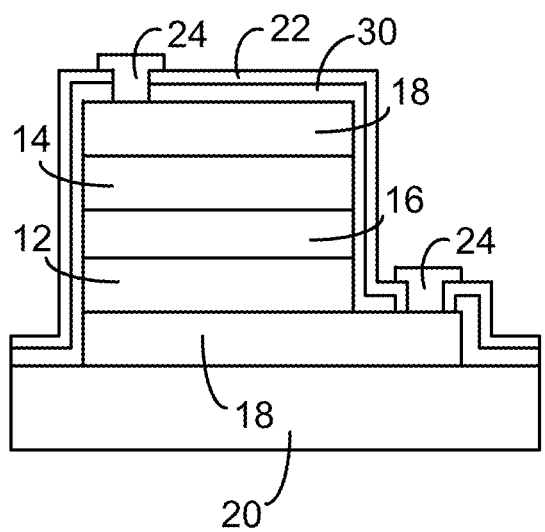
FIG. 3H illustrates a photodiode according to FIG. 3A with a pinning layer surrounding the outer edges of the photodiode and located between the counterdoped junction and an optional electrical insulator.
Figure 3I:
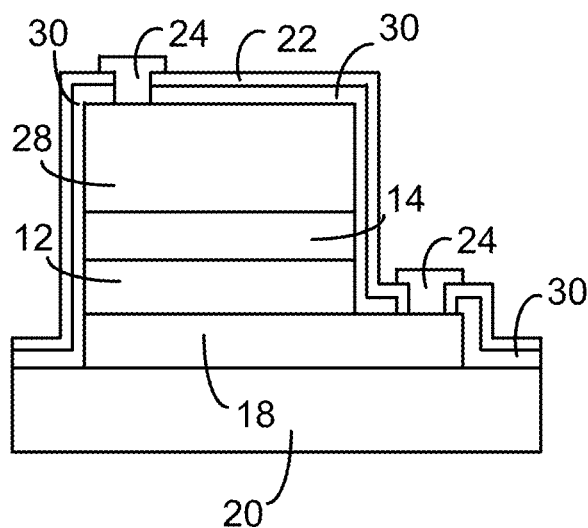
FIG. 3I illustrates a photodiode according to FIG. 3G with a pinning layer surrounding the outer edges of the photodiode and located between the counterdoped junction and an optional electrical insulator.

The photodiodes disclosed in FIG. 3A through FIG. 3G are mesa type diodes that can have at least one semiconductor that is epitaxially grown. As a result, edge-related leakage currents may be a relevant contribution to the total leakage current of the diode. Edge-related leakage can be sharply reduced by pinning the surface Fermi Level around the mesa outer surfaces of the photodiodes disclosed in FIG. 3A through FIG. 3G. For instance, FIG. 3H illustrates a photodiode according to FIG. 3A with a pinning layer located between the counterdoped junction and the optional electrical insulator 22. The pinning layer contacts the edges of the first semiconductor 12, the second semiconductor 14, the third semiconductor 16 and the electrical contacts 18. As another example, FIG. 3I illustrates a photodiode according to FIG. 3G with a pinning layer 30 located between the counterdoped junction and the optional electrical insulator 22. The pinning layer contacts the edges of the first semiconductor 12, the second semiconductor 14, the third semiconductor 16 and the light-absorbing medium 28. The doping of the pinning layer 30 can permit the pinning layer to provide a quality electrical contact to the light-absorbing medium 28. As a result, the pinning layer 30 can serve as and/or replace an electrical contact 18.

Suitable pinning layers are electrically conducting and include, but are not limited to, a doped semiconductor. The pinning layer can be doped with the same polarity as the second semiconductor 14. For instance, when the second semiconductor 14 is doped so as to be a p-type semiconductor, the pinning layer can be doped so as to be a p-type pinning layer. The concentration of dopant in the pinning layer can exceed the concentration of dopant in the second semiconductor 14. In some instances, the pinning layer is degeneratively doped. Suitable materials for the pinning layer include, but are not limited to, Si, Ge, random or ordered alloys of $Si_{1-x}Ge_x$ where x is greater than or equal to 0 and/or less than or equal to 1, $Si_{1-y}C_y$ where y is greater than 0 and less than or equal to 0.25, and $Si_{1-x-y}Ge_xC_y$ where x is greater than 0 and less than or equal to 1 and y is greater than 0 and less than or equal to 0.25.

Although the devices disclosed in the context of FIG. 3A through FIG. 3I are disclosed in the context of a photodiode, the above devices can each be operated as a diode.

Figure 4A:
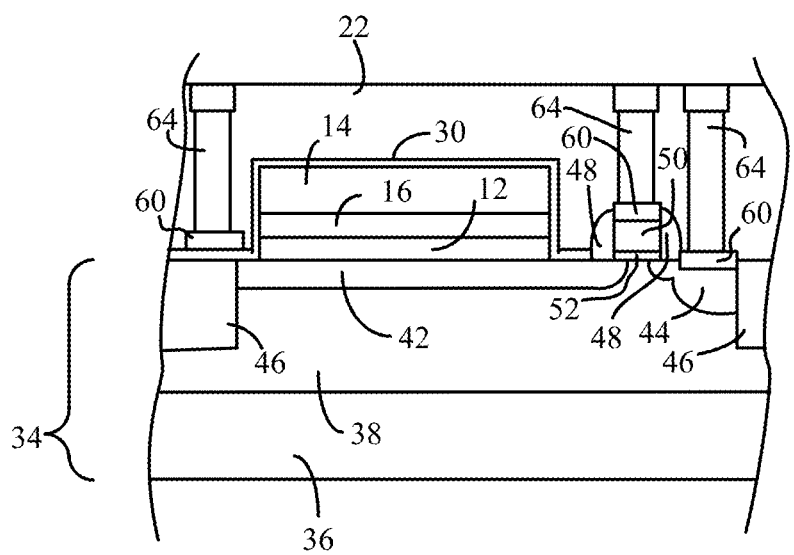
FIG. 4A is a cross section of an optoelectronic device that includes the photodiode of FIG. 3H electrically connected to the source or drain of an NMOS transistor both made on the same active area.

The devices disclosed in the context of FIG. 3A through FIG. 3I are depicted as stand alone devices. However, integration with other devices such as CMOS devices, is crucial to enable the fabrication of integrated circuits (ICs), and to enable the level of performance that makes certain functionalities possible. FIG. 4A is a cross section of an optoelectronic device that includes the photodiode electrically connected to the source or drain of an NMOS transistor. This arrangement of photodiode and transistor is used in applications such as general light sensors, CMOS image sensors, and optical transceivers.

For instance, FIG. 4A is a cross section of an optoelectronic device that includes the photodiode of FIG. 3H electrically connected to the source or drain of an NMOS transistor. The device is built on a substrate 34 having a base region 36, a first region 38, a source region 42 and a drain region 44. The first region 38, a source region 42 and a drain region 44 are doped regions of the substrate 34. The source region 42 and drain region 44 extend into the first region 38. Shallow trench isolation structures 46 extend into the substrate 34. The base region 36, first region 38, source region 42 and drain region 44 can each be doped so as to be an n-type region or a p-type region. In the example shown in FIG. 4A, the base region 36 is doped so as to be a p-type base region 36, the first region 38 is doped so as to be p-type first region and can serve as a p-well, the source region 42 is doped so as to be n-type source region 42, and the drain region 44 is doped so as to be n-type drain region 44. The concentration of dopant in the first regions 38 can be greater than the dopant concentration in the base region 36. The concentration of dopant in the drain region 44 can be greater than the dopant concentration in the source regions 42 which can be greater than the dopant concentration in the first region 38. The dopant concentration in the drain regions 44 can be sufficient to make the drain regions 44 degenerate semiconductors. Suitable materials for the substrate 34 include, but are not limited to, silicon, Thick-Film Silicon-on-Insulator (SOI), Thin-Film SOI, UltraThinFilm (UTF)-SOI, Thin-Film Germanium on Insulator (GOI or GeOI), and UltraThinFilm (UTF)-GOI, Thin-Film Silicon-Germanium on Insulator (GOI), and UltraThinFilm (UTF)-Silicon-Germanium on Insulator. Suitable materials for the shallow trench isolation structures 46 include, but are not limited to, dielectric materials such as silicon oxide.

An insulator 48, gate 50, and gate insulator 52 are positioned on the substrate 34. The gate insulator 52 is positioned between the substrate 34 and the gate 50. A counterdoped junction is positioned between the source region 42 and a pinning layer 30. In particular, the first semiconductor 12, third semiconductor 16, and second semiconductor 14 are between a pinning layer 30 and the substrate 34. The pinning layer 30 can be in physical contact with the edges of the first semiconductor 12, second semiconductor 14, and third semiconductor 16. The pinning layer 30 and source region 42 can surround the counterdoped junction. For instance, pinning layer 30 and source region 42 can surround the first semiconductor 12, second semiconductor 14, and third semiconductor 16.

The pinning layer 30 is doped with the same polarity as the second semiconductor 14. For instance, when the first region 38 is doped so as to be a p-type first region 38, the pinning layer 30 is doped so as to be a p-type pinning layer 30. The concentration of dopant in the pinning layer 30 can exceed the concentration of dopant in the second semiconductor 14. In some instances, the pinning layer 30 is degeneratively doped.

Electrical contacts 60 are in direct physical contact with the pinning layer 30, the gate 50, and the drain region 44. Suitable materials for the electrical contacts 60 include, but are not limited to, silicides such as Nickel-Silicide. Electrical conductors 64 extend through the insulator 22 to the electrical contacts 60. Electronics (not shown) can be in electrical communication with the electrical conductors 64. As a result, the electronics can apply electrical energy to the electrical conductors 64 in order to operate the device.

During operation of the device, the source region 42 functions as the lower electrical contact of the photodiode illustrated in FIG. 3H and the pinning layer 30 functions as the upper electrical contact of the photodiode illustrated in FIG. 3H. Accordingly, the source region 42 and the pinning layer 30 function as the anode and cathode of the photodiode. The electronics apply electrical energy to the electrical conductors 64 so as to form a reverse bias across the photodiode. The electronics can control the potential of the pinning layer 30 or the pinning layer 30 can be grounded. Electrical current flows through the photodiode in response to the absorption of light by the third semiconductor 16 which serves as a light-absorbing medium.

The source region 42, drain region 44 and gate 50 respectively act as the source, drain, and gate of the transistor. Further, the first region 38 is doped such that the portion of the first region 38 closest to the gate insulator 52 acts as the channel of the transistor. For instance, the first region 38 can include a gradient in the dopant concentration that allows the first region 38 to function as a retrograde well. The electronics can turn the transistor on and off enabling the photo-diode to be operated in different modes as described above.

Figure 4B:
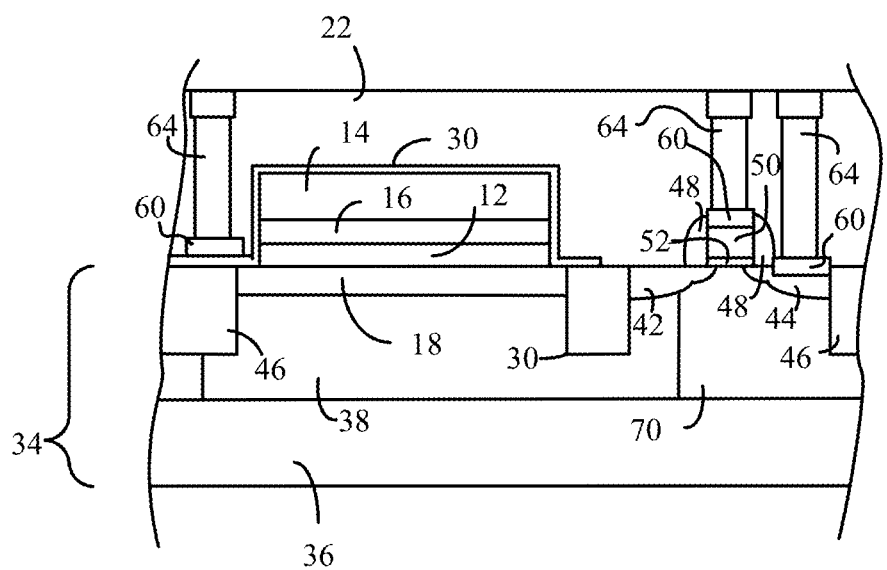
FIG. 4B is a cross section of an optoelectronic device that includes the photodiode of FIG. 3H electrically connected to the source or drain of an NMOS transistor. The photodiode and the NMOS transistor are made adjacent active areas separated by isolation regions/structures.

The source region 42 can be separated from the electrical contact of the photodiode. For instance, FIG. 4B is a cross section of an optoelectronic device that includes the photodiode of FIG. 3H electrically connected to the source or drain of an NMOS transistor. The substrate 34 includes a shallow trench isolation structure 46 located between the source region 42 and the lower electrical contact 18 of the photodiode. Additionally, the substrate 34 includes a second region 70 in contact with the first region 38, the source region 42 and the lower electrical contact. The second region is doped so as to be n-type second region and can serve as an n-well. The second region provides a conductive pathway under the shallow trench isolation structure 46 that is located between the source region 42 and the lower electrical contact 18. As a result, the second region provides electrical communication between the source region 42 and the lower electrical contact 18.

Figure 4C:
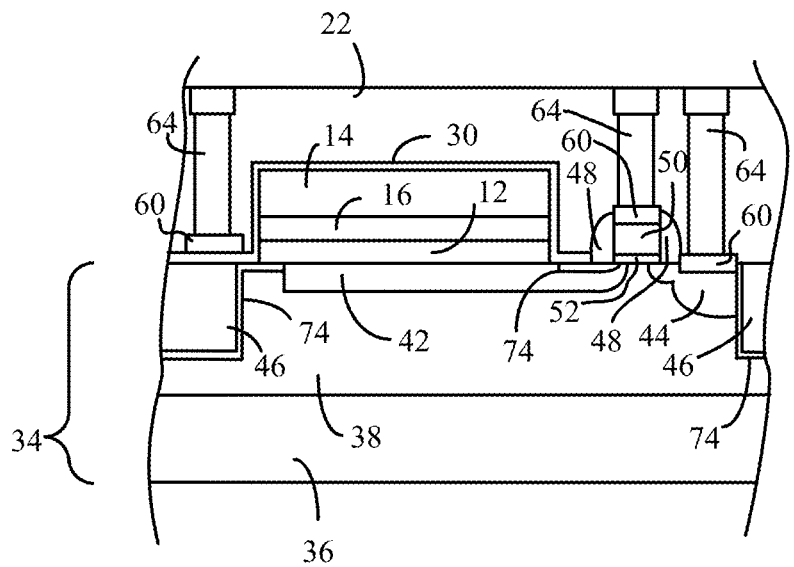
FIG. 4C is a cross section of an optoelectronic device that includes the photodiode of FIG. 3H electrically connected to the source or drain of an NMOS transistor. The pinning layer from the photodiode of FIG. 3H is in electrical communication with one or more secondary pinning layers included in a substrate on which the photodiode is positioned.

The device shown in FIG. 4A and FIG. 4B can be modified to have the pinning layer 30 in electrical communication with one or more secondary pinning layers 74 included in the substrate 34. For instance, FIG. 4C illustrates the device of FIG. 4A modified so the substrate 34 includes a secondary pinning layer 74 in contact with pinning layer 30 and located between the first region 38 and the shallow trench isolation structure 46. The substrate 34 includes another secondary pinning layer 74 in contact with pinning layer 30 and the source region 42. The pinning layer 30, the one or more secondary pinning layers 74 and source region 42 can surround the counterdoped junction. For instance, the pinning layer 30, the one or more secondary pinning layers 74 and source region 42 can surround the first semiconductor 12, second semiconductor 14, and third semiconductor 16. The one or more secondary pinning layers 74 can be doped regions of the substrate 34. When the one or more secondary pinning layers 74 are a doped region of the substrate 34, the dopant can have the same polarity as the pinning layer 30.

Figure 4D:
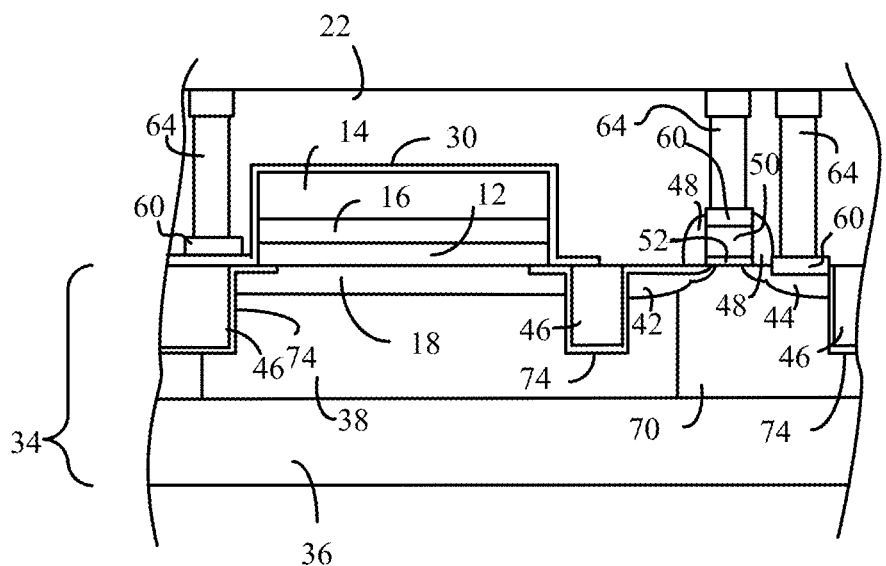
FIG. 4D is a cross section of another example of an optoelectronic device that includes the photodiode of FIG. 3H electrically connected to the source or drain of an NMOS transistor. The pinning layer from the photodiode of FIG. 3H is in electrical communication with one or more secondary pinning layers included in a substrate on which the photodiode is positioned.

As another example, FIG. 4D illustrates the device of FIG. 4B modified so the substrate 34 includes a secondary pinning layer 74 in contact with the pinning layer 30, a shallow trench isolation structure 46, and electrical contact. The substrate 34 includes another secondary pinning layer 74 in contact with pinning layer 30, a shallow trench isolation structure 46, and the source region 42. The pinning layer 30, the one or more secondary pinning layers 74 and electrical contact 18 can surround the counterdoped junction. For instance, the pinning layer 30, the one or more secondary pinning layers 74 and electrical contact 18 can surround the first semiconductor 12, second semiconductor 14, and third semiconductor 16. The one or more secondary pinning layers 74 can be doped regions of the substrate 34. When the one or more secondary pinning layers are a doped region of the substrate 34, the dopant can have the same polarity as the pinning layer 30.

In FIG. 4C and FIG. 4D, the pinning layer 30 is in electrical communication with the one or more secondary pinning layers 74. As a result, the voltage of the pinning layer 30 and one or more secondary pinning layers 74 can be set by applying a voltage to the one or more secondary pinning layers 74. Accordingly, the electrical conductor 64 and electrical contact 60 connected to the top pinning layers 30 as shown in FIG. 4A and FIG. 4B is not included in the device of FIG. 4C and FIG. 4D. In FIG. 4C and FIG. 4D, the electrical contacts 60 and the electrical conductors 64 are optional, and the potential of the pinning layer 30 can be set through the contact with substrate pinning layer 74.

The devices of FIG. 4A through FIG. 4D are more efficient as a result of the reduced onset voltage of the counterdoped junction. Suitable onset voltages for the counterdoped junction in these devices can be less than 3V, 1V, or 0.5V and/or greater than 0.1V, 0.2V, or 0.3V.

The integration of the photodiodes with CMOS devices as shown in FIG. 4A enables the fabrication of integrated circuits (ICs) and the levels of performance that makes certain functionalities possible. For instance, the close integration of the photodiodes in CMOS Image Sensors (CIS) with the MOSFETs keeps parasitic capacitances low enough to allow a high conversion efficiency of charge to voltage. Without this extremely tight (monolithic) integration of the photodiode and the MOSFETs, the performance of CIS would be significantly lower. Therefore, CIS is a good exemplary case to illustrate the integration of CEP-SAM-PPD Therefore, CIS is a good exemplary case to illustrate the integration of CEP-SAM-PPD (Cyclic Excitation Process—Separate Absorption and Multiplication Pinned Photo-Diode) devices with conventional CMOS devices.devices with conventional CMOS devices.

Although the device of FIG. 4A through FIG. 4D include the photodiode of FIG. 3H, any of the photodiodes and/or counterdoped junctions of FIG. 3A through FIG. 3G can be substituted for the photodiode and/or counterdoped junctions of FIG. 3A through FIG. 3G.

Figure 5A:
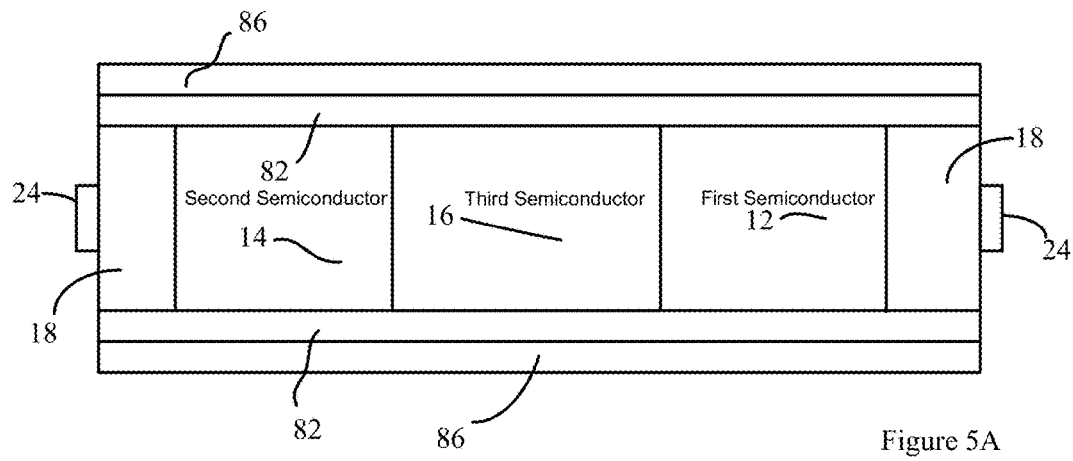
FIG. 5A is a schematic of a Tunnel MOSFET that includes a counterdoped p-i-n heterojunction constructed according to any of the counterdoped p-i-n heterojunctions disclosed in FIG. 1D through FIG. 1F.

The use of counter doped junctions can also provide transistors such as tunnel transistors with an increased amplification current. FIG. 5A is a schematic of a Tunnel MOSFET that includes a counterdoped p-i-n heterojunction constructed according to any of the counterdoped p-i-n heterojunctions disclosed in FIG. 1D through FIG. 1F. The counterdoped p-i-n heterojunction is positioned between electrical contacts and can be in direct physical contact with the electrical contacts. The electrical contacts can be electrical conductors such as metals and are preferably a semiconductor that is doped so as to be electrically conductive. For instance, the electrical contacts can be a degeneratively doped semiconductor. When an electrical contact is a degeneratively doped semiconductor, the semiconductor can be the same as the semiconductor that is included in the counterdoped p-i-n heterojunction and that contacts the electrical contact.

The counterdoped junction includes a third semiconductor 16, first semiconductor 12 and second semiconductor 14 arranged such that during operation of the transistor charges flow between the first semiconductor 12 and the second semiconductor 14 through the third semiconductor 16. The third semiconductor 16 is located between the first semiconductor 12 and the second semiconductor 14. The third semiconductor 16 can be in direct physical contact with both the first semiconductor 12 and the second semiconductor 14. The first semiconductor 12 can be the source, the second semiconductor 14 can be the drain, and the third semiconductor 16 can be the channel. The first semiconductor 12 is doped so as to be an n-type semiconductor or a counterdoped n-type semiconductor and/or the second semiconductor 14 is doped so as to be a p-type semiconductor or a counterdoped p-type semiconductor with at least the first semiconductor 12 or the second semiconductor 14 being counterdoped. The third semiconductor 16 can be intrinsic. The counterdoped junction can be a heterojunction. As a result, only two of the semiconductors selected from the group consisting of the first semiconductor 12, the second semiconductor 14 and the third semiconductor 16 can be the same. The band alignments of FIG. 5B through FIG. 10F can be achieved when the first semiconductor 12, the second semiconductor 14 and the third semiconductor 16 are different from one another.

A gate insulator 82 is positioned between a gate electrode 86 and the third semiconductor 16. The gate insulator 82 can also optionally be positioned between the first semiconductor 12 and the gate electrode 86 and/or between the gate electrode 86 and the second semiconductor 14. In some instances, the gate insulator 82, gate electrode 86, and third semiconductor 16 are arranged in a sandwich or the gate insulator 82 and gate electrode 86 surround the third semiconductor 16. The Suitable materials for the gate insulator 82 include, but are not limited to dielectric materials such as silicon oxide, Si-oxynitride, High-K metal-oxide and metal-oxynitride materials such as Hf-oxide, Al-oxide, and metal-alloy oxides, such as HfAl-oxide, and HfAlZr-oxide. Suitable materials for the gate electrode 86 include, but are not limited to electrically conducting materials such as highly-doped poly-silicon, metals such as Al, Cu, etc, which can be interfaced directly with the gate insulator, or can be deposited on a barrier metal(s) which is positioned in-between the gate oxide and the gate electrode 86. "Barrier metal(s)", such as TiN, TiSiN, TaN, WN, and others, can be used to engineer the work function that strongly impacts the threshold voltage (VT) of the tunnel transistor, in addition to providing a physio-chemical barrier to reduce the chance of chemical reactions between the metal gate electrode 86 and the gate insulator 82.

The concentration of the dopant or primary dopant in the first semiconductor 12 can be greater than $2.0E19$ $cm^{-3}$, $5.0E19$ $cm^{-3}$, or $2.0E20$ $cm^{-3}$, and/or less than $5.0E20$ $cm^{-3}$, $1.0E21$ $cm^{-3}$, or $2.0E20$ $cm^{-3}$. The concentration of the dopant or primary dopant in the second semiconductor 14 can be greater than $2.0E19$ $cm^{-3}$, $5.0E19$ $cm^{-3}$, or $2.0E20$ $cm^{-3}$, and/or less than $5.0E20$ $cm^{-3}$, $1.0E21$ $cm^{-3}$, or $2.0E20$ $cm^{-3}$. When the first semiconductor 12 is counterdoped, the concentration of counterdopant in the first semiconductor 12 can be greater than $1.0E19$ $cm^{-3}$, $2.5.0E19$ $cm^{-3}$, or $1.0E20$ $cm^{-3}$, and/or less than $5.0E20$ $cm^{-3}$, $1.0E21$ $cm^{-3}$, or $2.0E20$ $cm^{-3}$. When the second semiconductor 14 is counterdoped, the concentration of counterdopant in the first semiconductor 12 can be greater than $1.0E19$ $cm^{-3}$, $2.5.0E19$ $cm^{-3}$, or $1.0E20$ $cm^{-3}$, and/or less than $5.0E20$ $cm^{-3}$, $1.0E21$ $cm^{-3}$, or $2.0E20$ $cm^{-3}$. The third semiconductor 16 can be intrinsic.

A terminal 24 is in electrical communication with each of the electrical contacts. For instance, a different terminal 24 can be in direct physical contact with each of the electrical contacts. Suitable terminals 24 include, but are not limited to, silicides such as NiSi or PtSi, and metals such as Al or Cu. The terminals 24 are in electrical communication with electronics that can apply an electrical potential to the counterdoped junction. Electronics (not shown) can be in electrical communication with each of the terminals 24 and can be configured to apply electrical energy to the terminals 24 in order to operate the transistor. In some instances, the onset voltage of the counterdoped junction is tuned so as to be greater than 0V, 0.1V, or 0.2V and/or less than 0.5V, 1V or 3V.

Tunnel transistors are generally associated with very low off-state currents. While the low off-state current is desirable, these same devices are also associated with undesirably low on-state currents. For instance, the on-state currents of tunnel transistors are generally two to three orders of magnitude lower than the on-state currents of conventional thermionic MOSFETs. The reduced onset voltage associated with the counterdoped junction can increase the on-state currents of the tunnel transistor. For instance, prior tunnel transistors generally do not operate at an operating voltage of less than 0.2 V; however, the reduced onset voltage allows the transistor to operate at less than 0.2 V. The operating voltage can be the voltage of the power supply and is usually designated as VDD. All functionality of the transistor takes place with voltages that are equal or less than the operating voltage. For tunnel MOSFETs, the operating voltage can be decreased by tuning a number of parameters such as the engineering of the source to channel tunnel junction. Here heterojunctions enable the lowering of the barrier height for tunneling, which in turn enables the lowering of the voltage necessary to induce significant tunneling through that barrier. This is an example of how heterojunctions produce advantages over homojunctions of less than 0.2 V; however, the reduced onset voltage allows the transistor to operate at less than 0.2 V. The operational voltage of the transistor can be tuned by engineering of the heterojunction tunneling barrier between source and channel, as well as by the gate insulator and electrode which control the tunneling barrier thickness, as a function of voltage applied to the gate.

The lowered operational voltage that is possible with the tunnel MOSFET results from the ability to modulate the tunneling probability, of injecting of carriers from source to channel and drain, by thinning the tunneling barrier through the voltage applied at the gate. Because a linear variation on the thickness of the barrier causes an exponential variation on tunneling probability, it is then possible to module large variations in current flowing from source to drain with a fairly small voltage. Another important factor to lower the operating voltage is the decrease in barrier height for band-to-band tunneling. Heterojunctions can lower this barrier height with respect to homojunctions. In homojunctions, the tunneling barrier height is the band-gap of the material used for the source and channel regions. In heterojunctions, the tunneling barrier height from source to drain depends on the band offsets or alignments between the source and channel materials. For example, for NMOS devices, having a p-type doped source and an n-type doped drain, the barrier height for charge injection from the source to the channel is given by the difference between the conduction band edge of the channel and the valence band edge of the source. Conversely, for PMOS, having a n-type doped source and p-type doped drain, the barrier height for charge injections from the source to the channel is given by the difference of the valence band edge for the channel and the conduction band edge of the source. Additionally, band offsets can be strategically placed along the path from source to drain, as to impart kinetic energy to charge carriers when the carriers cross the heterojunctions. As a result, the first semiconductor 12, second semiconductor 14, and third semiconductor 16 and the associated doping levels can be selected to provide band offsets that allow the charge carriers to acquire kinetic energy from crossing interfaces in addition to the kinetic energy acquired from the applied electric field. The increased kinetic energy from interface crossing can be sufficient to compensate for any loss in kinetic energy that results from the lowering of the applied electric field as a result of the reduced operational voltage.

The material selection and doping can be such that the energy of the conduction band drops or remains constant when electrons cross the interface from the second semiconductor 14 to the third semiconductor 16 and again when crossing the interface from the third semiconductor 16 to the first semiconductor 12. Additionally or alternately, the energy of the valence band decreases or remains constant when holes cross the interface from the first semiconductor 12 to the third semiconductor 16 and again when crossing the interface from the third semiconductor 16 to the second semiconductor 14. For instance, the material selection and doping can be selected to provide a band diagram according to FIG. 5B when the electronics are not applying electrical energy to the transistor. FIG. 5C is a more realistic version of the valence and conduction bands shown FIG. 5B where the effects of the material interfaces and Fermi levels are evident. The energy of the conduction bands decrease at each interface when moving from the second semiconductor 14 to the first semiconductor 12 and the energy of the valence bands increase at each interface when moving from the first semiconductor 12 to the second semiconductor 14.

Figure 5B:
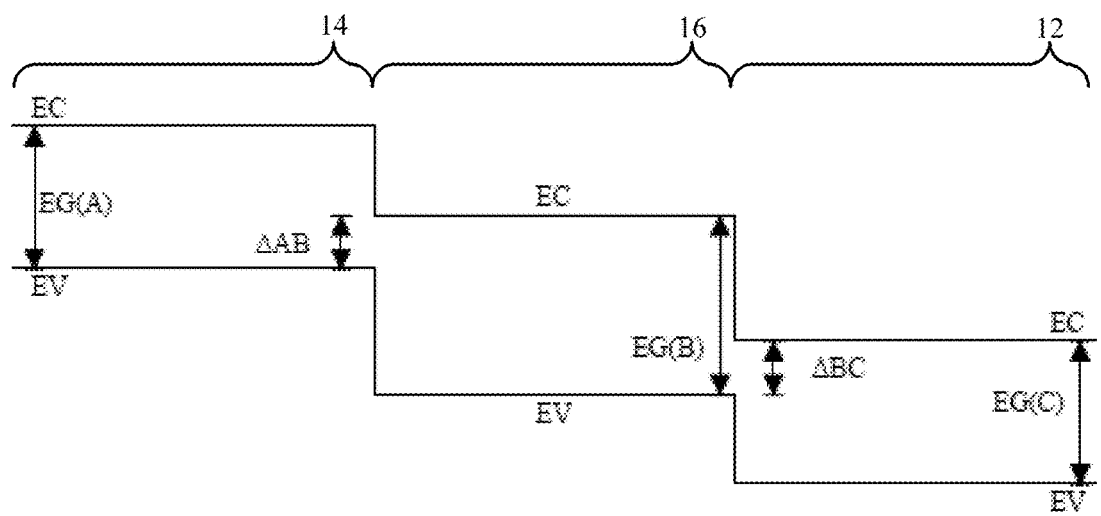
FIG. 5B is an example band energy diagram for an example of a Tunnel MOSFET according to FIG. 5A when the electronics are not applying electrical energy to the transistor.
Figure 5C:
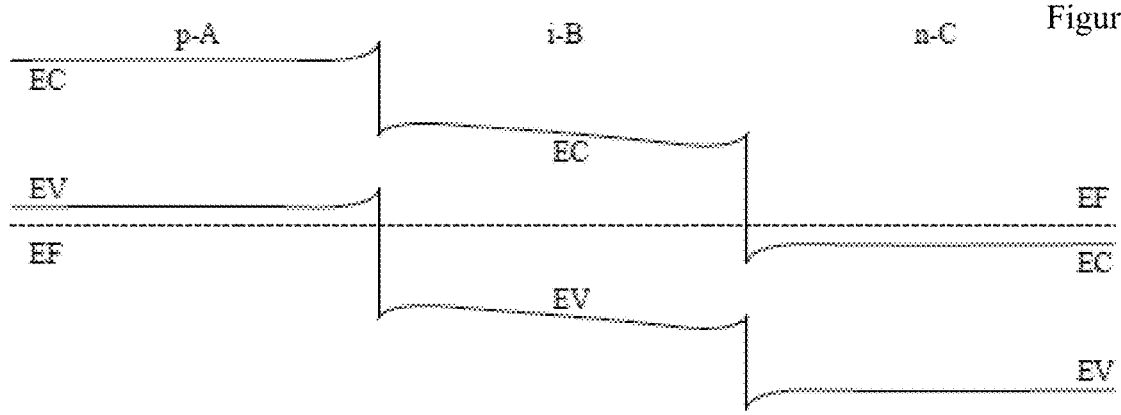
FIG. 5C is a more realistic version of the valence and conduction bands shown FIG. 5B where the effects of the material interfaces and Fermi levels are evident.

The transistor of FIG. 5A through FIG. 5C can function as PMOS and/or as NMOS depending only on the applied voltage.

Figure 5D:
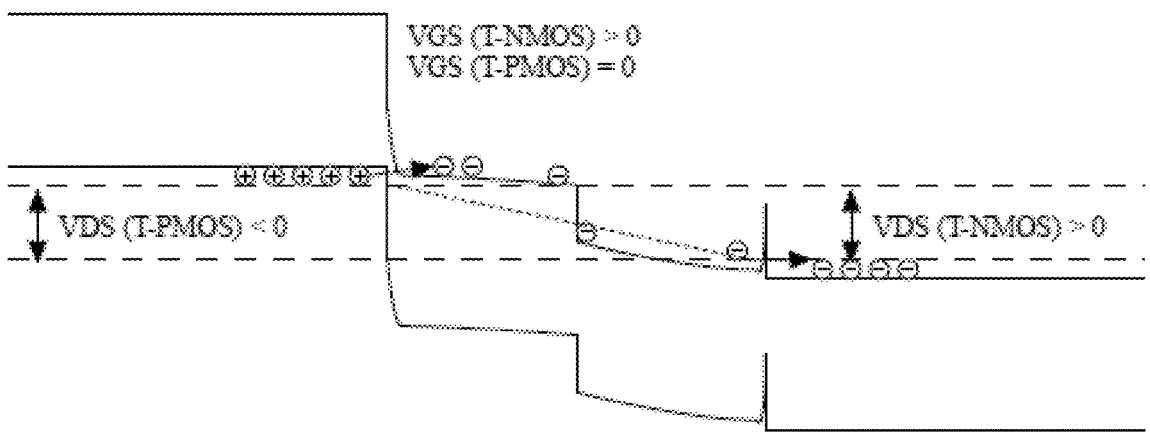
FIG. 5D through FIG. 5G show qualitative band alignments for the tunnel transistor of FIG. 5A through FIG. 5C during operation of the transistor.
Figure 5E:
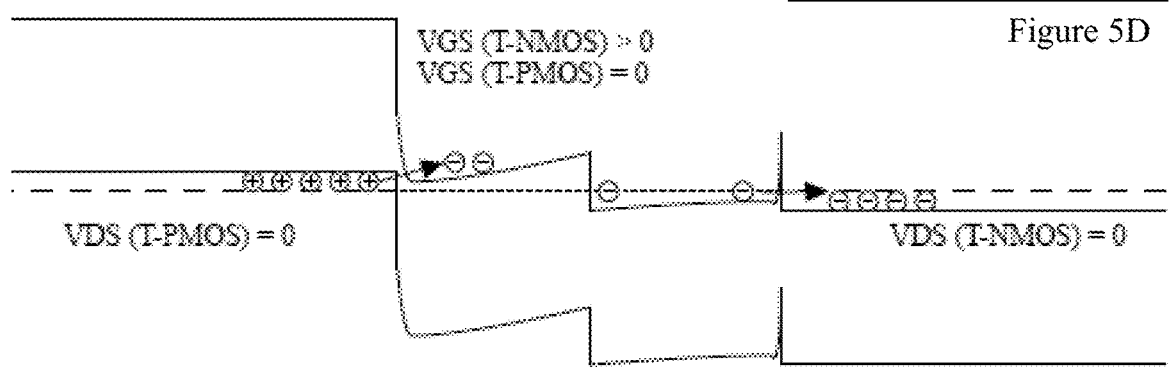
Figure 5F:
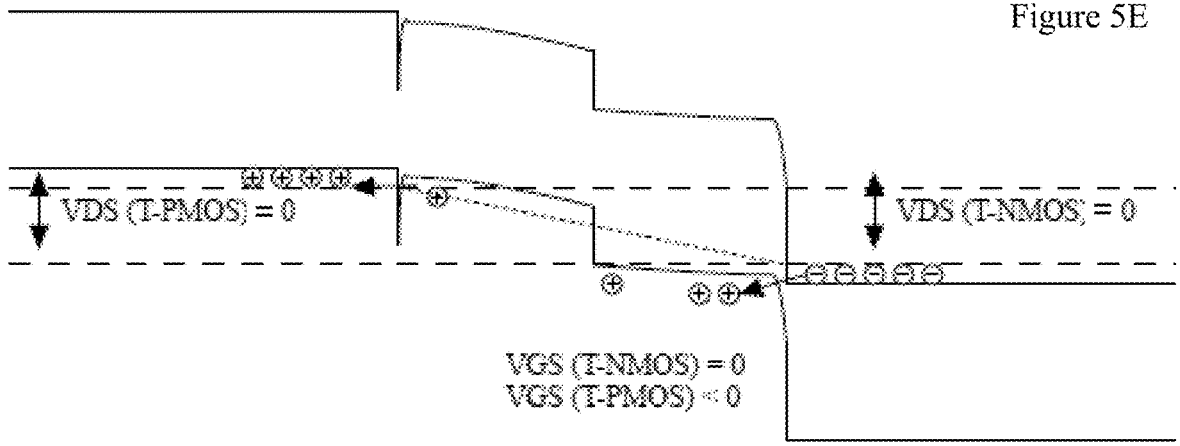
Figure 5G:
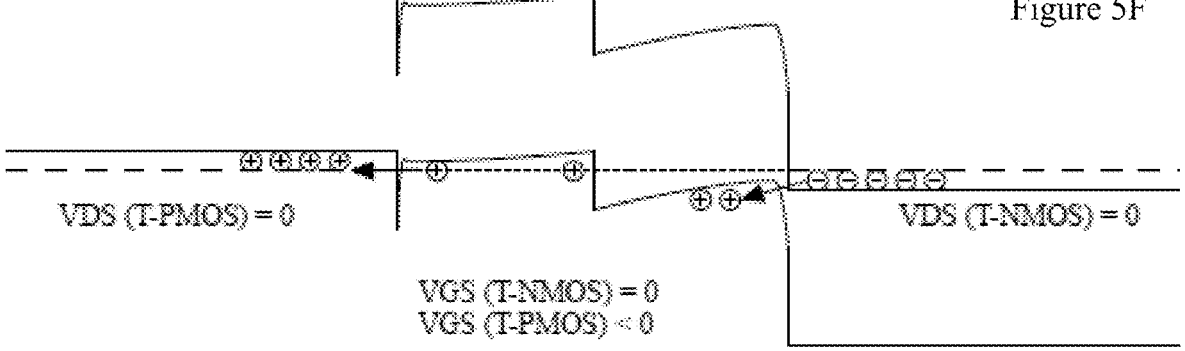

FIG. 5D through FIG. 5G show qualitative band alignments for the tunnel transistor of FIG. 5A through FIG. 5C during operation of the transistor. For instance, FIG. 5D shows the band alignments for the bias conditions at which VDS (voltage of drain minus voltage of source) is >0 and VGS (voltage of gate minus voltage of source) is >0 for a T-NMOS, or VDS<0 and VGS=0 for T-PMOS. The band diagram of FIG. 5E shows the band alignments for the bias conditions at which VDS=0 and VGS>0 for T-NMOS or VDS=0 and VGS=0 for a T-PMOS. The band diagram of FIG. 5F shows the band alignments for the bias conditions at which VDS>0 and VGS=0 for T-NMOS or VDS<0 and VGS<0 for a T-PMOS. The band diagram of FIG. 5G shows the band alignments for the bias conditions at which VDS=0 and VGS=0 for T-NMOS or VDS=0 and VGS<0 for a T-PMOS.

Figure 6A:
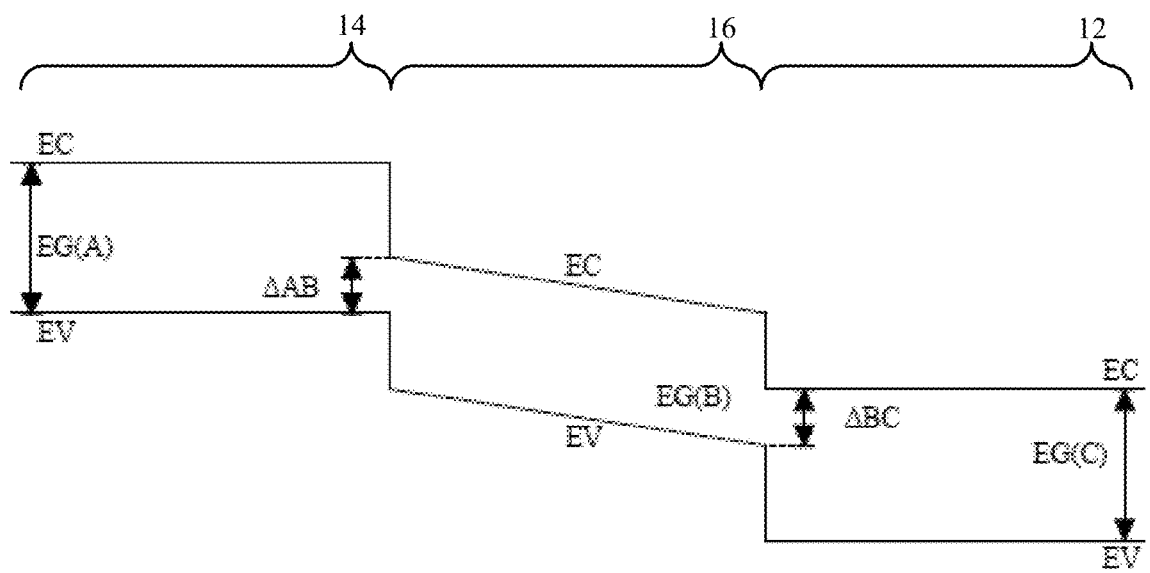
FIG. 6A is an example band energy diagram for an example of a Tunnel MOSFET according to FIG. 5A when the electronics are not applying electrical energy to the transistor.
Figure 6B:
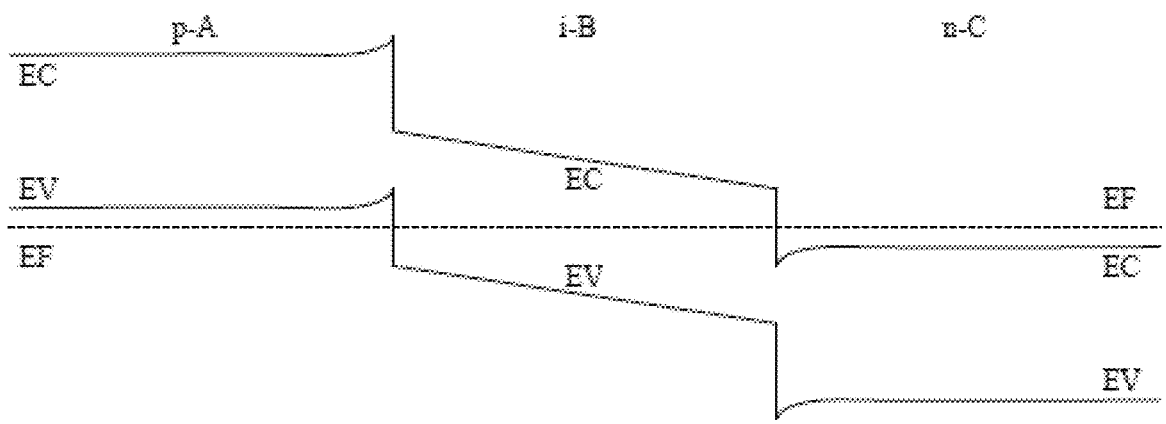
FIG. 6B is a more realistic version of the valence and conduction bands shown FIG. 6A where the effects of the material interfaces and Fermi levels are evident.

The material and doping in the transistor of FIG. 5A can also be selected such that the energy level of the third semiconductor 16 decreases when moving from the second semiconductor 14 to the first semiconductor 12. For instance, the material and doping can also be selected to provide a band diagram according to FIG. 6A and FIG. 6B. FIG. 6A represents the band diagram when the electronics are not applying electrical energy to the transistor. FIG. 6B is a more realistic version of the valence and conduction bands shown FIG. 6A where the effects of the material interfaces and Fermi levels are evident. The energy level of the conduction band and the valence band for the third semiconductor 16 decreases when moving from the second semiconductor 14 to the first semiconductor 12. However, the energy of the conduction bands decrease at each interface when moving from the second semiconductor 14 to the first semiconductor 12 and the energy of the valence bands increase at each interface when moving from the first semiconductor 12 to the second semiconductor 14. The decrease in the energy of the valence band and the conduction band for the third semiconductor 16 can be caused by joining together two different semiconductor materials, which are joined precisely to achieve this effect. This decrease may be advantageous because the decrease in potential energy can be converted into kinetic energy of the change carrier when it crosses the heterojunction, and may acquire enough energy to subsequently induce a phonon-assisted impurity-scattering event that leads to charge carrier multiplication (i.e., current gain at low voltage).

Figure 6C:
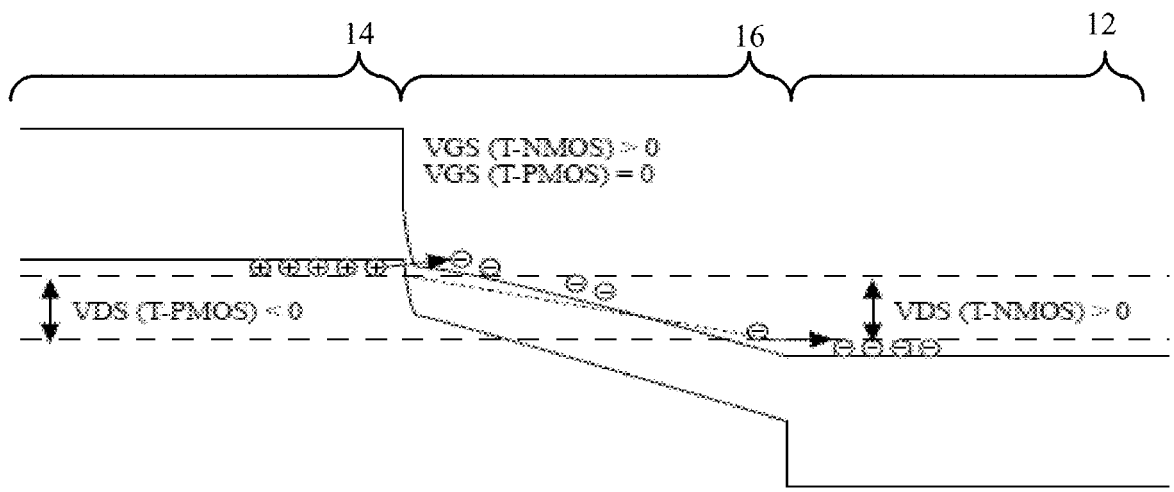
FIG. 6C through FIG. 6F show qualitative band alignments for the tunnel transistor of FIG. 6A through FIG. 6B during operation of the transistor.
Figure 6D:
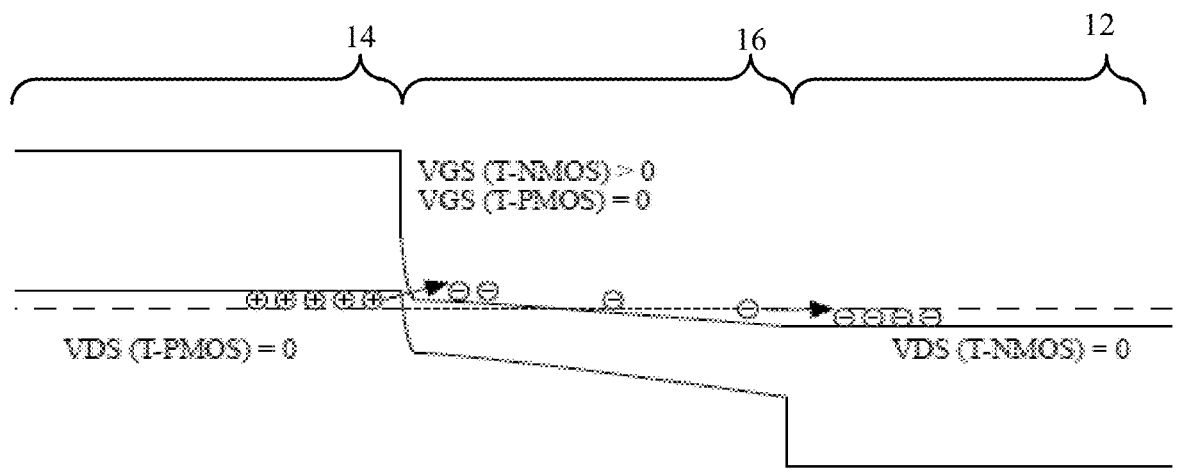
Figure 6E:
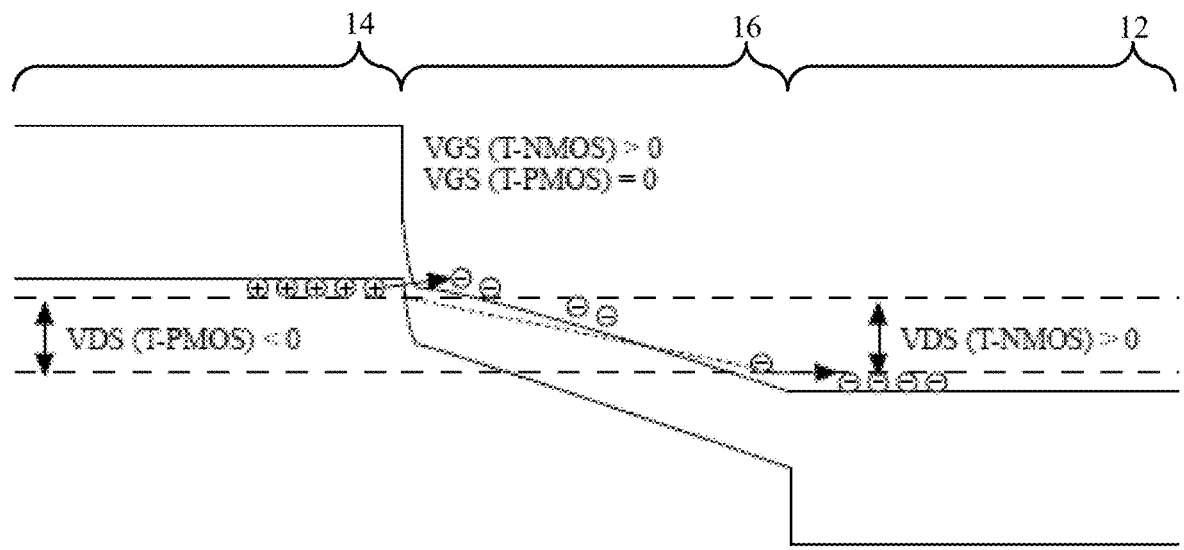
Figure 6F:
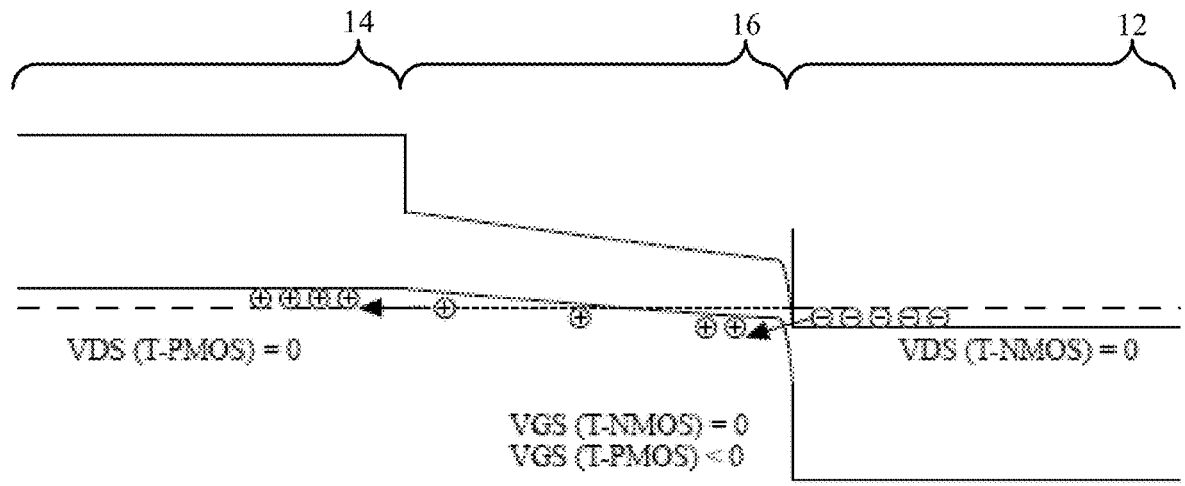

FIG. 6C through FIG. 6F show qualitative band alignments for the tunnel transistor of FIG. 6A and FIG. 6B during operation of the transistor. For instance, FIG. 6C shows the band alignments for the bias conditions at which VDS (voltage of drain minus voltage of source) is >0 and VGS (voltage of gate minus voltage of source) is >0 for a T-NMOS, or VDS<0 and VGS=0 for T-PMOS. The band diagram of FIG. 6D shows the band alignments for the bias conditions at which VDS=0 and VGS>0 for T-NMOS or VDS=0 and VGS=0 for a T-PMOS. The band diagram of FIG. 6E shows the band alignments for the bias conditions at which VDS>0 and VGS>0 for T-NMOS or VDS<0 and VGS=0 for a T-PMOS. The band diagram of FIG. 6F shows the band alignments for the bias conditions at which VDS=0 and VGS=0 for T-NMOS or VDS=0 and VGS<0 for a T-PMOS.

Figure 7A:
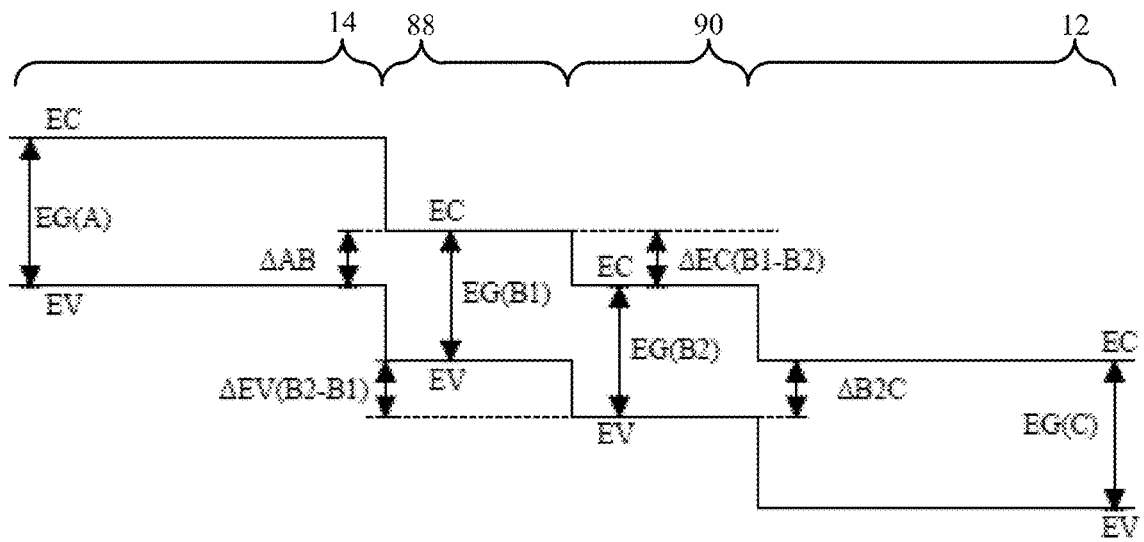
FIG. 7A is an example band energy diagram for an example of a Tunnel MOSFET according to FIG. 5A when the electronics are not applying electrical energy to the transistor.
Figure 7B:
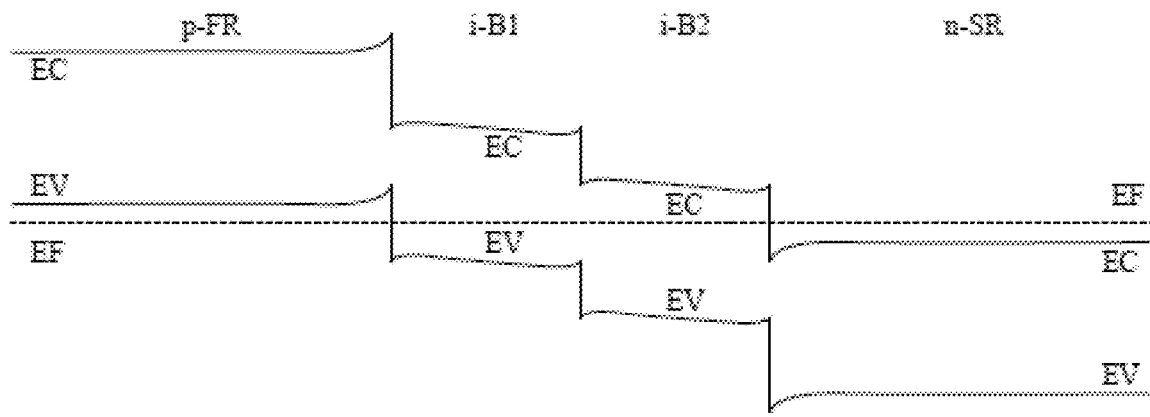
FIG. 7B is a more realistic version of the valence and conduction bands shown FIG. 7A where the effects of the material interfaces and Fermi levels are evident.

In some instances, the third semiconductor 16 in the transistor of FIG. 5A includes more than one layer of material. For instance, the material and doping can also be selected to provide a band diagram according to FIG. 7A and FIG. 7B. FIG. 7A represents the band diagram when the electronics are not applying electrical energy to the transistor. FIG. 7B is a more realistic version of the valence and conduction bands shown FIG. 7A where the effects of the material interfaces and Fermi levels are evident. The third semiconductor 16 includes a first portion and a second portion. The first portion is between the second portion and the second semiconductor 14 and the second portion is between the first portion and the first semiconductor 12.

The first portion can be constructed of a different material than the second portion. As is evident from FIG. 7A and FIG. 7B, the materials and doping is selected such that energy of the conduction bands decrease at each interface when moving from the second semiconductor 14 to the first semiconductor 12 and the energy of the valence bands increase at each interface when moving from the first semiconductor 12 to the second semiconductor 14. Constructing the third semiconductor 16 from multiple different layers can be advantageous because having multiple heterojunctions, with suitable band alignments, on the path from source to drain, offers possibilities to provide extra kinetic energy to the charge carriers without having to apply large voltages. Increasing the kinetic energy of the charge carriers increases the likelihood of achieving the scattering process that produces the cyclic excitation process (CEP).

Figure 7C:
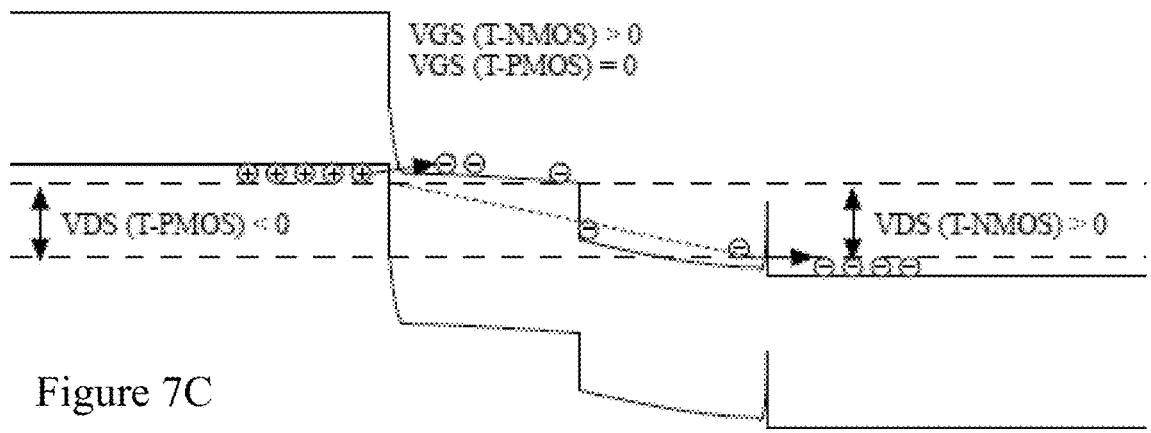
FIG. 7C through FIG. 7F show qualitative band alignments for the tunnel transistor of FIG. 7A through FIG. 7B during operation of the transistor.
Figure 7D:
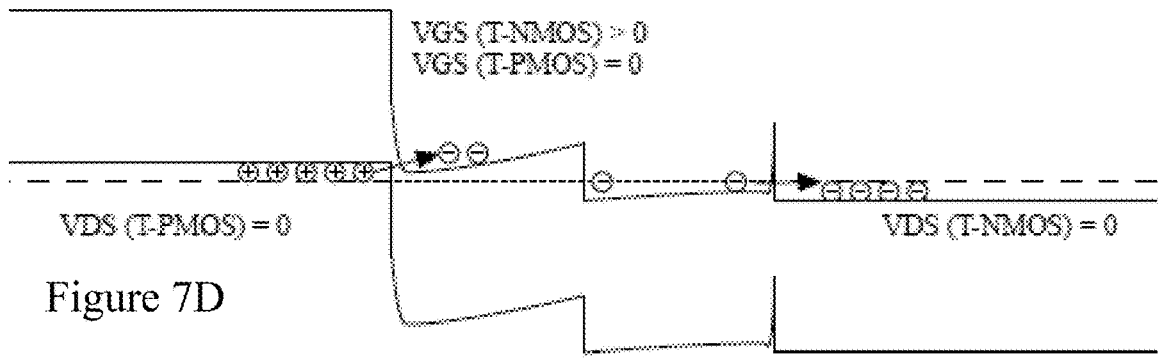
Figure 7E:
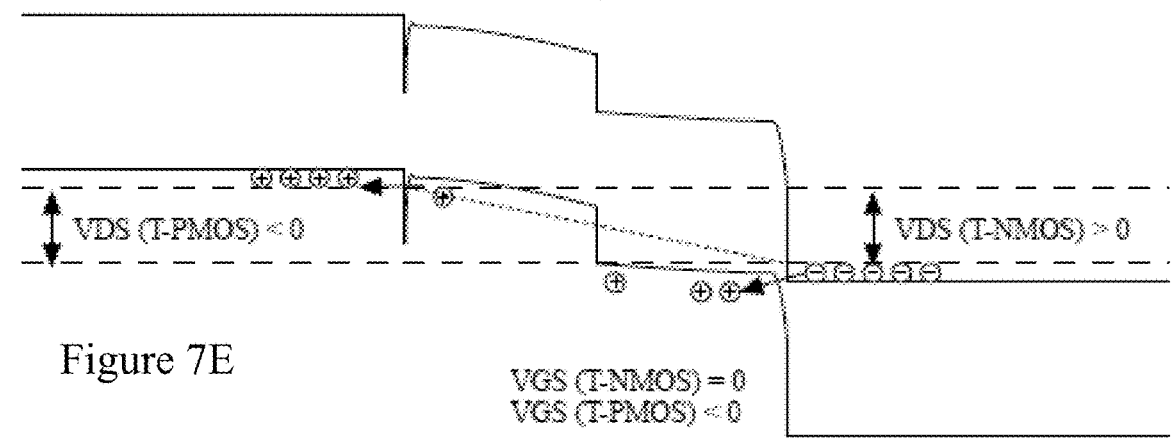
Figure 7F:
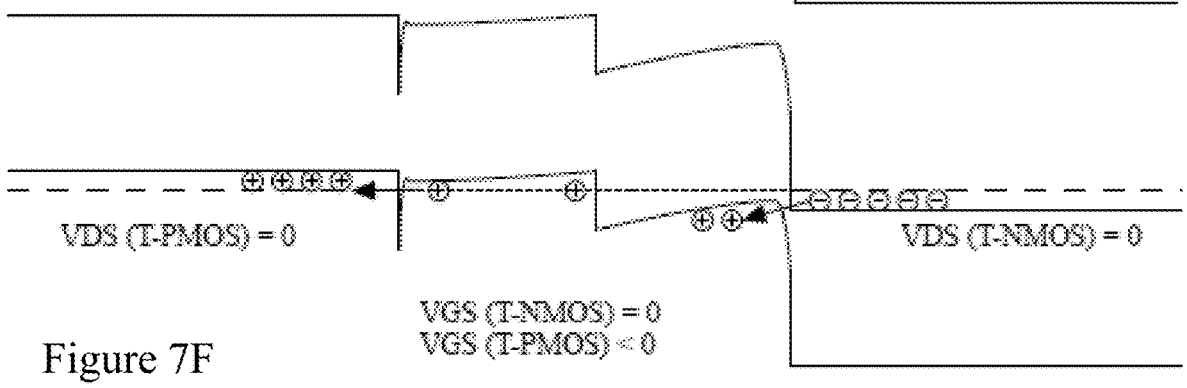

FIG. 7C through FIG. 7F show qualitative band alignments for the tunnel transistor of FIG. 7A and FIG. 7B during operation of the transistor. For instance, FIG. 7C shows the band alignments for the bias conditions at which VDS (voltage of drain minus voltage of source) is >0 and VGS (voltage of gate minus voltage of source) is >0 for a T-NMOS, or VDS<0 and VGS=0 for T-PMOS. The band diagram of FIG. 7D shows the band alignments for the bias conditions at which VDS=0 and VGS>0 for T-NMOS or VDS=0 and VGS=0 for a T-PMOS. The band diagram of FIG. 7E shows the band alignments for the bias conditions at which VDS>0 and VGS=0 for T-NMOS or VDS<0 and VGS<0 for a T-PMOS. The band diagram of FIG. 7F shows the band alignments for the bias conditions at which VDS=0 and VGS=0 for T-NMOS or VDS=0 and VGS<0 for a T-PMOS.

Figure 8A:
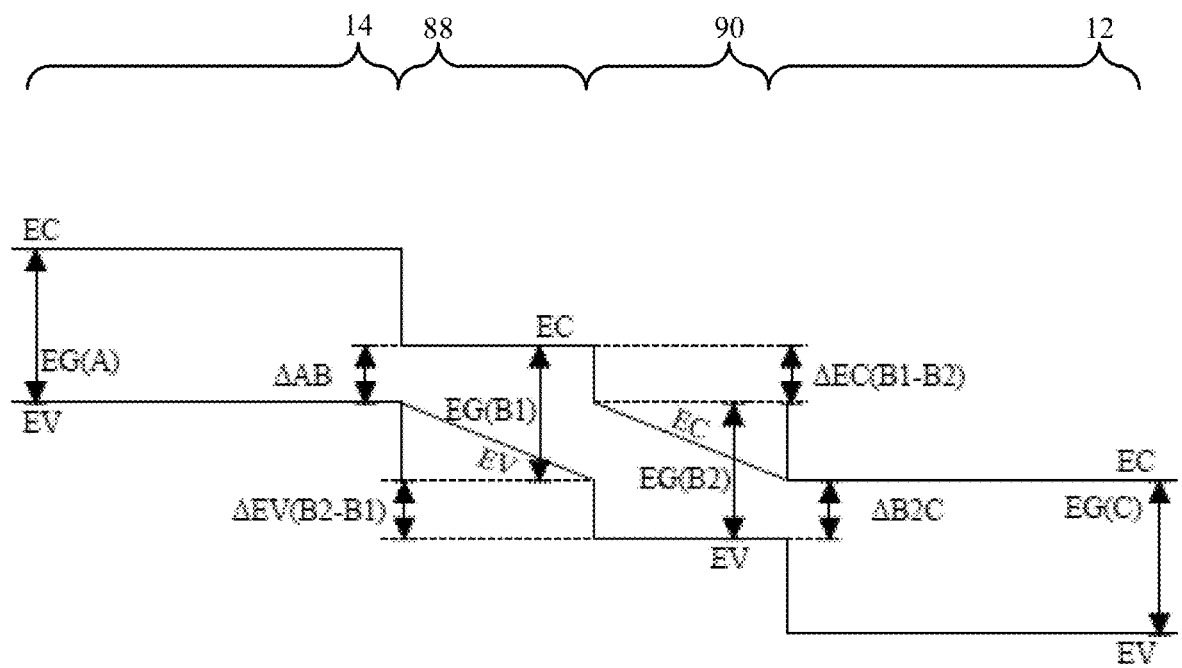
FIG. 8A is an example band energy diagram for an example of a Tunnel MOSFET according to FIG. 5A when the electronics are not applying electrical energy to the transistor.
Figure 8B:
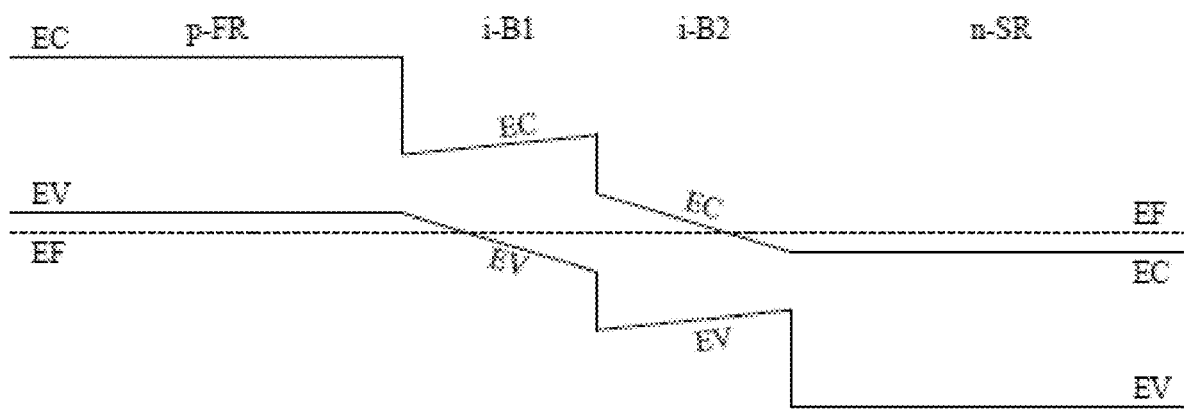
FIG. 8B is a more realistic version of the valence and conduction bands shown FIG. 8A where the effects of the material interfaces and Fermi levels are evident.

The first portion and/or the second portion can be constructed such that the valence band and/or the conduction band have a changing energy level. For instance, the material and doping can also be selected to provide a band diagram according to FIG. 8A and FIG. 8B. FIG. 8A represents the band diagram when the electronics are not applying electrical energy to the transistor. FIG. 8B is a more realistic version of the valence and conduction bands shown FIG. 8A where the effects of the material interfaces and Fermi levels are evident. As is evident from FIG. 8A, the valence band of the first portion decreases continuously between the first semiconductor 12 and the second semiconductor 14. The conduction band of the second portion decreases continuously between the first semiconductor 12 and the second semiconductor 14. The energy of the conduction bands decrease or remains constant at each interface when moving from the second semiconductor 14 to the first semiconductor 12 and the energy of the valence bands increases or remains constant at each interface when moving from the first semiconductor 12 to the second semiconductor 14. The decrease in the energy of the valence band and/or conduction band for the first portion and/or second portion can be caused by judicious selection of multiple materials for the different portions of the device. These decreases may be advantageous because it offers the possibility of providing extra kinetic energy to the charge carriers without having to apply large voltages. Increasing the kinetic energy the charge carriers get increases the likelihood of achieving the scattering process that produces the cyclic excitation process (CEP).

Figure 8C:
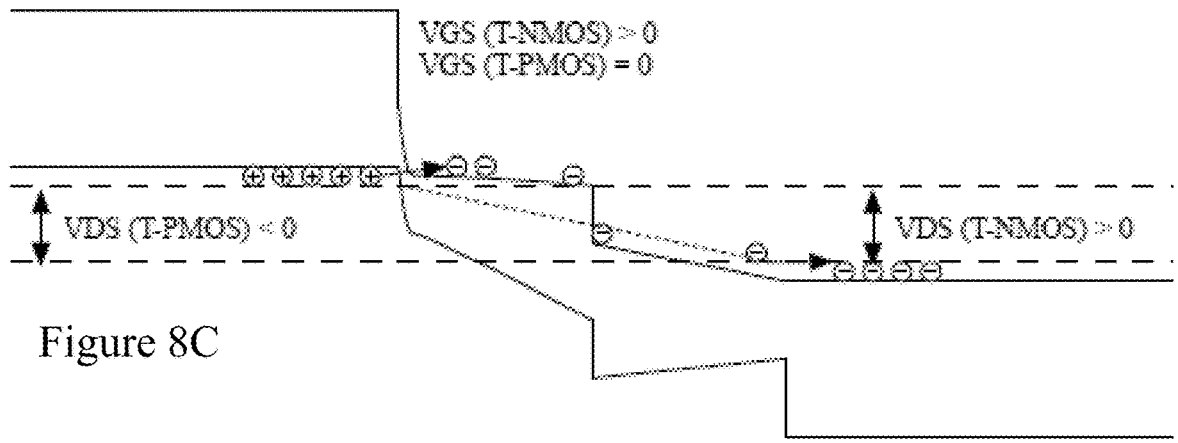
FIG. 8C through FIG. 8F show qualitative band alignments for the tunnel transistor of FIG. 8A through FIG. 8B during operation of the transistor.
Figure 8D:
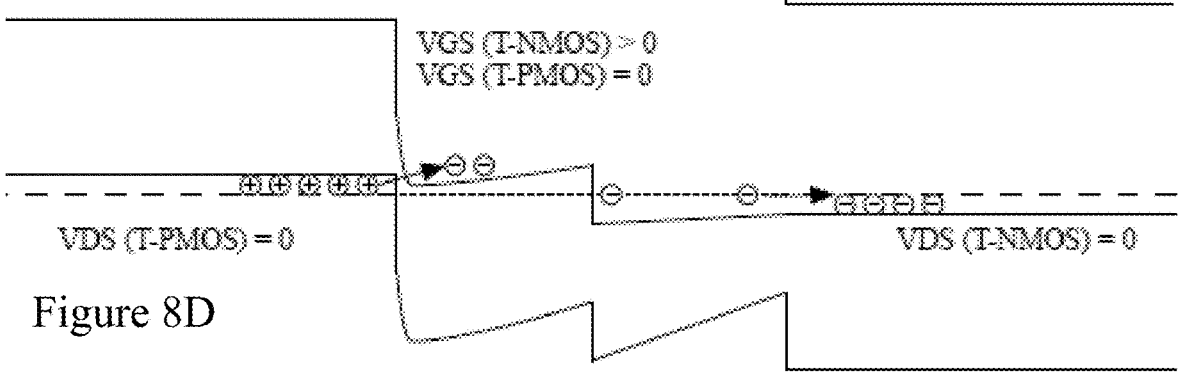
Figure 8E:
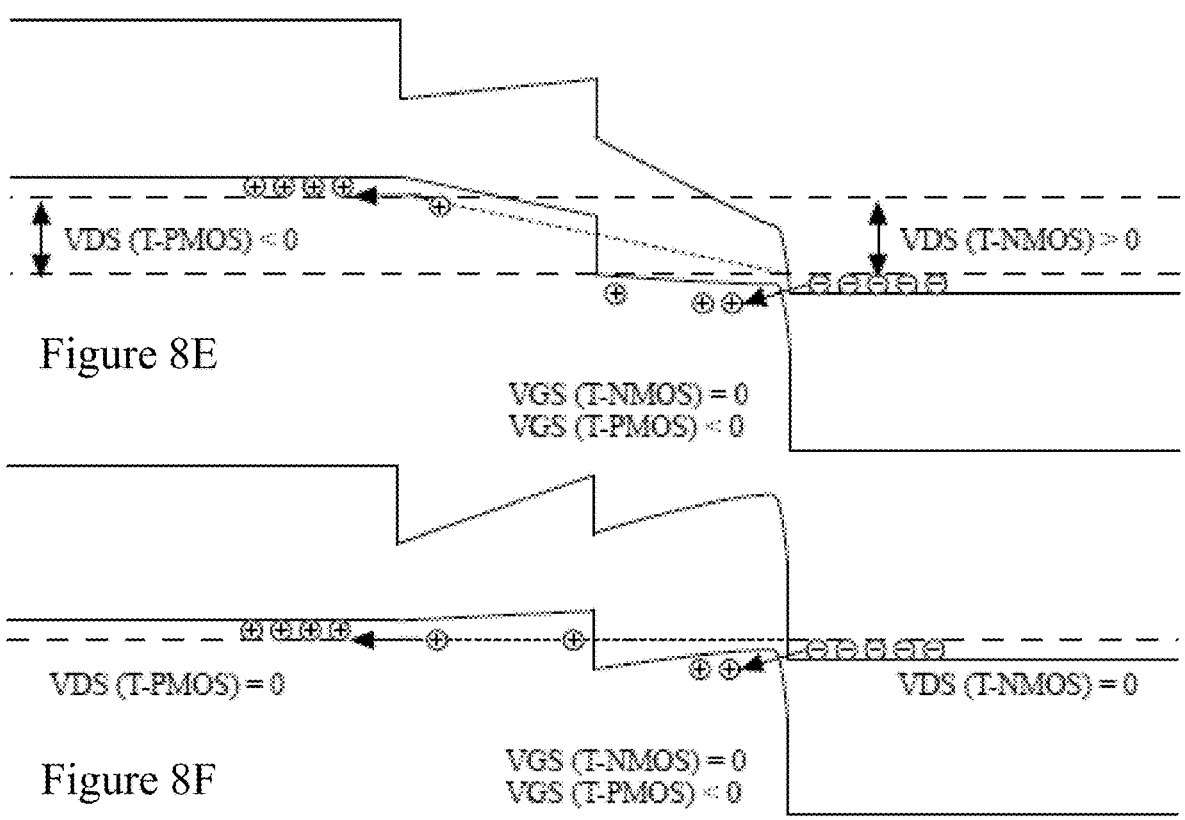
Figure 8F:
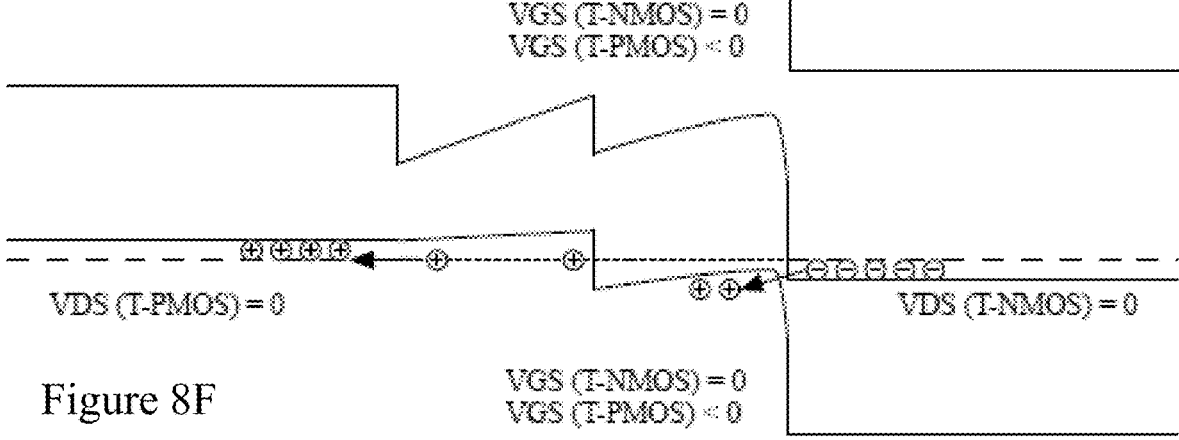

FIG. 8C through FIG. 8F show qualitative band alignments for the tunnel transistor of FIG. 8A and FIG. 8B during operation of the transistor. For instance, FIG. 8C shows the band alignments for the bias conditions at which VDS (voltage of drain minus voltage of source) is >0 and VGS (voltage of gate minus voltage of source) is >0 for a T-NMOS, or VDS<0 and VGS=0 for T-PMOS. The band diagram of FIG. 8D shows the band alignments for the bias conditions at which VDS=0 and VGS>0 for T-NMOS or VDS=0 and VGS=0 for a T-PMOS. The band diagram of FIG. 8E shows the band alignments for the bias conditions at which VDS>0 and VGS=0 for T-NMOS or VDS<0 and VGS<0 for a T-PMOS. The band diagram of FIG. 8F shows the band alignments for the bias conditions at which VDS=0 and VGS=0 for T-NMOS or VDS=0 and VGS<0 for a T-PMOS.

Figure 9A:
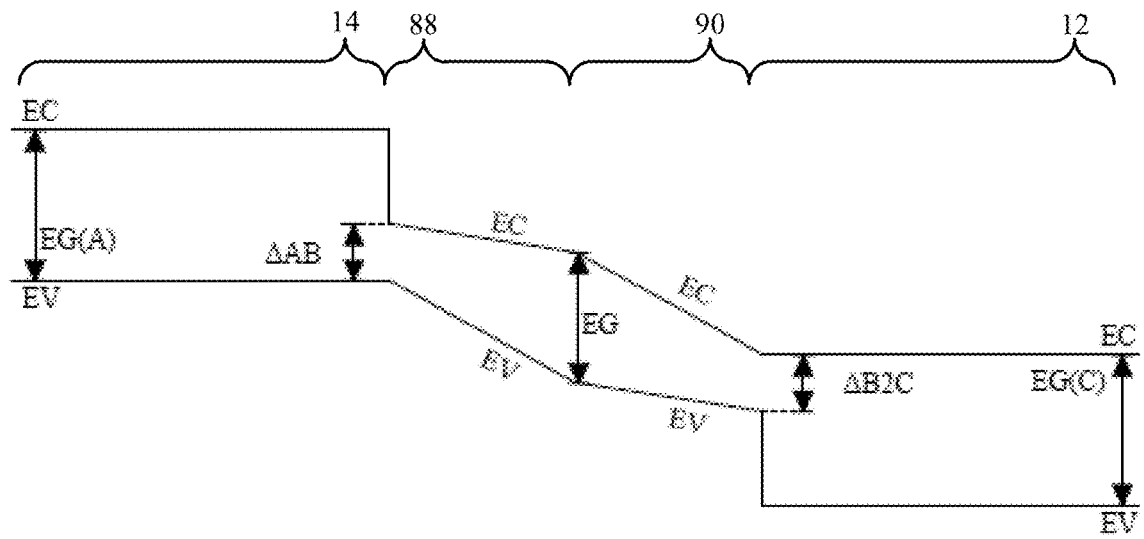
FIG. 9A is another example band energy diagram for an example of a Tunnel MOSFET according to FIG. 5A when the electronics are not applying electrical energy to the transistor.
Figure 9B:
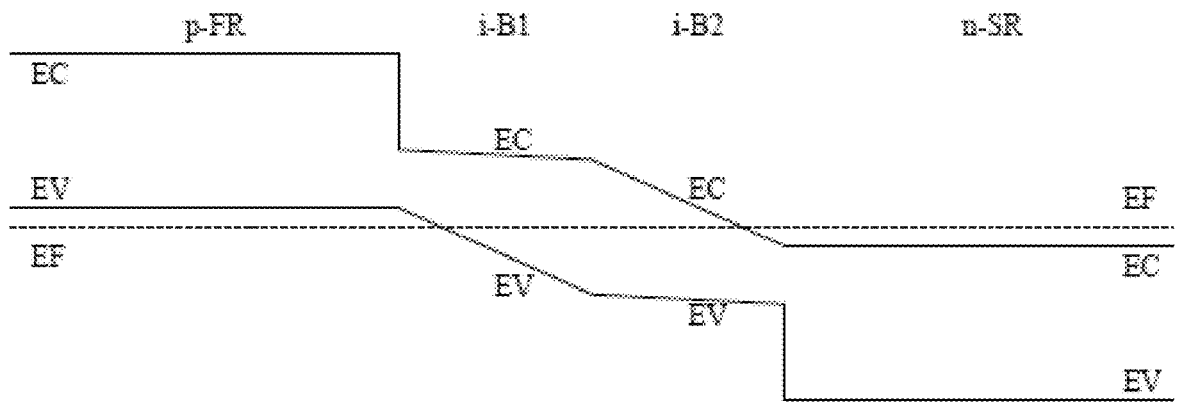
FIG. 9B is a more realistic version of the valence and conduction bands shown FIG. 9A where the effects of the material interfaces and Fermi levels are evident.

Although FIG. 8A illustrates the first portion and the second portion as having a valence band or a conduction band that has a substantially constant energy level, the first portion and the second portion can be constructed such that the valence band and the conduction band have a changing energy level. For instance, the material and doping can also be selected to provide a band diagram according to FIG. 9A and FIG. 9B. FIG. 9A represents the band diagram when the electronics are not applying electrical energy to the transistor. FIG. 9B is a more realistic version of the valence and conduction bands shown FIG. 9A where the effects of the material interfaces and Fermi levels are evident. As is evident from FIG. 9A, the valence band and the conduction band of the first portion decreases continuously between the first semiconductor 12 and the second semiconductor 14. The conduction band and the valence band of the second portion decreases continuously between the first semiconductor 12 and the second semiconductor 14. The energy of the conduction bands decrease or remains constant at each interface when moving from the second semiconductor 14 to the first semiconductor 12 and the energy of the valence bands increases or remains constant at each interface when moving from the first semiconductor 12 to the second semiconductor 14. The decrease in the energy of the valence band and conduction band for the first portion and/or second portion can be caused by modulating the composition, hence the band-gap, of the channel material, such that the valence band edge of the channel material 88 matches (i.e., no barrier for holes) or substantially matches the valence band edge of semiconductor material 14, and the conduction band edge of the channel material 90, matches (i.e., no barrier for electrons) or substantially matches the conduction band edge of semiconductor material 12. The modulation of the composition, and hence band-gap of material 88 and 90, insures that the relevant change carriers do not see potential barriers that could cause a decrease in drive current.

Figure 9C:
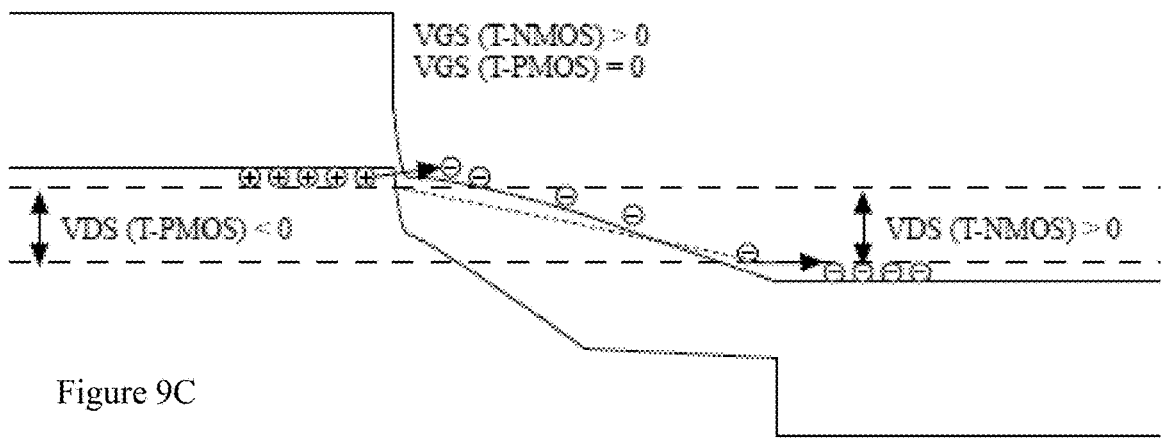
FIG. 9C through FIG. 9F show qualitative band alignments for the tunnel transistor of FIG. 9A through FIG. 9B during operation of the transistor.
Figure 9D:
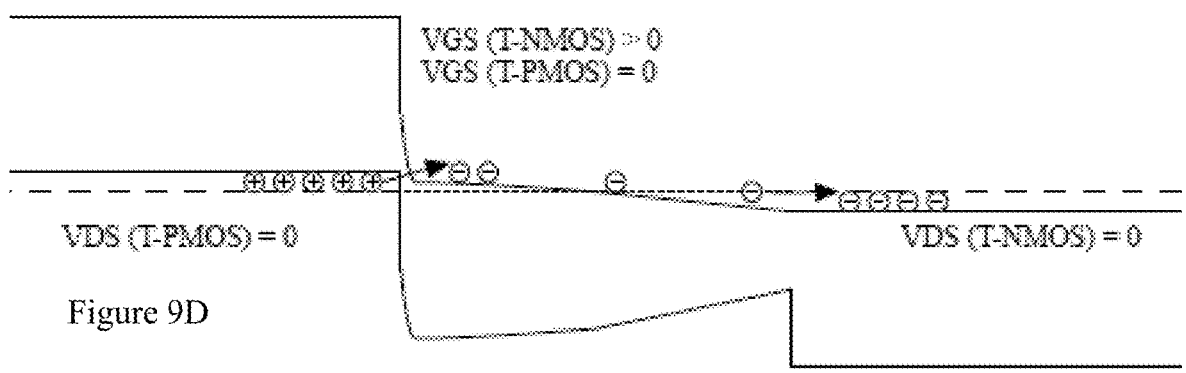
Figure 9E:
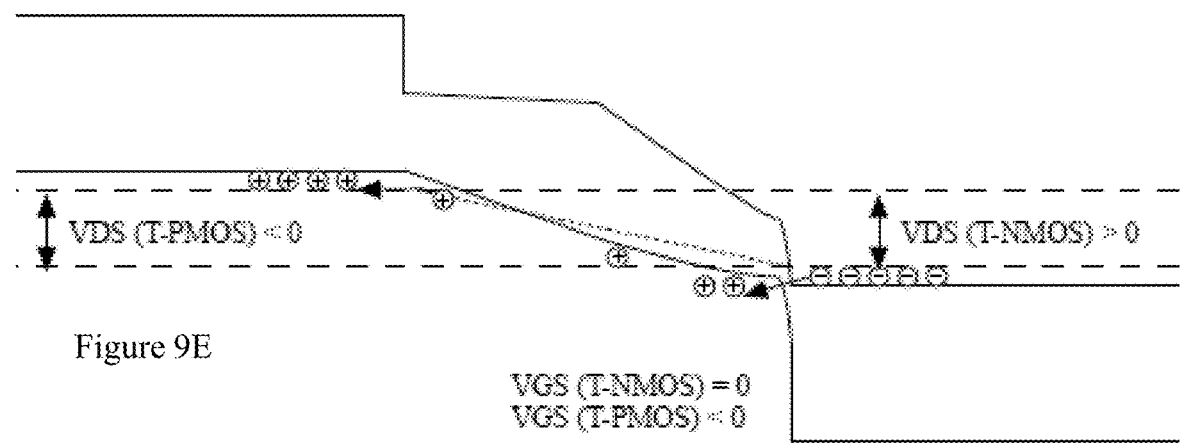
Figure 9F:
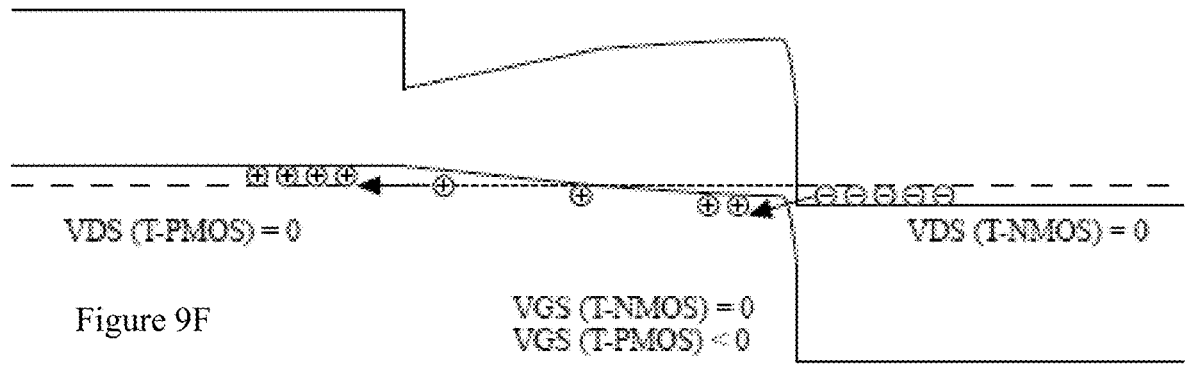

FIG. 9C through FIG. 9F show qualitative band alignments for the tunnel transistor of FIG. 9A and FIG. 9B during operation of the transistor. For instance, FIG. 9C shows the band alignments for the bias conditions at which VDS (voltage of drain minus voltage of source) is >0 and VGS (voltage of gate minus voltage of source) is >0 for a T-NMOS, or VDS<0 and VGS=0 for T-PMOS. The band diagram of FIG. 9D shows the band alignments for the bias conditions at which VDS=0 and VGS>0 for T-NMOS or VDS=0 and VGS=0 for a T-PMOS. The band diagram of FIG. 9E shows the band alignments for the bias conditions at which VDS>0 and VGS=0 for T-NMOS or VDS<0 and VGS<0 for a T-PMOS. The band diagram of FIG. 9F shows the band alignments for the bias conditions at which VDS=0 and VGS=0 for T-NMOS or VDS=0 and VGS<0 for a T-PMOS.

Figure 10A:
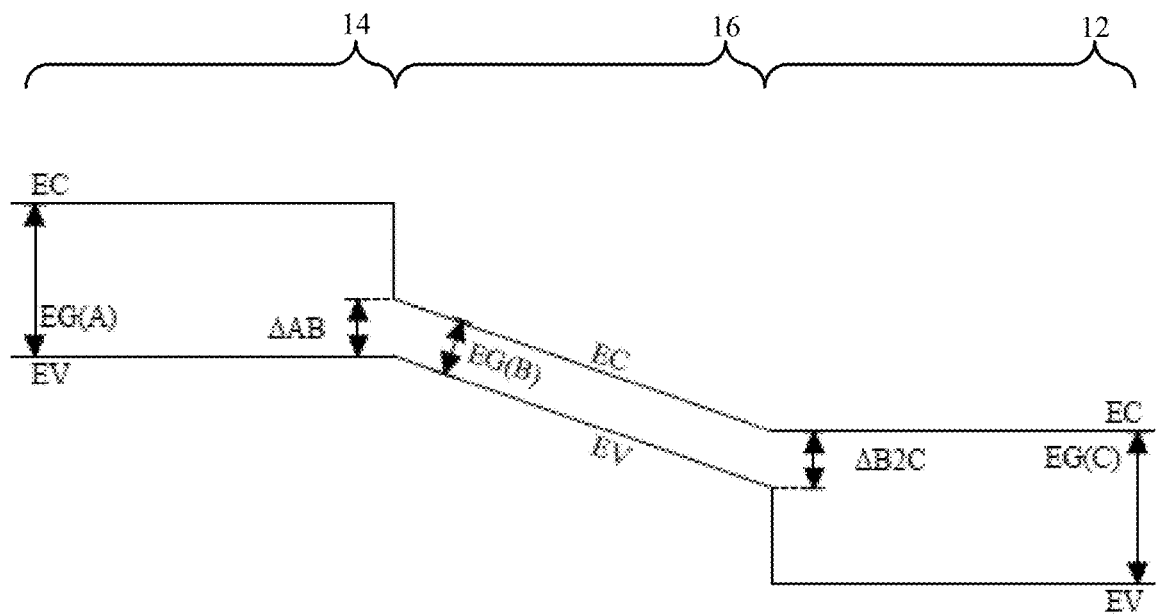
FIG. 10A is another example band energy diagram for an example of a Tunnel MOSFET according to FIG. 5A when the electronics are not applying electrical energy to the transistor.
Figure 10B:
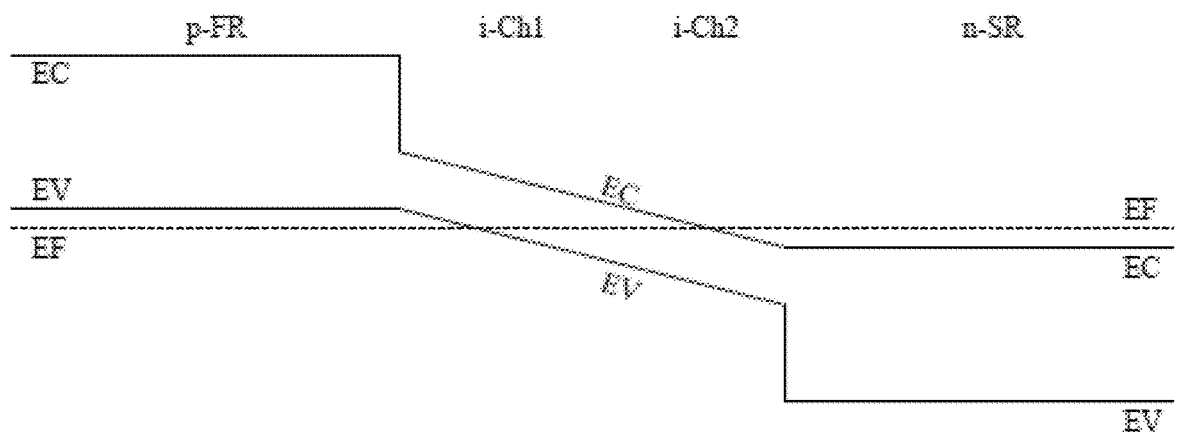
FIG. 10B is a more realistic version of the valence and conduction bands shown FIG. 10A where the effects of the material interfaces and Fermi levels are evident.

As noted above, the energy of the conduction bands can remain constant at each interface when moving from the second semiconductor 14 to the first semiconductor 12 and the energy of the valence bands can remain constant at each interface when moving from the first semiconductor 12 to the second semiconductor 14. For instance, the material and doping can also be selected to provide a band diagram according to FIG. 10A and FIG. 10B. FIG. 10A represents the band diagram when the electronics are not applying electrical energy to the transistor. FIG. 10B is a more realistic version of the valence and conduction bands shown FIG. 10A where the effects of the material interfaces and Fermi levels are evident. FIG. 10A is similar to FIG. 6A in that the energy level of the valence band and conduction band of the third semiconductor 16 decreases when moving from the second semiconductor 14 to the first semiconductor 12; however, the energy of the valence band remains substantially constant at the interface between the second semiconductor 14 and the third semiconductor 16. Similarly, the energy of the conduction band remains substantially constant at the interface between the third semiconductor 16 and the second semiconductor 14. The matching of the energy level of the valence band and/or conduction band at the interface of two materials can generally be achieved by judicious selection of multiple materials for the different portions of the device. These decreases may be advantageous because it offers the possibility of providing extra kinetic energy to the charge carriers without having to apply large voltages. Increasing the kinetic energy the charge carriers get increases the likelihood of achieving the scattering process that produces the cyclic excitation process (CEP).

Figure 10C:
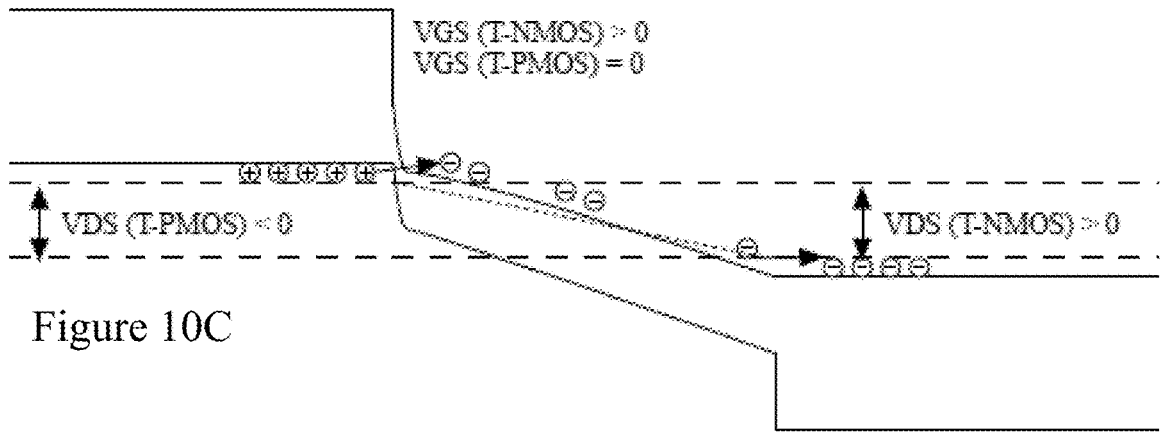
FIG. 10C through FIG. 10F show qualitative band alignments for the tunnel transistor of FIG. 10A through FIG. 10B during operation of the transistor.
Figure 10D:
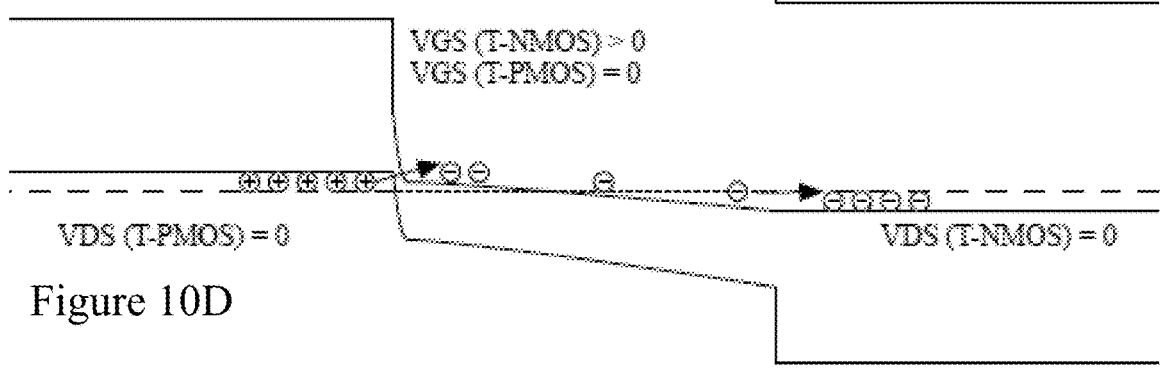
Figure 10E:
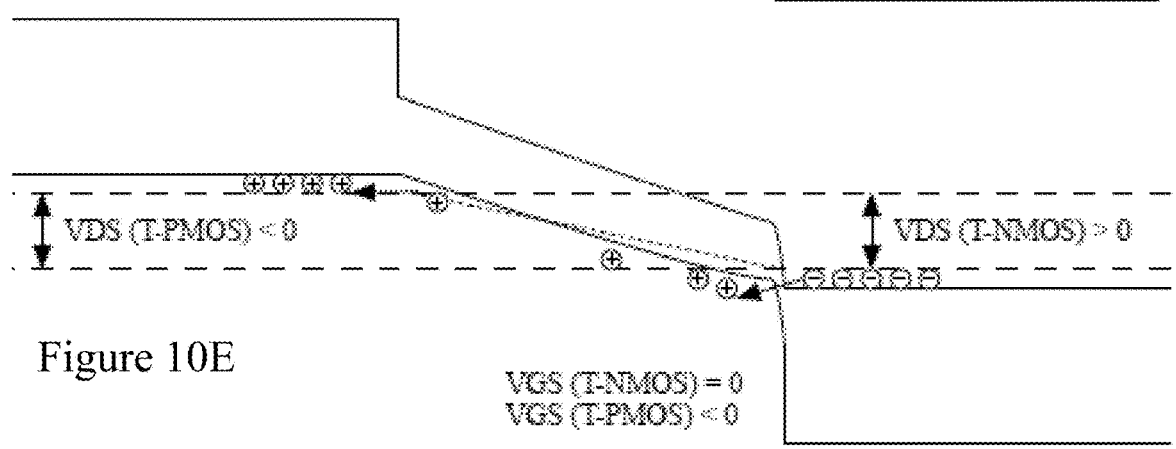
Figure 10F:
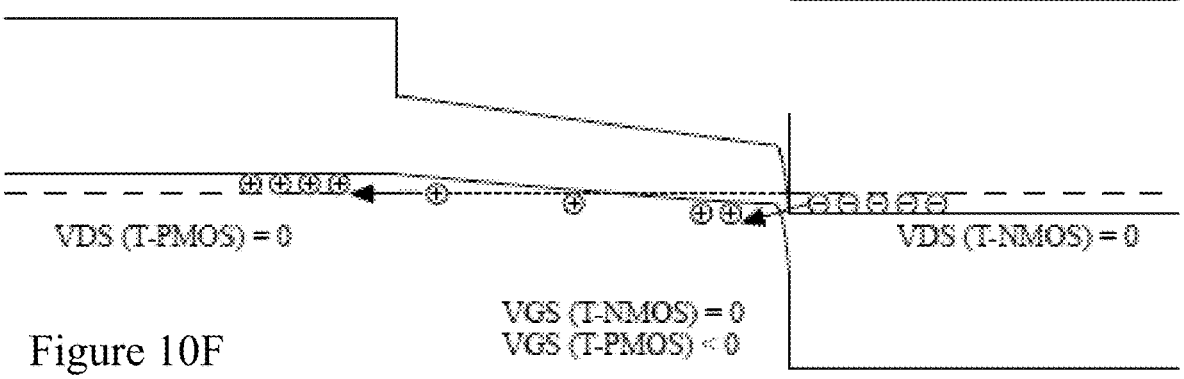

FIG. 10C through FIG. 10F show qualitative band alignments for the tunnel transistor of FIG. 10A and FIG. 10B during operation of the transistor. For instance, FIG. 10C shows the band alignments for the bias conditions at which VDS (voltage of drain minus voltage of source) is >0 and VGS (voltage of gate minus voltage of source) is >0 for a T-NMOS, or VDS<0 and VGS=0 for T-PMOS. The band diagram of FIG. 10D shows the band alignments for the bias conditions at which VDS=0 and VGS>0 for T-NMOS or VDS=0 and VGS=0 for a T-PMOS. The band diagram of FIG. 10E shows the band alignments for the bias conditions at which VDS>0 and VGS=0 for T-NMOS or VDS<0 and VGS<0 for a T-PMOS. The band diagram of FIG. 10F shows the band alignments for the bias conditions at which VDS=0 and VGS=0 for T-NMOS or VDS=0 and VGS<0 for a T-PMOS.

Other transistor types can also include counterdoped junctions. For instance, a heterojunction bipolar transistor (HBT) typically includes two pn junctions that share a common region. One of more of the pn junctions can be a counterdoped heterojunction. In some instances, the junction between the base and the collector of a heterojunction bipolar transistor (HBT) is a counterdoped heterojunction. In some instances, the junction between the base and the collector is a counterdoped heterojunction and the junction between the base and the collector is a counterdoped heterojunction. The one or more counterdoped heterojunctions included in the heterojunction bipolar transistor (HBT) can each be constructed according to any one of the counterdoped heterojunctions disclosed in FIG. 1A through FIG. 1C.

Figure 11A:
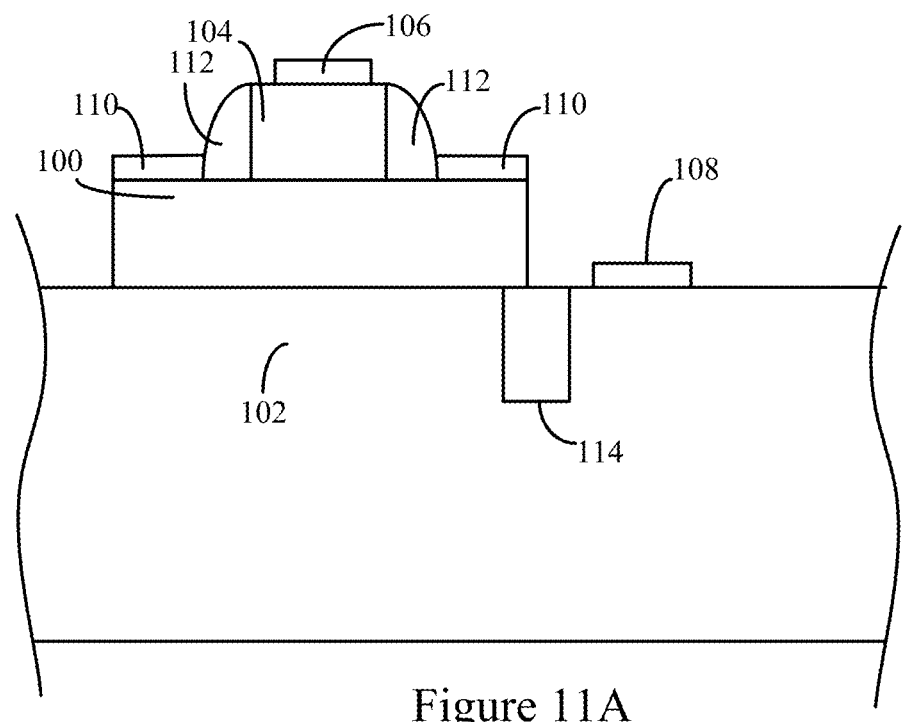
FIG. 11A is a cross section of a portion of a device that includes a heterojunction bipolar transistor (HBT). The heterojunction bipolar transistor (HBT) includes a base positioned between a collector and an emitter such that charges flow between the collector and the emitter through the base.

FIG. 11A is a cross section of a portion of a device that includes a heterojunction bipolar transistor (HBT). The heterojunction bipolar transistor (HBT) includes a base 100 positioned between a collector 102 and an emitter 104 such that charges flow between the collector 102 and the emitter 104 through the base 100. The base 100 is in direct physical contact with both the collector 102 and the emitter 104. An emitter electrical contact 106 is in electrical communication with the emitter 104. A collector electrical contact 108 is in electrical communication with the collector 102. Base electrical contacts 110 are in electrical communication with the base 100. An insulating spacer 112 is located between each of the base electrical contacts 110 and the emitter 104 and can provide electrical insulation between the base electrical contacts 110 and the emitter 104. The emitter electrical contact 106, collector electrical contact 108, and base electrical contacts 110 can be used to apply electrical energy to the transistor during operation of the transistor. A shallow trench isolation structure 114 can extend into the collector 102.

Suitable materials for the spacer 112 include, but are not limited to dielectric materials such as silicon oxide. Suitable materials for the shallow trench isolation structure 114 include, but are not limited to, dielectric materials such as silicon oxide. Suitable materials for the collector 102 include, but are not limited to, silicon, SiGe and/or SiGeC alloys, Si—Ge—C superlattices. Suitable materials for the emitter 104 include, but are not limited to, SiGe and/or SiGeC alloys, Si—Ge—C superlattices, mono-crystalline silicon, which can be epitaxially grown in the same growth sequence that forms the base 100, and poly-crystalline silicon, typically deposited after the formation of a monolayer thick silicon-oxide on top of the base 100. Suitable materials for the base 100 include, but are not limited to, SiGe and/or SiGeC alloys, Si—Ge—C superlattices.

When the transistor of FIG. 11A is a NPN heterojunction bipolar transistor (HBT), the emitter 104 can be doped so as to be an n-type emitter, the base 100 can be doped so as to be a p-type base, and the collector 102 can be doped so as to be an n-type collector. In these instances, the first semiconductor 12 of any one FIG. 1A through FIG. 1C can serve as the collector 102, the second semiconductor 14 of any one of FIG. 1A through FIG. 1C can serve as the base 100. When the transistor of FIG. 11A is a PNP heterojunction bipolar transistor (HBT), the emitter 104 can be can be doped so as to be a p-type emitter, the base 100 can be doped so as to be an n-type base, and the collector 102 can be can be doped so as to be a p-type collector 102. In these instances, the base 100 can serve as the first semiconductor 12 of FIG. 1A through FIG. 1C and the collector 102 can serve as the second semiconductor 14 of any one of FIG. 1A through FIG. 1C. In each of these examples, the pn junction between the base 100 and the emitter 104 can optionally be one of the counterdoped heterojunctions disclosed above. For instance, when the first semiconductor 12 serves as the base 100, a second semiconductor 14 from one of the counterdoped junctions disclosed above can serve as the emitter. When the second semiconductor 14 serves as the base 100, a first semiconductor 12 from one of the counterdoped junctions disclosed above can serve as the emitter. Alternately, a fourth semiconductor that is not included in one of the counterdoped junctions disclosed above can serve as the emitter. The materials can optionally be combined so the HBT is a Double Heterojunction Bipolar Transistor (DHBT) or a single Heterojunction Bipolar Transistor (DHBT).

Figure 11B:
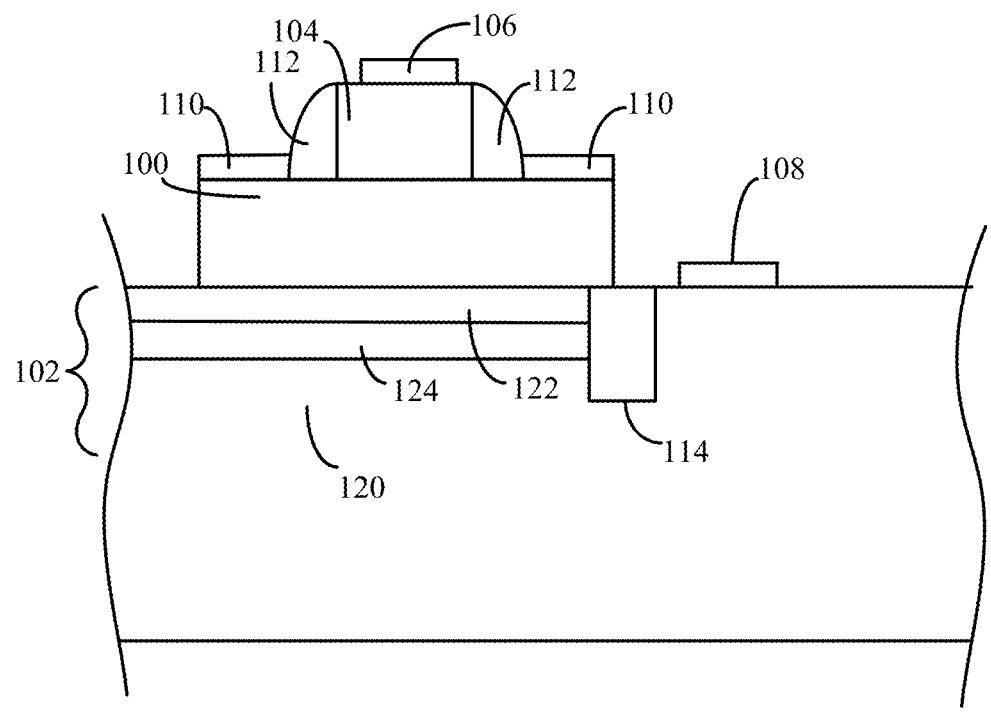
FIG. 11B is a cross section of portion of a device that includes the heterojunction bipolar transistor of FIG. 11A modified such that the collector 102 includes multiple sublayers.

As noted above, the first semiconductor 12 and/or the second semiconductor 14 in a counterdoped junction can include or consist of multiple sub-layers that are each a semiconductor. FIG. 11B illustrates a portion of a device that includes the heterojunction bipolar transistor of FIG. 11A modified such that the collector 102 includes multiple sub-layers. For instance, the device includes a substrate 120. A portion of the substrate 120 includes a first region 122 and a second region 124. At least a portion of the first region 122 is located between the base 100 and the second region 124. The first region 122 can be in direct physical contact with the base 100. The first region 122, second region 124, and at least a portion of the substrate 120 are doped with the same polarity. The first region 122, second region 124, and at least a portion of the substrate 120 act as the collector 102. When the collector 102 is counterdoped, at least one component selected from the group consisting of the first region 122, the second region 124, and the substrate 120 can be counterdoped. In some instances, the second region 124 is counterdoped. The concentration of dopant in the components that are not counterdoped and the concentration of primary dopant in any counterdoped components can each be greater than $5\text{E}18 \text{ cm}^{-3}$, $1\text{E}19 \text{ cm}^{-3}$, or $5\text{E}19 \text{ cm}^{-3}$ and/or less than $1\text{E}21 \text{ cm}^{-3}$, $5\text{E}20 \text{ cm}^{-3}$, or $1\text{E}20 \text{ cm}^{-3}$.

Figure 11C:
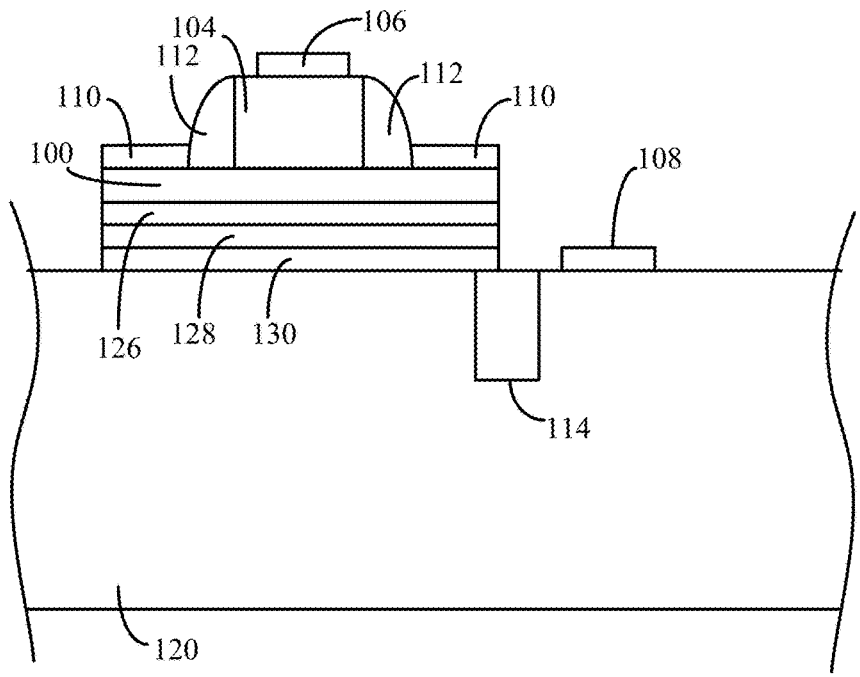
FIG. 11C is another cross section a portion of a device that includes the heterojunction bipolar transistor of FIG. 11A modified such that the collector 102 includes multiple sublayers.

In FIG. 11B the different layers of the collector 102 are different regions of the same substrate 120. When the substrate 120 includes a single semiconductor, the different sub-layers of the collect can include the same semiconductor; however, different layers of the first semiconductor 12, second semiconductor 14, and/or third semiconductor 16 can include different semiconductors. For instance, FIG. 11C illustrates a portion of a device that includes the heterojunction bipolar transistor of FIG. 11A modified such that the collector 102 includes multiple sub-layers. For instance, the device includes a first sub-layer 126, a second sub-layer 128, and a third sub-layer 130 on a substrate 120. At least a portion of the substrate 120 serves as one of the sub-layers of the collector 102. The second sub-layer 128 is located between the first sub-layer 126 and the third sub-layer 130. At least a portion of the first sub-layer 126 is located between the base 100 and the second sub-layer 128 and at least a portion of the third sub-layer 130 is located between the substrate 120 and the second sub-layer 128. The first sub-layer 126 can be in direct physical contact with the base 100 and the third sub-layer 130 can be in direct physical contact with the base 100. The first sub-layer 126, second sub-layer 128, third sub-layer 130, and substrate 120 are doped with the same polarity. The first sub-layer 126, second sub-layer 128, third sub-layer 130, and substrate 120 together act as the collector 102. When the collector 102 is counterdoped, at least one component selected from the group consisting of the first sub-layer 126, second sub-layer 128, third sub-layer 130, and substrate 120 can be counterdoped. In some instances, the second sub-layer 128 is counterdoped. The concentration of dopant in the components that are not counterdoped and the concentration of primary dopant in any counterdoped components can each be greater than $5E18$ cm$^{-3}$, $1E19$ cm$^{-3}$, or $5E19$ cm$^{-3}$ and/or less than $1E21$ cm$^{-3}$, $5E20$ cm$^{-3}$, or $1E20$ cm$^{-3}$.

Although FIG. 11B illustrates the different layers of the collector 102 as different regions of the same substrate 120, the different regions of the substrate 120 can be different sub-layers as illustrated in FIG. 11C. For instance, the device of FIG. 11B can be implemented using a device having the first sub-layer 126 and the second sub-layer 128 illustrated in FIG. 11C and excluding the third sub-layer 130. In such a device, the function of the first region 122 is performed by the first sub-layer 126 and the function of the second region 124 is performed by the second sub-layer 128.

Heterojunction bipolar transistors are often operated by applying a forward bias to the junction between the emitter 104 and the base 100 and a reverse bias to the junction of the base 100 and collector 102. Amplification of the input signal occurs in the junction between the base 100 and collector 102. Using a counterdoped heterojunction for the junction between the base 100 and collector 102 allows the amplification of the collector current.

Figure 11D:
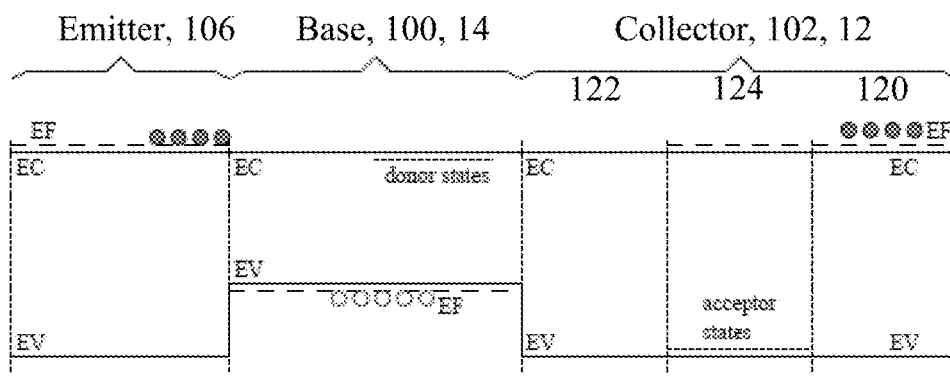
FIG. 11D is an example band energy diagram for an example of an HBT according to FIG. 11A when the electronics are not applying electrical energy to the transistor.
Figure 11E:
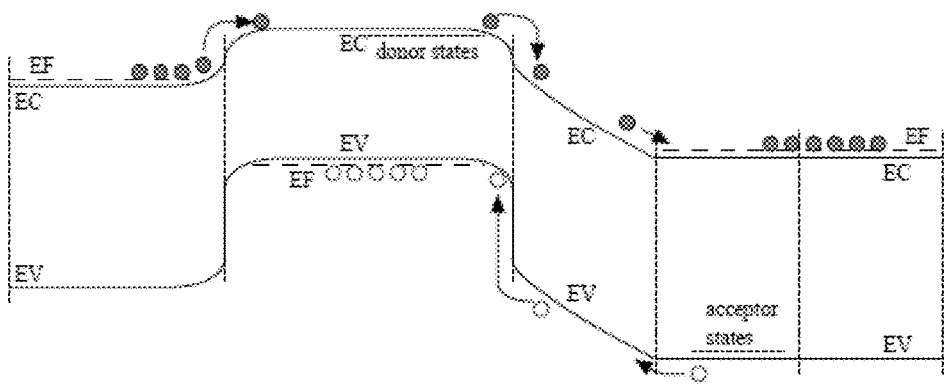
FIG. 11E is a more realistic version of the valence and conduction bands shown FIG. 11D where the effects of the material interfaces and Fermi levels are evident.
Figure 12A:
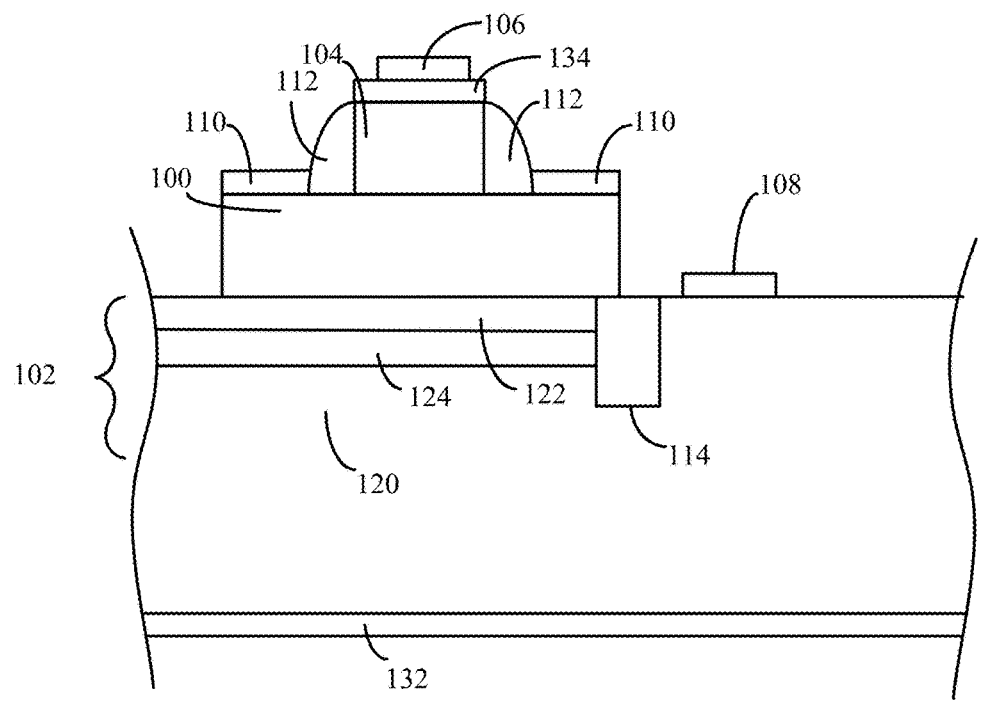
FIG. 12A illustrates the transistor of FIG. 11B modified so as to operate as a laser that can be an HBT-laser or a DHBT laser.

The transistors of FIG. 11A through FIG. 11C can be operated as a light sensor. When the transistor is an NPN HBT and/or light sensor constructed according to FIG. 11A; the base 100 and collector 102 materials and doping can be selected to provide relative conduction and valence bands such as are shown in FIG. 11D and FIG. 11E. FIG. 11E illustrates the band diagram before electronics apply a bias to the HBT and FIG. 12C illustrates the band diagram while electronics operate the HBT so as to generate a light signal. In particular, the band alignments between base and collector can be such that the conduction band edge in the collector is lower (negative $\Delta Ec$) than in the base, and that the valence band edge in the base is higher (positive $\Delta Ev$) than in the collector. As an example, a band diagram according to FIG. 11D can be generated using a collector 102 (first semiconductor 12) which may comprise counterdoped n-type Si and/or counterdoped n-type SiGeC alloy, a base 100 (second semiconductor 14) that is a counterdoped p-type SiGeC alloy, and an emitter 104 which may comprise counterdoped n-type Si and/or counterdoped n-type SiGeC alloy.

When an HBT includes a counterdoped junction between the base 100 and collector 102, the base 100 and collector materials and doping can be selected so as to provide the counterdoped heterojunction with an onset voltage greater than 0.1 V, 0.3V, 0.5V, or 0.8V and/or less than 3V, 2V or 1V.

Examples of the semiconductors used for the base 100, emitter 104, and collector 102 include a homogeneous material, random alloy, or an ordered alloy generated through techniques such as epitaxial growth. However, one or more of the components selected from the group consisting of the base 100, emitter 104, and collector 102 can be a superlattice. In some instances, at least the base 100 of a transistor includes or consists of a superlattice. A suitable superlattice for inclusion in the base 100 of a transistor includes, but is not limited to, an Si—Ge—C superlattice. Additional details regarding suitable superlattices are disclosed below. The superlattices can have lower electron and/or hole masses which can improve the electrical performance of a transistor. Further, the superlattices can be used to achieve valence and/or conduction band offsets at the interfaces between the emitter 104 and base 100 or between base 100 and collector 102 that are not possible to implement with the commonly used SiGe and/or SiGeC random alloys.

The superlattices can have direct band-gaps with large oscillator strengths. As a result, these materials are capable of efficient light absorption and light emission. Consequently, the inclusion of these superlattices in the base 100 allows the illustrated transistor to operate as a light source. For instance, any of the transistors of FIG. 11A through FIG. 11C can include a superlattice with a direct bandgap and can be operated as a light source. Alternately, reflective layers can be added to any of the transistors of FIG. 11A through FIG. 11C to provide a resonant cavity that allows the light source to operate as a laser cavity. For instance, FIG. 12A illustrates the transistor of FIG. 11B modified so as to operate as a laser that can be an HBT-laser or a DHBT laser. The laser includes a base reflector 132 and a second reflector 134. The base reflector 132 and the second reflector 134 can be configured to provide a Fabry-perot (FP) laser cavity. For instance, the base reflector 132 and/or the second reflector 134 is partially transmissive to provide an output from the laser cavity. When the base reflector 132 is partially transmissive the second reflector 134 can be partially transmissive or fully reflective. When the second reflector 134 is partially transmissive the base reflector 132 can be partially transmissive or fully reflective. Suitable materials for the base reflector 132 and the second reflector 134 include, but are not limited to, Si, Ge, random alloys of $Si_{1-x}Ge_x$ where x is greater than or equal to 0 and/or less than or equal to 1, and random alloys of $Si_{1-x-y}Ge_xC_y$ where x is greater than 0 and less than or equal to 1 and y is greater than 0 and less than or equal to 0.25.

The use of the counterdoped junction in the light source amplifies the electrical and optical signals when compared with prior HBT lasers. Additionally, the efficiency of the light output can be increased by increasing the carrier's confinement in the base 100 where re-combination occurs. As a result, the band offsets of the base 100 and the collector 102 can be such that the electrons and holes are confined in the base 100. This confinement can be achieved with a base material that is composed of a direct band-gap Si—Ge—C superlattice whose conduction band edge is lower, and whose valence band edge is higher, than those of the emitter and collector regions (Type-I, or nested, band alignment).

Figure 12B:
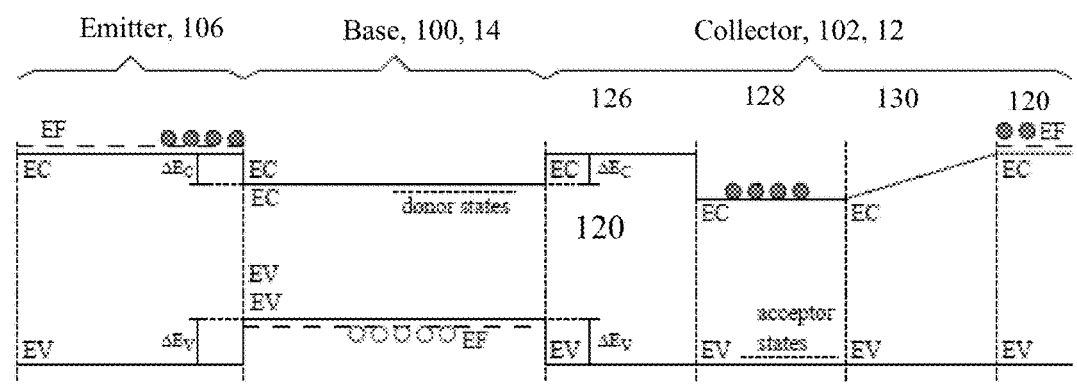
FIG. 12B is an example band energy diagram for an example of a light source according to FIG. 12A when the electronics are not applying electrical energy to the transistor.
Figure 12C:
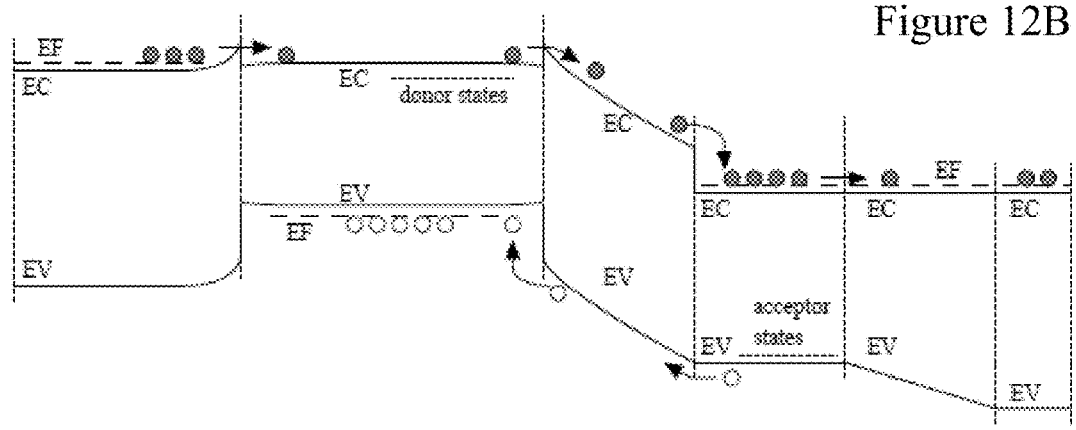
FIG. 12C is a more realistic version of the valence and conduction bands shown FIG. 12B where the effects of the material interfaces and Fermi levels are evident.

When the HBT and/or light source includes a collector 102 with three sub-layers such as is illustrated in FIG. 12A; the base 100, emitter 104, and collector materials and doping can be selected to provide relative conduction and valence bands such as are shown in FIG. 12B and FIG. 12C. FIG. 12B illustrates the band diagram before electronics apply a bias to the HBT and/or light source and FIG. 12C illustrates the band diagram while electronics operate the HBT and/or light source so as to generate a light signal. In these band diagrams, the conduction band edge of base 100 is lower (negative ΔEc) than the conduction band edges of the emitter 104 and collector 102, and the valence band edge of the base 100 is higher (positive ΔEv) the valence band edge of the emitter 104 and collector 102. The base 100 has a zero ΔEc with respect to the emitter 106 and the collector 126, and a positive ΔEv with respect to emitter 106 and collector 126, thereby enabling a smooth flow of electrons, from emitter 106 through the base 100 and into the collector 126. The counterdoped regions inside the base 100 and inside the collector 102, provide current gain through a phonon-assisted scattering of electrons and holes with impurities. Such current gain does not exist in conventional HBTs or phototransistors.

When the HBT and/or light source includes a collector 102 with four sub-layers such as is illustrated in FIG. 11C; the base 100, emitter 104, and collector materials and doping can be selected to provide relative conduction and valence bands such as are shown in FIG. 12D and FIG. 12E. FIG. 12D illustrates the band diagram before electronics apply a bias to the light source and FIG. 12E illustrates the band diagram while electronics operate the light source so as to generate a light signal. In these band diagrams, the base 100 has a negative ΔEc with respect to the emitter 106 and the collector 126, and a positive ΔEv with respect to emitter 106 and collector 126, thereby confining electrons and holes in the base 100 and increasing the probability of photon emission from electron-hole recombination. The counterdoped regions inside the base 100 and inside the collector 126 provide current gain through a phonon-assisted scattering of electrons and holes with impurities. Such current gain does not exist in conventional HBTs or HBT light-sources. As an example, a band diagram according to FIG. 12B and FIG. 12C can be generated using a n-type silicon as the emitter 104, a counterdoped p-type superlattice as the base 100, n-type silicon as the first sub-layer 126, counterdoped n-type SiGeC as the second sub-layer 128, an n-type Si—Ge—C alloy as the third sub-layer 130 and n-type silicon as the substrate 120. An example of a suitable superlattice is a superlattice that includes silicon, germanium, and carbon. As is evident from FIG. 12B, the conduction band of the third sub-layer 130 can have an energy level that increases between the second sub-layer 128 and the substrate 120. This gradient can be generated by varying the composition of the SiGeC alloy. In some instances, the composition of the SiGeC alloy is altered such that near the substrate 120, the composition is almost pure silicon in that the percentages of Ge and C are highest and therefore the band-gap is smallest, near sub-layer 128.

Figure 13A:
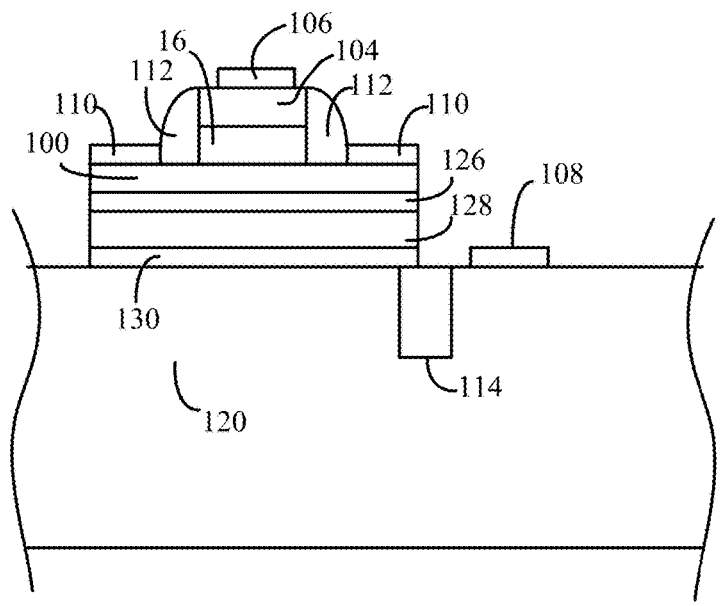
FIG. 13A illustrates a portion of a device having a light sensor that includes the transistor of FIG. 11C modified to include a counterdoped p-i-n junction as the junction between the emitter and the base.

The transistors and light sources of FIG. 11A through FIG. 12C include pn junctions at the junction between the emitter 104 and base 100 and also at the junction between the collector 102 and base 100. However, one or more of these junctions can be a p-i-n junction. For instance, the transistors disclosed in the context of FIG. 11A through FIG. 12C can include a counterdoped p-i-n junction as the junction between the emitter 104 and the base 100. As an example, FIG. 13A illustrates a portion of a device having a light sensor that includes the transistor of FIG. 11C modified to include a counterdoped p-i-n junction as the junction between the emitter 104 and the base 100. A third semiconductor 16 is positioned between the base 100 and the emitter 104. The third semiconductor 16 can be the intrinsic semiconductor of the counterdoped p-i-n junction. When the first semiconductor serves as the base 100, a second semiconductor 14 from one of the counterdoped junctions disclosed above can serve as the emitter. When the second semiconductor serves as the base 100, a first semiconductor 12 from one of the counterdoped junctions disclosed above can serve as the emitter. Alternately, a fourth semiconductor that is not included in one of the counterdoped junctions disclosed above can serve as the emitter.

In some instances, the counterdoped p-i-n junction between the emitter 104 and the base 100 is a heterojunction. When the device includes a counterdoped p-i-n junction between the emitter 104 and the base 100 and a counterdoped pn junction between the base 100 and the collector 102, the a counterdoped p-i-n junction can be configured to have an onset voltage greater than 0.3V, 0.5V, or 0.8V and/or less than 3V, 2V or 1V and the counterdoped pn junction can be configured to have an onset voltage greater than 0.3V, 0.5V, or 0.8V and/or less than 3V, 2V or 1V.

Figure 13B:
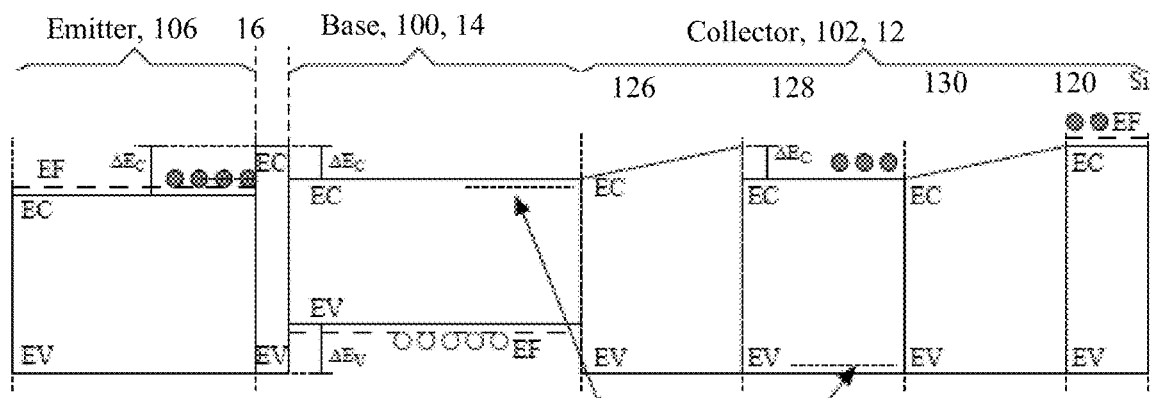
FIG. 13B is another example band energy diagram for an example of a light sensor or transistor according to FIG. 13A when the electronics are not applying electrical energy to the transistor.
Figure 13C:
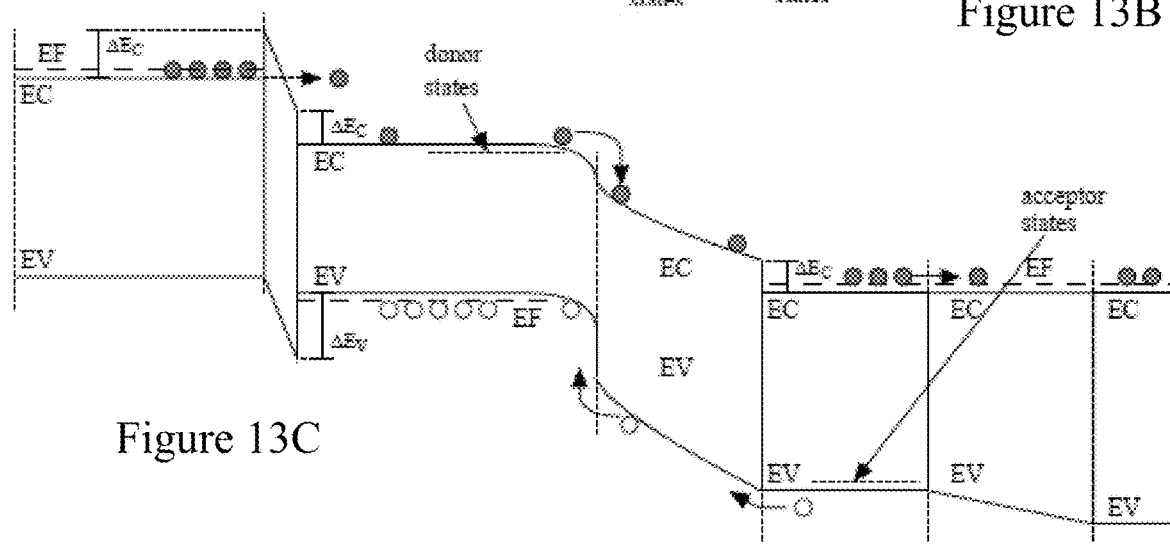
FIG. 13C is a more realistic version of the valence and conduction bands shown FIG. 13B where the effects of the material interfaces and Fermi levels are evident.

When the HBT and/or light sensor is constructed according to FIG. 13A, the base 100, emitter 104, third semiconductor 16 and collector materials and doping can be selected to provide conduction and valence bands such as are shown in FIG. 13B and FIG. 13C. FIG. 13B illustrates the band diagram before electronics apply a bias to the light sensor and FIG. 13C illustrates the band diagram while electronics operate the light sensor so as to generate a photocurrent. As shown in FIG. 13C, the energy of the conduction band for the third semiconductor 16 can exceed the energy of the conduction band for the emitter 104 at the interface of the base 100 and third semiconductor 16. As a result, the third semiconductor 16 can serve as a tunneling barrier between the base 100 and the emitter 104. This tunneling barrier can accelerate injected electrons and improve the speed of travel of the electrons through the base 100 toward the collector and accordingly enhance the performance of the HBT.

Additionally, in FIG. 13B and FIG. 13C, the tunnel barrier 16 has a positive ΔEc with respect to the emitter 106 and the base 100. The tunneling barrier 16 has a negative ΔEv with respect to the base 100, and may have a zero or positive ΔEv with respect to emitter 106. The tunnel injector can accelerate electrons through the base 100 and thus improve performance of HBT. The counterdoped regions inside the base 100 and inside the collector 102 provide current gain through a phonon-assisted scattering of electrons and holes with impurities. Such current gain does not exist in conventional HBTs or photo-transistors. As an example, a band diagram according to FIG. 13C and FIG. 13D can be generated using a n-type silicon as the emitter 104, undoped silicon as the third semiconductor 16, a counterdoped p-type superlattice as the base 100, an n-type Si—Ge—C alloy as the first sub-layer 126, a counterdoped n-type Si—Ge—C alloy as the second sub-layer 128, an n-type Si—Ge—C alloy as the third sub-layer 130 and n-type silicon as the substrate 120. An example of a suitable superlattice is a superlattice that includes silicon, germanium, and carbon. As is evident from FIG. 13D, the conduction band of the first sub-layer 126 can have an energy level that increases between base 100 and the second sub-layer 128. Additionally, the third sub-layer 130 has an energy level that increases between the second sub-layer 128 and the substrate 120. This gradient in the energy level of the first sub-layer 126 and the third sub-layer 130 can be generated by varying the composition of the materials in these layers. For instance, when one or more of these layers is an SiGeC alloy, the composition can be varied such that near the substrate 120, the composition is almost pure silicon (the percentages of Ge and C are highest, and therefore the band-gap is smallest, near sub-layer 128).

The confinement in the base 100 can be further enhanced by providing a barrier between the base 100 and the collector 102 or between the base 100 and a sub-layer of the collector 102 to provide a barrier in the valence and and/or conduction band. For instance, the energy of the conduction band for the collector 102 can exceed the energy of the conduction band for the base 100 at the interface of the base 100 and the collector 102. When this arrangement is achieved in the band diagram of FIG. 13B and FIG. 13C, the device operates as a light source with tunnel injection from emitter to base. As another example, the energy of the conduction band for the first region 122 of FIG. 11B or FIG. 12A or the first sub-layer 126 of FIG. 11C or FIG. 13A can exceed the energy of the conduction band for the base 100 at the interface of the base 100 and the collector 102. In these examples, a layer of the collector 102 serves as a confinement barrier between the base 100 and the collector 102. This confinement barrier can enhance the electron and hole confinement in the base 100 such that there is an increased probability of recombination of electrons with holes in the base, from which photons are emitted.

Figure 13D:
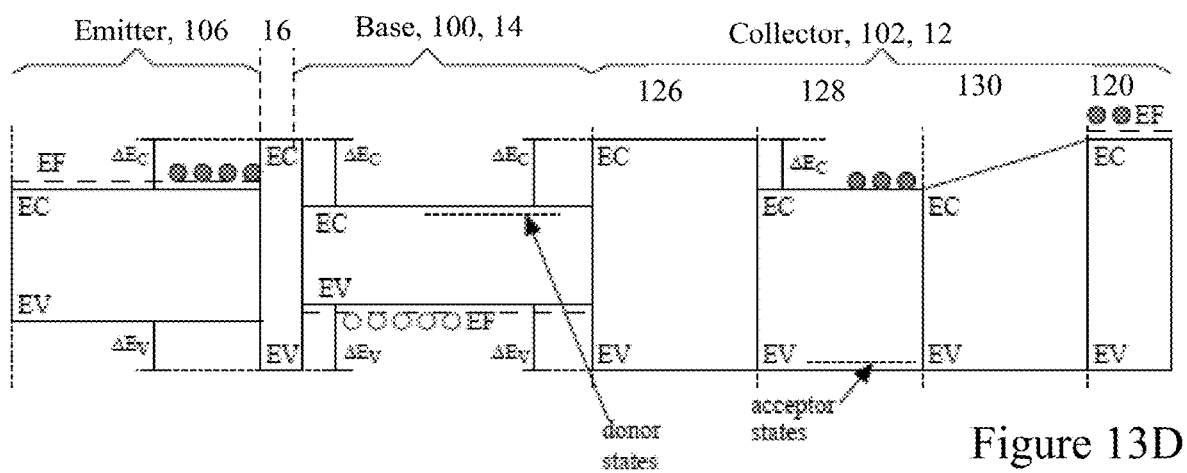
FIG. 13D is another example band energy diagram for a light sensor or transistor according to FIG. 13A when the electronics are not applying electrical energy to the transistor.
Figure 13E:
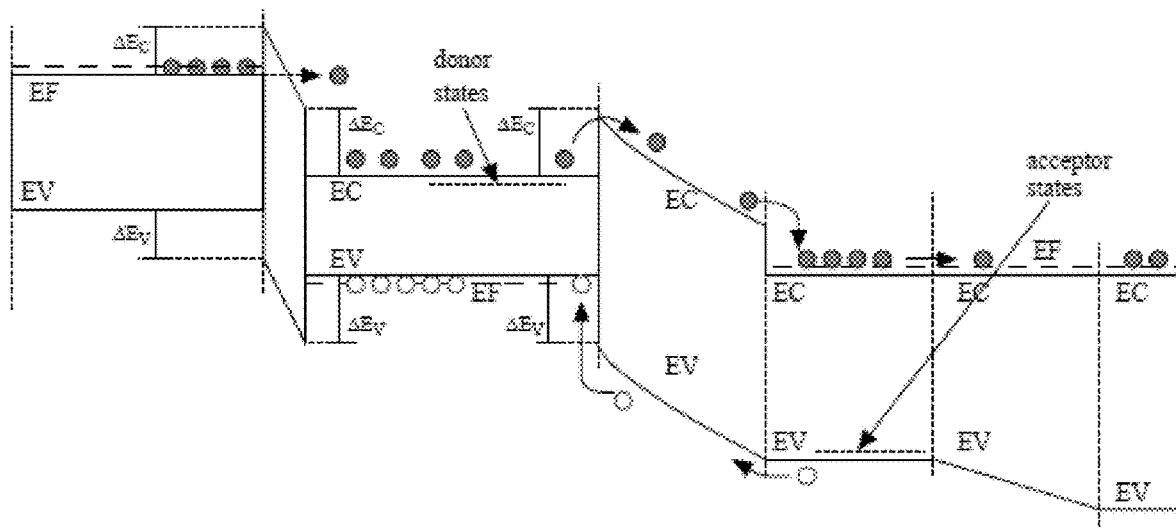
FIG. 13E is a more realistic version of the valence and conduction bands shown FIG. 13D where the effects of the material interfaces and Fermi levels are evident.

As an example, the base 100, emitter 104, third semiconductor 16 and collector 102 materials and doping can be selected to provide conduction and valence bands such as are shown in FIG. 13D and FIG. 13E. FIG. 13D illustrates the band diagram for a device such as is shown in FIG. 11C or FIG. 13A before electronics apply a bias to the light sensor and FIG. 13E illustrates the band diagram while electronics operate the light sensor or transistor so as to generate a light signal. As is evident from FIG. 13E, a tunneling barrier is present between the base 100 and the collector 102 and also between the base 100 and the emitter 104. For instance, FIG. 13E shows the energy of the conduction band for the third semiconductor 16 exceeding the energy of the conduction band for the emitter 104 at the interface of the emitter 104 and third semiconductor 16 and also shows the energy of the conduction band for the first sub-layer 126 exceeding the energy of the conduction band for the base 100 at the interface of the base 100 and the collector 102. Additionally, the confinement of electrons and holes in the base 100 can be accomplished when the base 100 has a negative $\Delta Ec$ and a positive $\Delta Ev$, with respect to both the tunneling barrier 16 and collector 102. An improved confinement of electrons and holes in the base 100 increases the probability of photon emission through electron-hole recombination. The counterdoped regions inside the base 100 and inside the collector 126 provide current gain through a phonon-assisted scattering of electrons and holes with impurities. Such current gain does not exist in conventional HBTs or HBT light-sources. As an example, a band diagram according to FIG. 13D and FIG. 13E can be generated using a n-type silicon as the emitter 104, undoped silicon as the third semiconductor 16, a counterdoped p-type superlattice as the base 100, an n-type Si—Ge—C alloy as the first sub-layer 126, a counterdoped n-type Si—Ge—C alloy as the second sub-layer 128, an n-type Si—Ge—C alloy as the third sub-layer 130 and n-type silicon as the substrate 120. An example of a suitable superlattice is a superlattice that includes silicon, germanium, and carbon. As is evident from FIG. 13D, the conduction band of the first sub-layer 126 can have an energy level that increases between base 100 and the second sub-layer 128. Additionally, the conduction band of the third sub-layer 130 has an energy level that increases between the second sub-layer 128 and the substrate 120. This gradient in the energy level of the first sub-layer 126 and the third sub-layer 130 can be generated by varying the composition of the materials in these layers. For instance, when one or more of these layers is an SiGeC alloy, the composition can be varied such that near the substrate 120, the composition is almost pure silicon (the percentages of Ge and C are highest, and therefore the band-gap is smallest, near sub-layer 128).

It is possible to suppress thermionic injection of carriers from the emitter 104 to the base 100 by constructing the device such that the emitter 104 injects charge into the base 100 via a tunneling process that takes place across the band-gap from the emitter 104 to the base 100. In these instances, the base 100 and the emitter 104 can be doped with the same polarity. This arrangement can provide injection from the emitter to the base in order s to suppress temperature-induced thermionic injection (which is unwanted) from the emitter to the base. When the transistor or HBT has a p-type base 100, the emitter 104 can be doped so as to be a p-type emitter 104 and when the transistor or light sensor has an n-type base 100, the emitter 104 can be doped so as to be an n-type emitter. With this doping configuration, the potential barrier between the emitter 104 and the base 100 must be sufficiently large to prevent the free flow of majority carriers between emitter and base in order to prevent a "short" between the emitter 104 and the base 100. For instance, when the device has a p-type base, the potential barrier between the emitter 104 and the base 100 must be large enough to prevent holes from flowing to and/or from the emitter. Alternately, when the device has an n-type base, the potential barrier between the emitter 104 and the base 100 must large enough to prevent electrons from flowing to and/or from the emitter. The size of the potential barrier can be altered by changing the composition of the emitter and the base at the interface with the barrier.

Figure 13F:
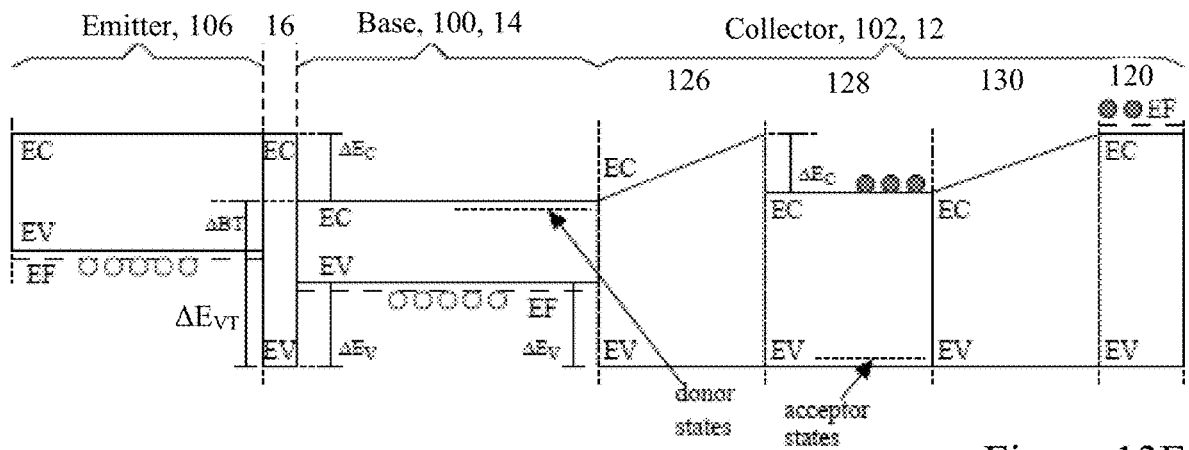
FIG. 13F illustrates the band diagram for a device such as is shown in FIG. 11C or FIG. 13A before electronics apply a bias to the HBT.
Figure 13G:
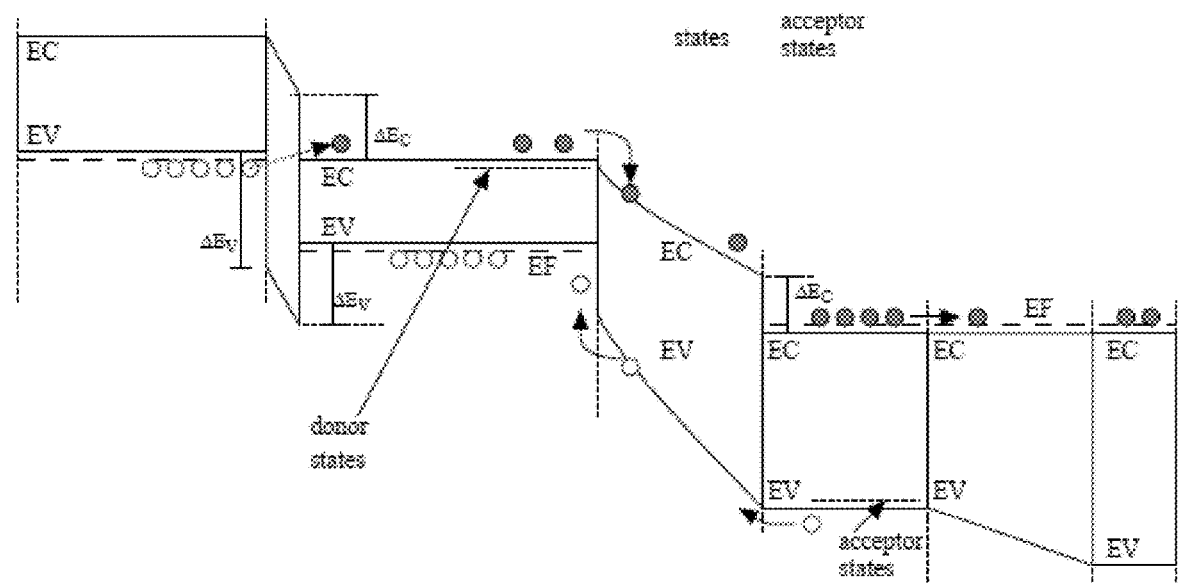
FIG. 13G illustrates the band diagram while electronics operate the light sensor or transistor so as to perform electronic amplification.

As an example, the base 100, emitter 104, third semiconductor 16 and collector materials and doping can be selected to provide conduction and valence bands such as are shown in FIG. 13F and FIG. 13G. FIG. 13F illustrates the band diagram for a device such as is shown in FIG. 11C or FIG. 13A before electronics apply a bias to the HBT and FIG. 13G illustrates the band diagram while electronics operate the light sensor or transistor so as to perform electronic amplification. FIG. 13F shows that before bias is applied to the device, the energy level of the emitter 104 valence band is between the energy level of the base valence band and the energy level of the base conduction band. However, as shown in FIG. 13G, when the electronics apply a potential applied to the base 100 that is more positive than the potential applied to the emitter 104, the energy level of the emitter valence band moves toward the energy level of the base conduction band. The potential difference (i.e., applied voltage) can be increased until tunneling into the base conduction band becomes significant while the potential barrier between the emitter valence band and the base valence band prevents injection from the base valence band into the emitter valence band. These conditions can be achieved when band offsets are such that the barrier in energy between the emitter valence band and the base conduction band, (labeled $\Delta BT$ in FIG. 13F) is small enough that injection by tunneling can be achieved with a small voltage across the third semiconductor 16. Additionally, the barrier in energy between the top of the base valence bands and the top of the third semiconductor 16 valence bands (labeled $\Delta E_{VT}$ in FIG. 13F) is larger than $\Delta BT$. In some instances, $\Delta E_{VT}$ is more than 2, 3, or 4 times the value of $\Delta BT$. Additionally, the band-to-band injection of electrons into the base 100 from the valence band of the emitter 106, through a tunneling barrier 16 between emitter 100 and base 100, can be accomplished through the band alignments shown in FIGS. 13F & 13G, in which the tunneling barrier 16 has a conduction band edge higher (positive $\Delta Ec$) than those of the emitter 106 and of the base 100, and has a valence band edge lower (negative ΔEv) than those of the emitter 106 and of the base 100. This injection mechanism suppresses thermionic injection of electrons from emitter to base. The counterdoped regions inside the base 100 and inside the collector 102 provide current gain through a phonon-assisted scattering of electrons and holes with impurities. Such current gain does not exist in conventional HBTs or photo-transistors. As an example, a band diagram according to FIG. 13F and FIG. 13G can be generated using a p-type silicon as the emitter 104, undoped silicon as the third semiconductor 16, a counterdoped p-type superlattice as the base 100, an n-type Si—Ge—C alloy as the first sub-layer 126, a counterdoped n-type Si—Ge—C alloy as the second sub-layer 128, an n-type Si—Ge—C alloy as the third sub-layer 130 and n-type silicon as the substrate 120. An example of a suitable superlattice is a superlattice that includes silicon, germanium, and carbon. As is evident from FIG. 13F, the conduction band of the first sub-layer 126 can have an energy level that increases between base 100 and the second sub-layer 128. Additionally, the conduction band of the third sub-layer 130 has an energy level that increases between the second sub-layer 128 and the substrate 120. This gradient in the energy level of the first sub-layer 126 and the third sub-layer 130 can be generated by varying the composition of the materials in these layers. For instance, when one or more of these layers is an SiGeC alloy, the composition can be varied such that near the substrate 120, the composition is almost pure silicon (the percentages of Ge and C are highest to reduce the band-gap near the sub-layer 128).

Figure 13H:
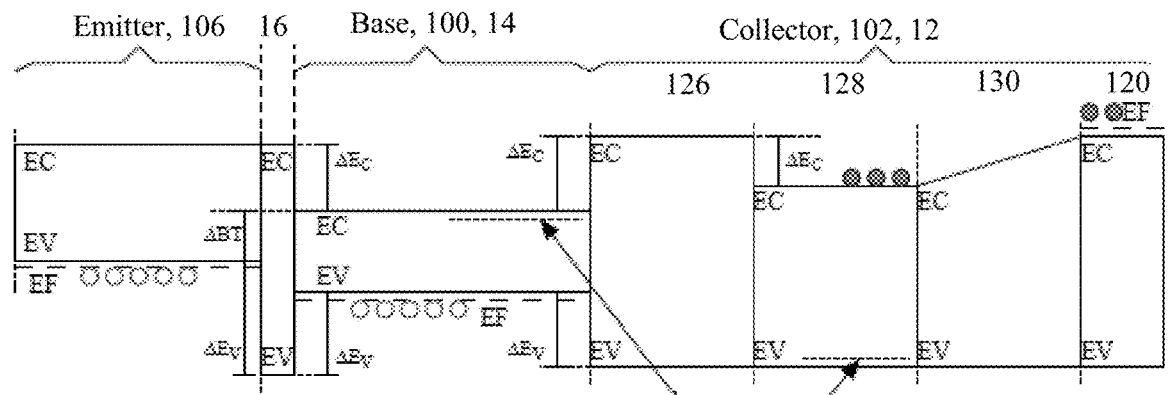
FIG. 13H is another example band energy diagram for a light sensor or transistor according to FIG. 13A when the electronics are not applying electrical energy to the transistor.
Figure 13I:
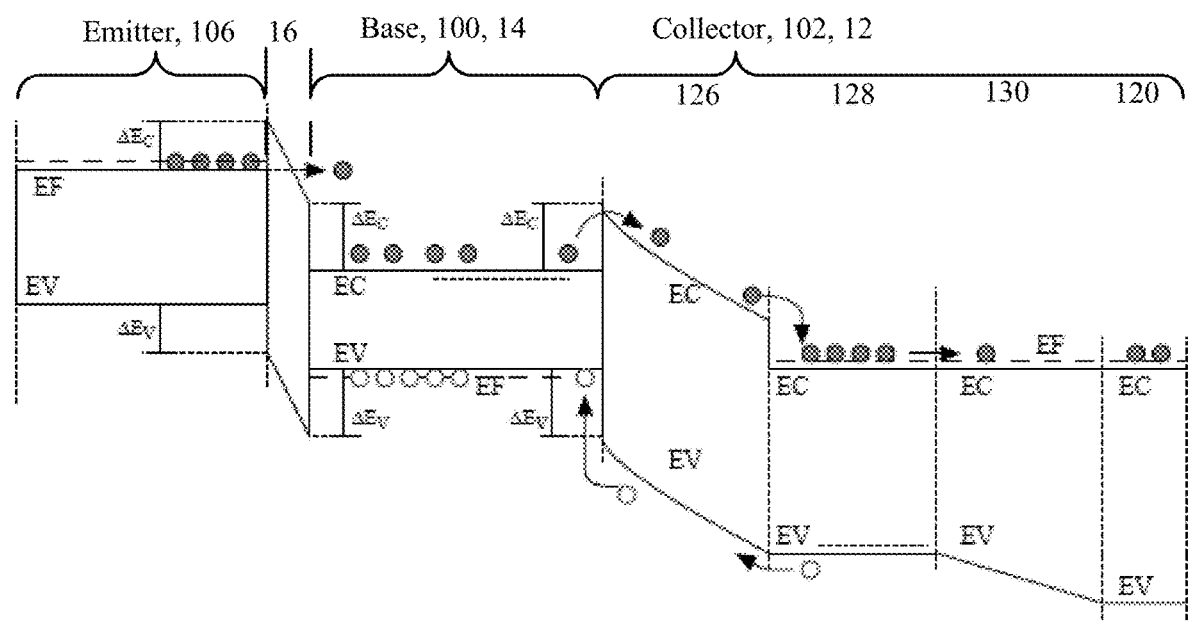
FIG. 13I is a more realistic version of the valence and conduction bands shown FIG. 13B where the effects of the material interfaces and Fermi levels are evident.

Carrier confinement in the base 100 can also be enhanced through use of a tunneling barrier between the base 100 and the collector 102 can be used in conjunction with tunneling across the band-gap from the emitter 104 to the base 100 (i.e. from the valence band of the emitter 104 to the conduction band of the base). For instance, the device of FIG. 13F and FIG. 13G can be modified to include the tunneling barrier between the base 100 and sub-layer of the collector 102 as disclosed in the context of FIG. 13D and FIG. 13E. As an example, the base 100, emitter 104, third semiconductor 16 and collector materials and doping can be selected to provide relative conduction and valence bands such as are shown in FIG. 13H and FIG. 13. FIG. 13H illustrates the band diagram for a device such as is shown in FIG. 13A before electronics apply a bias to the light sensor and FIG. 13I illustrates the band diagram while electronics operate the light sensor or transistor so as to generate a light signal. FIG. 13H shows that before bias is applied to the device, the energy level of the emitter valence band is between the energy level of the base valence band and the energy level of the base conduction band. FIG. 36I shows the tunneling from the valence band of the emitter 104 to the conduction band of the base 100. Additionally, a tunneling barrier is present between the base 100 and the collector 102. For instance, FIG. 13I shows the energy of the conduction band for the first sub-layer 126 exceeding the energy of the conduction band for the base 100 at the interface of the base 100 and the collector 102. The barrier in the conduction band from base to collector can provide confinement. Additionally, the band-to-band injection of electrons into the base 100 from the valence band of the emitter 106, through a tunneling barrier 16 between emitter 100 and base 100, can be accomplished through the band alignments shown in FIGS. 13F & 13G, in which the tunneling barrier 16 has a conduction band edge higher (positive ΔEc) than those of the emitter 106 and of the base 100, and has a valence band edge lower (negative ΔEv) than those of the emitter 106 and of the base 100. Concomitantly, the collector 102 has a higher conduction band edge (positive ΔEc) and a lower valence band edge (negative ΔEv) than the base 100, such that electrons and holes are confined in the base 100, and therefore the probability of recombination with the emission of a photon is enhanced. The counterdoped regions inside the base 100 and inside the collector 126, provide current gain through a phonon-assisted scattering of electrons and holes with impurities. Such current gain does not exist in conventional HBTs or HBT light-sources. As an example, a band diagram according to FIG. 13H and FIG. 13I can be generated using a p-type silicon as the emitter 104, undoped silicon as the third semiconductor 16, a counterdoped p-type superlattice as the base 100, an n-type Si—Ge—C alloy as the first sub-layer 126, a counterdoped n-type Si—Ge—C alloy as the second sub-layer 128, an n-type Si—Ge—C alloy as the third sub-layer 130 and n-type silicon as the substrate 120. An example of a suitable superlattice is a superlattice that includes silicon, germanium, and carbon. As is evident from FIG. 13H, the conduction band of the third sub-layer 130 has an energy level that increases between the second sub-layer 128 and the substrate 120. This gradient in the energy level of the first sub-layer 126 and the third sub-layer 130 can be generated by varying the composition of the materials in these layers. For instance, when one or more of these layers is an SiGeC alloy, the composition can be varied such that near the substrate 120, the composition is almost pure silicon in the percentages of Ge and C are increase to reduce the bandgap near sub-layer 128.

The transistors disclosed in the context of FIG. 4A through FIG. 13I are generally treated as NPN transistors for the purposes of simplifying this disclosure. However, the doping polarities can be reversed to as to provide PNP transistors as is well known in the art. Additionally, the first semiconductor and the second semiconductor are generally disclosed as both being counterdoped; however, as noted in the context of FIG. 1 and elsewhere in this specification, the first semiconductor and the second semiconductor need not both be doped in order to achieve amplification through the phonon assisted mechanism. Accordingly, in some instances of the above devices, the first semiconductor is counterdoped without counterdoping of the second semiconductor or the second semiconductor is counterdoped without counterdoping of the first semiconductor.

Suitable first semiconductors 12 for use in the counterdoped junctions include, but are not limited to, Si, $Si_{1-x}Ge_x$, $Si_{1-y}C_y$, and $Si_{1-x-y}Ge_xC_y$. Suitable second semiconductors 14 for use in the counterdoped junctions include, but are not limited to, Si, $Si_{1-x}Ge_x$, $Si_{1-y}C_y$, and $Si_{1-x-y}Ge_xC_y$. Suitable third semiconductors 16 for use in the counterdoped junctions include, but are not limited to, Si, $Si_{1-x}Ge_x$, $Si_{1-y}C_y$, and $Si_{1-x-y}Ge_xC_y$. Suitable n-type dopants for use in the counterdoped junctions include, but are not limited to, P, As, and Sb. Suitable p-type dopants for use in the counterdoped junctions include, but are not limited to, B, Ga, and In.

Figure 14:
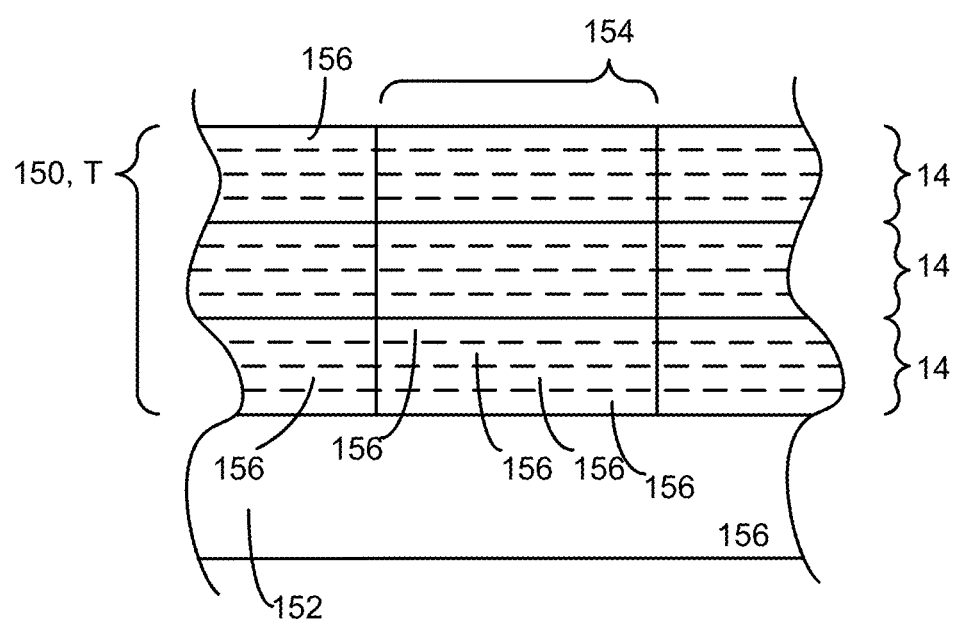
FIG. 14 is a cross section of a superlattice system.

As noted above, the third semiconductor 16 can include or consist of a superlattice such as the SiGeC superlattices disclosed above as well as other superlattices disclosed above. Additionally or alternately, the device can include a light absorbing medium, gain medium, light sensor, or light source that includes or consists of a superlattice. These superlattices can include cells that are repeated multiple times so as to form the superlattice. Each superlattice cell has multiple atomic planes that are parallel to one another. For instance, FIG. 14 is a cross section of a superlattice system. The superlattice system includes a superlattice 150 positioned on a substrate 152. The superlattice 150 includes a variety of superlattice cells 154. Each superlattice cell 154 is the smallest unit that can be repeated in order to create the superlattice 150. Each of the cells 154 includes atoms arranged in multiple atomic planes 156 that are each parallel or substantially parallel to a surface of the substrate 152 on which the superlattice 150 is positioned and parallel or substantially parallel to each other.

The composition of a superlattice cell 154 can be expressed using the following notation $(CC_1)_{ap1}$ $-(CC_2)_{ap2} \ldots -(CC_n)_{apn}$ where $CC_n$ represents the chemical composition of atomic plane n and apn represents the number of atomic planes 156 having the chemical composition represented by $CC_n$. When apn is greater than 1, the associated atomic planes 156 are immediately adjacent to one another in the superlattice cell 154. For instance, when apn is greater than 1, the associated atomic planes 156 can be covalently bonded to one another. At least two of the atomic planes 156 in the superlattice cell 154 have different chemical compositions.

In some instances, at least two of the atomic planes in the superlattice cell have different chemical compositions. One or more of the atomic planes in the superlattice cell can include carbon. One or more of the one or more atomic planes that include carbon can each also includes 10% or more of substitutional carbon. In some instances, the superlattice cell includes a total number of atomic planes that is less than or equal to 40, 20, 10, or 5. In some instances, one or more of the atomic planes in the superlattice cell include tin and/or lead. The superlattice can have one, two, three or more features selected from the group consisting of at least two of the atomic planes in the superlattice cell having different chemical compositions, one or more of the atomic planes in the superlattice cell including carbon, one or more of the one or more atomic planes including 10% or more of substitutional carbon, the superlattice cell includes a total number of atomic planes that is less than or equal to 40, 10, or 5 and one or more of the atomic planes in the superlattice cell include tin and/or lead.

In some instances, at least one of the atomic planes has the chemical composition for a material that has a valence band maximum at the Z point (and/or its equivalent Y) of the Brillouin Zone. For instance, at least one of the atomic planes has the chemical composition for a material that has a valence band maximum at a point of the Brillouin Zone selected from the group consisting of the Z point and the Y point. In one example, the at least one atomic plane has a chemical composition represented by $Si_2Sn_2C$.

In some instances, a superlattice cell is repeated multiple times so as to form a superlattice. Each superlattice cell has multiple atomic planes that are parallel to one another. The superlattice has a conduction band minimum at the K or K' point of the Brillouin Zone. In some instances, the superlattice is represented by $(Si_5)_4$—$(Si_4C)_4$.

In some instances, one or more atomic planes included in the superlattice is an ordered atomic plane that has a chemical composition selected from a group consisting of $Si_4C$, $Ge_4C$, $Sn_4C$, $Si_4Ge$, $Ge_4Si$, $Si_6C_2$, $Ge_6C_2$, $Sn_6C_2$, $SiGe_3C$, $Si_2Ge_2C$, $Si_3GeC$, $SiSn_3C$, $Si_2Sn_2C$, $Si_3SnC$, $GeSn_3C$, $Ge_2Sn_2C$ and $Ge_3SnC$. When a plane is ordered, each of the corresponding lattice points in different superlattice cells is occupied by an atom of the same element. In some instances, one or more atomic planes included in the superlattice is not ordered and has a chemical composition selected from a group consisting of $Si_{1-x}Ge_x$ where x is greater than or equal to 0 and/or less than or equal to 1, $Si_{1-y}C_y$ where y is greater than or equal to 0 or 0.1 and/or less than or equal to 0.25, $Si_{1-x-y}Ge_xC_y$ where x is greater than or equal to 0 or 0.1 and/or less than or equal to 1 and y is greater than or equal to 0 or 0.01 and/or less than or equal to 0.25, $Si_{1-z}Sn_z$ where z is greater than or equal to 0 or 0.01 and/or less than or equal to 0.1, $Ge_{1-z}Sn_z$ where z is greater than or equal to 0 or 0.01 and/or less than or equal to 0.05, $C_{1-z}Sn_z$ where z is greater than or equal to zero and/or less than 1 and in one example z is 0.20 or 0.25, $Si_{1-x-z}Ge_xSn_z$ where x is greater than or equal to 0 or 0.1 and/or less than or equal to 1 and z is greater than or equal to 0 or 0.01 and/or less than or equal to 0.1, $Si_{1-y-z}C_ySn_z$ where y is greater than or equal to 0 or 0.01 and/or less than or equal to 0.25 and z is greater than or equal to 0 or 0.01 and/or less than or equal to 0.25, $Ge_{1-y-z}C_ySn_z$ where y is greater than or equal to 0 or 0.01 and/or less than or equal to 0.25 and z is greater than or equal to 0 or 0.01 and/or less than or equal to 0.25, $Si_{1-x-y-z}Ge_xC_ySn_z$ where x is greater than or equal to 0 or 0.1 and/or less than or equal to 1 and y is greater than or equal to 0 or 0.01 and/or less than or equal to 0.25 and z is greater than or equal to 0 or 0.01 and/or less than or equal to 0.25, $Si_{1-x}Pb_x$ where x is greater than or equal to 0.001 or 0.01 and/or less than or equal to 0.1, $Si_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Si_{1-x-y-z}Pb_xC_yGe_z$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95, $Si_{1-x-y-z-t}Pb_xC_yGe_zSn_t$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than or equal to 0.001 or 0.01 and/or less than or equal to 0.25, $Ge_{1-x}Pb_x$ where x is greater than or equal to 0.001 or 0.01 and/or less than or equal to 0.1, $Ge_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Ge_{1-x-y-z}Pb_xC_ySn_z$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.25.

In some instances, one or more of the one or more atomic planes that include carbon is ordered and has a chemical composition selected from a group consisting of $Si_4C$, $Ge_4C$, $Sn_4C$, $Si_6C_2$, $Ge_6C_2$, $Sn_6C_2$, $SiGe_3C$, $Si_2Ge_2C$, $Si_3GeC$, $SiSn_3C$, $Si_2Sn_2C$, $Si_3SnC$, $GeSn_3C$, $Ge_2Sn_2C$ and $Ge_3SnC$. In some instances, one or more atomic planes that include carbon is not ordered and has a chemical composition selected from a group consisting of $Si_{1-y}C_y$ where y is greater than 0 or 0.1 and/or less than or equal to 0.25, $Si_{1-x-y}Ge_xC_y$ where x is greater than or equal to 0 or 0.1 and/or less than or equal to 1 and y is greater than 0 or 0.01 and/or less than or equal to 0.25, $C_{1-z}Sn_z$ where z is greater than or equal to zero and less than 1 and in one example z is 0.20 or 0.25, $Si_{1-y-z}C_ySn_z$ where y is greater than 0 or 0.01 and/or less than or equal to 0.25 and z is greater than or equal to 0 or 0.01 and/or less than or equal to 0.25, $Ge_{1-y-z}C_ySn_z$ where y is greater than 0 or 0.01 and/or less than or equal to 0.25 and z is greater than or equal to 0 or 0.01 and/or less than or equal to 0.25, and $Si_{1-x-y-z}Ge_xC_ySn_z$ where x is greater than or equal to 0 or 0.1 and/or less than or equal to 1 and y is greater than 0 or 0.01 and/or less than or equal to 0.25 and z is greater than or equal to 0 or 0.01 and/or less than or equal to 0.25, $Si_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Si_{1-x-y-z}Pb_xC_yGe_z$ where x is greater than or equal to 0.001 or 0.01 and/or less than or equal to 0.1 and y is greater than 0 or greater than or equal to 0.001 or 0.01 and/or less than or equal to 0.25 and z is greater than or equal to 0.001 or 0.01 and/or less than or equal to 0.85 or 0.95, $Si_{1-x-y-z-t}Pb_xC_yGe_zSn_t$ where x is greater than or equal to 0.001 or 0.01 and/or less than or equal to 0.1 and y is greater than 0 or greater than or equal to 0.001 or 0.01 and/or less than or equal to 0.25 and z is greater than or equal to 0.001 or 0.01 and/or less than or equal to 0.85 or 0.95 and t is greater than or equal to 0.001 or 0.01 and/or less than or equal to 0.25, $Ge_{1-x-y}Pb_xC_y$ where x is greater than or equal to 0.001 or 0.01 and/or less than or equal to 0.1 and y is greater than or equal to 0.001 or 0.01 and/or less than or equal to 0.25, $Ge_{1-x-y-z}Pb_xC_ySn_z$ where x is greater than or equal to 0.001 or 0.01 and/or less than or equal to 0.1 and y is greater than 0 or greater than or equal to 0.001 or 0.01 and/or less than or equal to 0.25 and z is greater than or equal to 0.001 or 0.01 and/or less than or equal to 0.25.

In some instances, one or more of the one or more atomic planes that include tin each is ordered and has a chemical composition selected from a group consisting of $Sn_4C$, $Sn_6C_2$, $SiSn_3C$, $Si_2Sn_2C$, $Si_3SnC$, $GeSn_3C$, $Ge_2Sn_2C$, and $Ge_3SnC$. In some instances, one or more of the one or more atomic planes that include tin is not ordered and has a chemical composition selected from a group consisting of $Si_{1-z}Sn_z$ where z is greater than 0 or 0.01 and/or less than or equal to 0.1, $Ge_{1-z}Sn_z$ where z is greater than 0 or 0.01 and/or less than or equal to 0.05, $C_{1-z}Sn_z$ where z is greater than zero and/or less than 1 and in one example z is 0.20 or 0.25, $Si_{1-x-z}Ge_xSn_z$ where x is greater than or equal to 0 or 0.1 and/or less than or equal to 1 and z is greater than 0 or 0.01 and/or less than or equal to 0.1, $Si_{1-y-z}C_ySn_z$ where y is greater than or equal to 0 or 0.01 and/or less than or equal to 0.25 and z is greater than 0 or 0.01 and/or less than or equal to 0.25, $Ge_{1-y-z}C_ySn_z$ where y is greater than or equal to 0 or 0.01 and/or less than or equal to 0.25 and z is greater than 0 or 0.01 and/or less than or equal to 0.25, $Si_{1-x-y-z}Ge_xC_ySn_z$ where x is greater than or equal to 0 or 0.1 and/or less than or equal to 1 and y is greater than or equal to 0 or 0.01 and/or less than or equal to 0.25 and z is greater than 0 or 0.01 and/or less than or equal to 0.25, $Si_{1-x-y-z-t}Pb_xC_yGe_zSn_t$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than 0 or greater than or equal to 0.001 or 0.01 and/or less than or equal to 0.25, and $Si_{1-x-y-z-t}Pb_xC_yGe_zSn_t$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than 0 or greater than or equal to 0.001 or 0.01 and/or less than or equal to 0.25, and $Ge_{1-x-y-z}Pb_xC_ySn_z$ where x is greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.25.

In some instances, one or more of the one or more atomic planes that include lead is not ordered and has a chemical composition selected from a group consisting of $Si_{1-x}Pb_x$ where x is greater than 0 or greater than or equal to 0.001 or 0.01 and/or less than or equal to 0.1, $Si_{1-x-y}Pb_xC_y$ where x is greater than 0 or greater than or equal to 0.001 or 0.01 and/or less than or equal to 0.1 and y is greater than or equal to 0.001 or 0.01 and/or less than or equal to 0.25, $Si_{1-x-y-z}Pb_xC_yGe_z$ where x is greater 0 or greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95, $Si_{1-x-y-z-t}Pb_xC_yGe_zSn_t$ where x is greater than 0 or greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.85 or 0.95 and t is greater than or equal to 0.001 or 0.01 and/or less than or equal to 0.25, $Ge_{1-x}Pb_x$ where x is greater than 0 or greater than or equal to 0.001 or 0.01 and/or less than or equal to 0.1, $Ge_{1-x-y}Pb_xC_y$ where x is greater than 0 or greater than or equal to 0.001 or 0.01 and/or less than or equal to 0.1 and y is greater than or equal to 0.001 or 0.01 and/or less than or equal to 0.25, $Ge_{1-x-y-z}Pb_xC_ySn_z$ where x is greater than 0 or greater than or equal to 0.001 or 0.01 and/or less than or equal to 0.1 and y is greater than or equal to 0.001 or 0.01 and/or less than or equal to 0.25 and z is greater than or equal to 0.001 or 0.01 and/or less than or equal to 0.25.

The above superlattice materials can have direct bandgaps in ranges that are suitable for use in the above applications. It is generally desirable to grow these superlattices on materials such as silicon due to its common use in CMOS technology and/or due to the low defect levels present in silicon. When superlattices are grown on a surface with defects, these defects often propagate into the superlattice itself. However, the performance level of superlattices generally declines as the defect level increases. When prior superlattices were grown on silicon substrates, relaxed buffer layers, with lattice constants larger than the lattice constant for silicon, were generally needed between the substrate and the superlattice in order to achieve direct bandgaps and to achieve at least partial strain-compensation. These buffer layers are an additional source of defects. Many of the disclosed superlattice materials do not require these buffer layers when grown on substrates such as silicon. Accordingly these superlattices are more likely to have reduced defect levels. Further, the simulation results indicate that the disclosed superlattice materials can be used to engineer superlattices having particular bandgap features.

Further, one or more planes of the disclosed superlattices can be a material that has a valence band maximum at the Z point (and/or its equivalent Y) of the Brillouin Zone. In some instances, these materials are direct bandgap materials. The inclusion of these materials in the disclosed superlattices can provide vertical transitions (in k-space) in regions of the Brillouin Zone other than the gamma point and vertical transitions in (k-space) across heterojunctions, in which one material has the conduction band minimum at the Z point (and/or its equivalent Y) and other has the valence band maximum also Z point (and/or its equivalent Y), but in which neither of these materials is necessarily a direct bandgap material.

Additional information on the above superlattices can be found in U.S. Patent Application Ser. No. 61/895,971, filed on Oct. 25, 2013, entitled "Superlattice Materials and Applications" and incorporated herein in its entirety and also in PCT Patent Application PCT/US2014/057066, publication number WO 2105042610, filed on Sep. 23, 2014, entitled "Superlattice Materials and Applications," and incorporated herein in its entirety. In some instances, Si—Ge—C in the above description include superalltices that include, consist of or consist essentially of silicon, germanium, and carbon and are constructed as disclosed in U.S. Patent Application Ser. No. 61/895,971.

As is disclosed in the context of FIG. 3B, the counterdoping of one or more of the semiconductors produces donor states and/or acceptor states in the semiconductor. These donor states and/or acceptor states are not illustrated in many of the above band energy diagram in order to simplify the illustrations.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An electrical device, comprising:
a counterdoped heterojunction selected from a group consisting of a pn junction or a p-i-n junction, the counterdoped heterojunction including a first semiconductor doped with an n-type primary dopant and a second semiconductor doped with a p-type primary dopant;
a first counterdoped component selected from a group consisting of the first semiconductor and the second semiconductor being counterdoped, the first counterdoped component being doped with one or more counterdopants that are of a polarity that is the opposite to the polarity of the primary dopant included in the first counterdoped component; and
a level of the n-type primary dopant, p-type primary dopant, and the one or more counterdopant being such that the counterdoped heterojunction provides amplification by a phonon assisted mechanism and the amplification has an onset voltage less than 1 V.

2. The device of claim 1, wherein the onset voltage is greater than 0.1 V and less than 0.9 V.

3. The device of claim 1, wherein the first semiconductor and the second semiconductor are counterdoped.

4. The device of claim 1, wherein a total concentration of the one or more counterdopants in the first counterdoped component is more than 10% and less than 50% of the total percentage of dopant in the first counterdoped component.

5. The device of claim 4, wherein the total concentration of the one or more counterdopants in the first counterdoped component is more than $2.0E17$ cm$^{-3}$.

6. The device of claim 5, wherein a total concentration of the primary dopant in the first counterdoped component is more than the Density of States of the semiconductor included in the first counterdoped component for either the conduction band or the valence band.

7. The device of claim 1, further comprising a second counterdoped component,
the second counterdoped component being the first semiconductor when the first counterdoped component is the second semiconductor, and
the second counterdoped component being the second semiconductor when the first counterdoped component is the first semiconductor.

8. The device of claim 7, wherein a total concentration of the one or more counterdopants in the first counterdoped component is more than 1% and less than 50% of the total percentage of dopant in the first counterdoped component; and
the total concentration of the one or more counterdopants in the second counterdoped component is more than 10% and less than 50% of the total percentage of dopant in the first counterdoped component.

9. The device of claim 1, wherein the counterdoped heterojunction is a pn junction.

10. The device of claim 1, wherein the counterdoped heterojunction is a p-i-n junction that includes a third semiconductor between the first semiconductor and the second semiconductor,
the third semiconductor being an intrinsic semiconductor, and
the third semiconductor being a superlattice.

11. The device of claim 10, wherein the superlattice includes superlattice cells repeated multiple times so as to form the superlattice,
each superlattice cell having multiple ordered atomic planes that are parallel to one another,
at least two of the atomic planes in the superlattice cell have different chemical compositions and one or more of the atomic planes in the superlattice cell includes carbon.

12. The device of claim 11, wherein one or more of the one or more atomic planes that include carbon each includes more than 10% substitutional carbon.

13. The device of claim 10, wherein the superlattice includes superlattice cells repeated multiple times so as to form the superlattice,
each superlattice cell having multiple ordered atomic planes that are parallel to one another,
at least two of the atomic planes in the superlattice cell have different chemical compositions and one or more of the atomic planes in the superlattice cell includes lead.

14. The device of claim 13, wherein one or more of the one or more atomic planes that include lead each includes more than 10% substitutional lead.

15. The device of claim 10, wherein superlattice includes superlattice cells repeated multiple times so as to form the superlattice,
each superlattice cell having multiple ordered atomic planes that are parallel to one another,
at least two of the atomic planes in the superlattice cell have different chemical compositions and one or more of the atomic planes in the superlattice cell includes tin.

16. The device of claim 15, wherein one or more of the one or more atomic planes that include tin each includes more than 10% substitutional tin.

17. The device of claim 12, wherein the total number of atomic planes included in the superlattice is less than or equal to 20.

18. The device of claim 1, wherein the counterdoped heterojunction is included in a photodiode.

19. The device of claim 1, wherein the counterdoped heterojunction is included in a transistor.

20. The device of claim 19, wherein the transistor is a tunnel transistor that includes a source, drain, and channel.

* * * * *